US011212158B2

(12) United States Patent
Loghin et al.

(10) Patent No.: US 11,212,158 B2
(45) Date of Patent: Dec. 28, 2021

(54) CODING AND MODULATION APPARATUS USING MULTI-DIMENSIONAL NON-UNIFORM CONSTELLATION

(71) Applicant: Sony Corporation, Tokyo (JP)

(72) Inventors: Nabil Sven Loghin, Stuttgart (DE); Reem Abdel-Rahman, Stuttgart (DE); Felix Fellhauer, Stuttgart (DE)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 17/261,178

(22) PCT Filed: Jul. 12, 2019

(86) PCT No.: PCT/EP2019/068806
§ 371 (c)(1),
(2) Date: Jan. 19, 2021

(87) PCT Pub. No.: WO2020/020663
PCT Pub. Date: Jan. 30, 2020

(65) Prior Publication Data
US 2021/0281466 A1     Sep. 9, 2021

(30) Foreign Application Priority Data
Jul. 27, 2018 (EP) ..................... 18186040

(51) Int. Cl.
*H04L 27/36* (2006.01)
*H04L 1/00* (2006.01)
(Continued)

(52) U.S. Cl.
CPC ......... *H04L 27/366* (2013.01); *H03M 13/25* (2013.01); *H04L 1/0003* (2013.01);
(Continued)

(58) Field of Classification Search
CPC . H04L 27/3405; H04L 1/0003; H04L 1/0009; H04L 1/0045; H04L 1/0058;
(Continued)

(56) References Cited

U.S. PATENT DOCUMENTS 9,967,127 B1 *   5/2018   Sun ..................... H04L 27/3405
10,003,436 B2 *  6/2018   Tosato .................... H04L 27/38
(Continued)

FOREIGN PATENT DOCUMENTS

WO   2015/001121 A1   1/2015
WO   2017/178635 A1   10/2017

OTHER PUBLICATIONS

International Search Report and Written Opinion dated Oct. 22, 2019, received for PCT Application PCT/EP2019/068806, Filed on Jul. 12, 2019, 13 pages.
(Continued)

*Primary Examiner* — Freshteh N Aghdam
(74) *Attorney, Agent, or Firm* — Xsensus LLP

(57) ABSTRACT

A coding and modulation apparatus and method are presented. The apparatus comprises an encoder that encodes input data into cell words, and a modulator that modulates said cell words into constellation values of a non-uniform constellation. The modulator is configured to use, based on the total number M of constellation points of the constellation, the signal-to-noise ratio SNR and the number n of the dimension of the constellation, an n-dimensional non-uniform constellation from a group of constellations, wherein each constellation point of an n-dimensional constellation diagram is defined by an n-tupel of constellation values, said n-tupel of constellation values defining parameter settings of a transmission parameter used by a transmission apparatus for transmitting a transmission stream obtained by conversion of said constellation values.

20 Claims, 5 Drawing Sheets

(51) Int. Cl.
   *H04L 27/38* (2006.01)
   *H04L 27/34* (2006.01)
   *H03M 13/25* (2006.01)
(52) U.S. Cl.
   CPC .......... *H04L 1/0041* (2013.01); *H04L 1/0045* (2013.01); *H04L 1/0058* (2013.01); *H04L 27/3405* (2013.01); *H04L 27/38* (2013.01)
(58) Field of Classification Search
   CPC ..... H04L 27/38; H04L 27/366; H04L 27/362; H03M 13/25
   See application file for complete search history.

(56) References Cited

U.S. PATENT DOCUMENTS

| | | | | |
|---|---|---|---|---|
| 10,637,711 | B2* | 4/2020 | Limberg | H04L 27/2626 |
| 2016/0072659 | A1* | 3/2016 | Stadelmeier | H04L 27/3405 |
| | | | | 375/298 |
| 2016/0072660 | A1* | 3/2016 | Nikopour | H04B 7/0413 |
| | | | | 375/298 |
| 2016/0080192 | A1* | 3/2016 | Stadelmeier | H03M 13/255 |
| | | | | 375/298 |
| 2016/0156498 | A1* | 6/2016 | Loghin | H04L 27/3405 |
| | | | | 375/298 |
| 2017/0230226 | A1* | 8/2017 | Stadelmeier | H04L 27/38 |
| 2019/0075002 | A1* | 3/2019 | Loghin | H04L 27/0008 |

OTHER PUBLICATIONS

Mouhouche et al., "High Order Non-Uniform Constellations for Broadcasting UHDTV", IEEE WCNC'14 Track 1 (PHY and Fundamentals), XP032682611, Apr. 6, 2014, pp. 600-605.

Muhammad, "Coding and Modulation for Spectral Efficient Transmission", Ph D. Dissertation, Institut für Nachrichtenübertragung der Universität Stuttgart, 2010, pp. 1-156.

* cited by examiner

CODING AND MODULATION APPARATUS USING MULTI-DIMENSIONAL NON-UNIFORM CONSTELLATION

CROSS-REFERENCE TO RELATED APPLICATIONS

The present application is based on PCT filing PCT/EP2019/068806, filed Jul. 12, 2019, which claims priority to EP 18186040.4, filed Jul. 27, 2018, the entire contents of each are incorporated herein by reference.

BACKGROUND

Field of the Disclosure

The present disclosure relates to a coding and modulation apparatus and method. Further, the present disclosure relates to a transmission apparatus and method. Still further, the present disclosure relates to a computer program and a non-transitory computer-readable recording medium.

Description of Related Art

Modern communications systems typically employ, among other elements, a coding and modulation apparatus (as part of a transmission apparatus) and a decoding and demodulation apparatus (as part of a receiving apparatus). The coding and modulation apparatus is often part of a so called BICM (Bit Interleaved Coded Modulation) apparatus, which generally comprises (at the transmitter side) a serial concatenation of a FEC (Forward Error Correction) encoder, a bit interleaver, and a modulator, which uses spectral efficient modulation such as multilevel PAM (Pulse Amplitude Modulation), PSK (Phase Shift Keying), or QAM (Quadrature Amplitude Modulation). It should be noted that hereinafter, whenever QAM is mentioned it should be understood as a generally term covering PAM, PSK and QAM.

BICM allows for good performance over both non-fading and fading channels due to the use of the interleaver and/or the FEC encoder. It has a reasonable decoding complexity as opposed to multilevel coding (MLC) coding schemes and is thus used frequently in communications systems, such as in all DVB systems, powerline communications (e.g., Homeplug AV), DAB, LTE, WiFi, etc.

Alternatively to BICM, coding and modulation apparatus can be a part of a coded modulation (CM) apparatus, which generally comprises (at the transmitter side) a joint FEC encoder, optionally a bit interleaver, and a modulator, which also uses spectral efficient modulation as in BICM. While BICM usually assumes (at receiver side) separate and independent operations of demodulator, deinterleaver and FEC decoder, a receiver for a CM apparatus performs mostly joint demodulation and FEC decoding.

One common form of CM is multilevel coding (MLC), in which one FEC encoder is used for each bit level of a multilevel QAM modulation. As an example, in an 8-ary QAM modulation, the three bit levels, also called stages, for the 8-ary QAM symbol are determined by three independent FEC encoders, usually with different protection levels. At the receiver side, the stages are decoded step-by-step: first, demodulation considers only the bits from the first stage, with subsequent FEC decoding thereof. After FEC decoding, it is assumed that these bits are perfectly known. Thus, the influence of these bits on the received symbols is eliminated, reducing the search space for subsequent demodulation steps. Each stage is sequentially proceeded in such manner. This approach is commonly known as sequential multi-stage decoding (MSD), or as onion peeling (reducing stepwise the layers of the problem). If decoding is performed in parallel manner, the system is reduced to a BICM system, yielding worse performance, but at reduced complexity.

Another common form of CM is trellis coded modulation (TCM), where the modulator uses a $2^{k+1}$-ary QAM, i.e., consisting of $2^{k+2}$ different symbols. Before modulation, a trellis encoder of rate $k/(k+1)$ introduces for each k input bits (k+1) output bits, i.e., one additional redundant bit. These (k+1) output bits are then modulated. Due to the redundancy of one bit for each k input bits, at each time instance, only $2^k$ QAM symbols form a valid alphabet, i.e., a subset of the complete alphabet of $2^{k+1}$ symbols. The subsets can change over time, allowing for large Euclidean distances, when considering a path inside the trellis from the TCM apparatus.

Alternatively, CM systems can also be realized by a non-binary BICM system, i.e. the BICM system needs not necessarily be binary. The number of FEC encoder outputs at each time can be adapted to the number of QAM symbols. As an example, a non-binary FEC encoder operating in Galois field $GF(2^4)$ outputs symbols from a 16-ary alphabet. These outputs can be mapped by a 16-QAM modulator to a BICM apparatus, where FEC encoder and modulator are jointly designed.

Generally, the coding and modulation capacity, such as the BICM capacity in systems using a BICM apparatus or the CM capacity as in systems using a CM apparatus, is considered as a target function, and it is desired to find optimum constellation points such that this capacity is maximized, often subject to a power normalization, i.e., the average power of the constellation points should be normalized to e.g. 1.

The "background" description provided herein is for the purpose of generally presenting the context of the disclosure. Work of the presently named inventor(s), to the extent it is described in this background section, as well as aspects of the description which may not otherwise qualify as prior art at the time of filing, are neither expressly or impliedly admitted as prior art against the present disclosure.

SUMMARY

It is an object to provide a coding and modulation apparatus and method providing an increased or even maximized coding and modulation capacity, in particular BICM capacity. It is a further object to provide a demodulation and decoding apparatus and method as well as a corresponding computer program for implementing said methods and a non-transitory computer-readable recording medium for implementing said methods.

According to an aspect there is provided a coding and modulation apparatus comprising an encoder configured to encode input data into cell words, and a modulator configured to modulate said cell words into constellation values of a non-uniform constellation, wherein said modulator is configured to use, based on the total number M of constellation points of the constellation, the signal-to-noise ratio SNR and the number n of the dimension of the constellation, an n-dimensional non-uniform constellation from a group of constellations, wherein each constellation point of an n-dimensional constellation diagram is defined by an n-tupel of constellation values, said n-tupel of constellation values defining parameter settings of a transmission parameter used by a transmission apparatus for transmitting a transmission stream obtained by conversion of said constellation values, and wherein said modulator is configured to use a constellation having a total number M of constellation points of the constellation and a number n of the dimension of the constellation which fulfill the condition that log 2(M)/n*2 is a non-integer number.

According to a further aspect there is provided a transmission apparatus comprising
  a coding and modulation apparatus as proposed herein configured to encode and modulate input data into constellation values,
  a converter configured to convert said constellation values into one or more transmission streams to be transmitted, and
  a transmitter configured to transmit said one or more transmission streams.

According to a further aspect there is provided a decoding and demodulation apparatus comprising
  a demodulator configured to demodulate constellation values of a non-uniform constellation into cell words and to assign bit combinations to constellation values of the used non-uniform constellation, and
  a decoder configured to decode cell words into output data,
wherein said demodulator is configured to use, based on signalling information indicating the total number M of constellation points of the constellation, the signal-to-noise ratio SNR in dB and the number n of the dimension of the constellation, an n-dimensional non-uniform constellation from a group of constellations, wherein each constellation point of an n-dimensional constellation diagram is defined by an n-tupel of constellation values, said n-tupel of constellation values defining parameter settings of a transmission parameter used by a transmission apparatus for transmitting a transmission stream obtained by conversion of said constellation values, and
wherein said demodulator is configured to use a total number M of constellation points of the constellation and a number n of the dimension of the constellation, which fulfill the condition that log 2(M)/n*2 is a non-integer number.

According to a further aspect there is provided a receiving apparatus comprising
  a receiver configured to receive one or more transmission streams,
  a deconverter configured to deconvert one or more transmission streams into said constellation values, and
  a demodulation and decoding apparatus as disclosed herein configured to demodulate and decode said constellation values into output data.

According to still further aspects corresponding methods, a computer program comprising program means for causing a computer to carry out the steps of the coding and modulation method disclosed herein, when said computer program is carried out on a computer, as well as a non-transitory computer-readable recording medium that stores therein a computer program product, which, when executed by a processor, causes the coding and modulation method disclosed herein to be performed are provided.

Preferred embodiments are defined in the dependent claims. It shall be understood that the claimed methods, the claimed computer program and the claimed computer-readable recording medium have similar and/or identical preferred embodiments as the claimed apparatus and as defined in the dependent claims.

One of the aspects of the disclosure is that the constellation points of the used constellations are not located on a regular grid with equidistant symbols, but rather on optimized locations dependent on the channel characteristics, e.g., channel transition probabilities due to AWGN (Additive White Gaussian Noise), fading, etc. Further, the used constellation is selected (preferably in advance, but generally on the fly in other embodiments) dependent on the SNR (signal-to-noise ratio), the desired total number of constellation points of the used constellation and the number n of the dimension of the constellation. A method how to find and optimize these non-uniform constellations (in the following called NUCs) will be explained below.

Hence, according to the present disclosure the dimensionality of the modulator, in particular of a constellation mapper (and the corresponding demapper of the demodulator on the receiver side), is extended beyond one dimension (as used in PAM signals) or two dimensions as used in known systems using non-uniform constellations. For instance, subsequent time slots (time), different transmit antennas (MIMO for space), different polarization or left-hand circular and right-hand circular polarizations (as a special case of MIMO), OFDM subcarriers or in general different carrier frequencies (frequency), wavelengths in optical fibers, electromagnetic modes in waveguides, different spreading codes as in code division multiple access, CDMA (code), or any other dimensions may be used for this extension. The n dimensions (n>2) are jointly optimized and an n-dimensional modulation and demodulation, respectively, in particular an n-dimensional mapping and demapping, respectively, are applied. Larger shaping gains, especially for low spectral efficiency modes, are thus achieved (e.g., if, conventionally, only 16QAM, 32QAM or 64QAM are applied).

A QAM mapping consisting of M constellation points is usually denoted as M-QAM. If a (uniform or non-uniform) QAM allows separate encoding and decoding of each of its two dimensions ("inphase" and "quadrature phase" in the literature), then this QAM will be called a $N^2$-QAM. This implies that the constellation can be designed by two N-PAM constellations, one for each dimension. Such N-PAM is essentially a 1-dimensional constellation. $N^2$-QAMs have significantly lower decoding complexity for MLC-decoding, as only N constellation points have to be investigated per component, compared with $N^2$ points for the M-QAM, where $M=N^2$, but where the two dimensions cannot be separated (as is usually the case for N-PSK, e.g. 8-PSK, where 8 points are located on a unit circle or for APSK constellations, consisting of two or more PSK constellations, each having a different amplitude). In addition, QAM constellations that are completely defined by a single quadrant of the constellation can be called Q-QAM, with the other quadrants being derived from the first quadrant. E.g. normal uniform square QAM constellations (UC) are also Q-QAM constellations, due to their symmetry.

The concept of a quadrant in the two-dimensional plane can be extended to multi-dimensional space, and will be called hyperquadrant, or simply sector in the following. A sector symmetry can now be defined with respect to the 0-th sector, which belongs to all n-tuples $(x_0, x_1, x_2, \ldots, x_{n-1})$, where all $x_k$ are positive ($x_k \geq 0$ for all $k \in \{0, 1, \ldots, n-1\}$), since all k-th bit representations $b_k$ are 0 in the binary representation. Assigning the first $M/2^n$ constellation points to this 0-th sector, all remaining constellation points are defined by symmetry.

However, the constellation points of the non-uniform QAM constellations considered in this disclosure are not located on a regular grid with equidistant symbols, but rather on optimized locations, dependent on the channel characteristics, e.g., channel transition probabilities due to AWGN, fading, etc.

Further, according to the present disclosure new multi-dimensional NUCs are presented, which are designed for particular code rates of a channel code corresponding to particular target SNR values. Further, settings are presented which result in a non-integer spectral efficiency, e.g., 3D-16NUC, which allows transmitting 4 bits in 3D, or correspondingly log(16)/3*2=4/3*2=8/3=2.67 bits/channel use (often denoted in unit (bit/s)/Hz). A channel use may be defined as 2D transmission, i.e., regular inphase and quadrature phase signals are used to modulate a radio frequency carrier (quadrature-amplitude modulation (QAM)). In case only one phase is used, as e.g. in pulse-amplitude modulation (PAM), a channel use would be 1D, and the spectral efficiency would be only half of the above mentioned spectral efficiency, but still a non-integer number.

It should be noted that the modulator and the demodulator may be configured such that they need not always use a constellation from among the disclosed constellations, but a modulator and a demodulator may sometimes (e.g. for a particular service or in a particular environment) use another constellation (e.g. a known constellation) and sometimes use one of the disclosed constellations.

According to another aspect of the present disclosure there is provided a coding and modulation apparatus comprising:

an encoder configured to encode input data into cell words, and a modulator configured to modulate said cell words into constellation values of a non-uniform constellation and to assign bit combinations to constellation values of the used non-uniform constellation, wherein said modulator is configured to use, based on the total number M of constellation points of the constellation, the signal-to-noise ratio SNR in dB and the number n of the dimension of the constellation, an n-dimensional non-uniform constellation from a group of constellations or a transformed version of an n-dimensional constellation from said group of constellations, wherein each constellation point of an n-dimensional constellation diagram is defined by an n-tupel of constellation values, said n-tupel of constellation values defining parameter settings of a transmission parameter used by a transmission apparatus for transmitting a transmission stream obtained by conversion of said constellation values, and wherein the constellation position vectors of the different constellations of the group of constellation are defined as follows:

for n=3 and M=64:

| wk | LSB bit labels (b3 b4 b5) | $R_c = \frac{1}{4}$, 2.1 dB, (x, y, z) | $R_c = \frac{1}{2}$, 6.2 dB, (x, y, z) |
|---|---|---|---|
| w0 | 000 | (0.679463, 1.203006, 0.519483) | (0.596549, 1.352959, 0.388406) |
| w1 | 001 | (0.483813, 0.629873, 0.355243) | (0.397732, 0.604735, 0.238847) |
| w2 | 010 | (1.252423, 0.629854, 0.629855) | (1.423781, 0.547468, 0.547469) |
| w3 | 011 | (0.759524, 0.40977, 0.40977) | (0.784715, 0.306821, 0.306822) |
| w4 | 100 | (0.456715, 0.900064, 0.900059) | (0.379632, 1.038068, 1.038067) |
| w5 | 101 | (0.349874, 0.510669, 0.51067) | (0.248578, 0.424422, 0.424422) |
| w6 | 110 | (0.679462, 0.519486, 1.203008) | (0.596547, 0.388406, 1.352962) |
| w7 | 111 | (0.483813, 0.355244, 0.629877) | (0.397731, 0.238846, 0.604736) |

| wk | LSB bit labels (b3 b4 b5) | $R_c = \frac{2}{3}$, 8.8 dB, (x, y, z) | $R_c = \frac{3}{4}$, 10 dB, (x, y, z) |
|---|---|---|---|
| w0 | 000 | (0.37522, 0.535637, 1.329562) | (0.403465, 1.429603, 0.403469) |
| w1 | 001 | (0.585588, 1.369204, 0.585594) | (0.93451, 0.917081, 0.311174) |
| w2 | 010 | (1.046301, 0.382275, 1.046309) | (1.060679, 0.381871, 1.060697) |
| w3 | 011 | (1.329562, 0.535639, 0.375227) | (1.081152, 0.290324, 0.334489) |
| w4 | 100 | (0.214422, 0.399424, 0.691315) | (0.31117, 0.917076, 0.934521) |
| w5 | 101 | (0.309062, 0.906218, 0.30906) | (0.279161, 0.606528, 0.279155) |
| w6 | 110 | (0.363725, 0.212822, 0.363724) | (0.334483, 0.29031, 1.081104) |
| w7 | 111 | (0.691321, 0.399426, 0.214424) | (0.352778, 0.205563, 0.352752) |

| wk | LSB bit labels (b3 b4 b5) | $R_c = \frac{5}{6}$, 11.35 dB, (x, y, z) |
|---|---|---|
| w0 | 000 | (1.054178, 1.043246, 0.431268) |
| w1 | 001 | (0.373323, 1.37404, 0.341879) |
| w2 | 010 | (1.073002, 0.372189, 0.909371) |
| w3 | 011 | (0.952138, 0.27332, 0.278175) |
| w4 | 100 | (0.370565, 0.907662, 1.044718) |
| w5 | 101 | (0.277451, 0.740438, 0.314124) |
| w6 | 110 | (0.341752, 0.278121, 1.025684) |
| w7 | 111 | (0.308638, 0.239727, 0.33157) | for n=4 and M=4:

| wk | bit labels (b0 b1) | $R_c = \frac{1}{4}$, −4.25 dB, (x, y, z) | $R_c = \frac{1}{2}$, −0.85 dB, (x, y, z) |
|---|---|---|---|
| w0 | 00 | (0, 0.866025, 0.866025) | (0.341973, 0.732665, 0.91801) |
| w1 | 01 | (0, 0.866025, −0.86603) | (−0.04024, 0.896206, −0.83227) |
| w2 | 10 | (0, −0.86603, 0.866025) | (−0.63438, −0.76431, 0.713423) |
| w3 | 11 | (0, −0.86603, −0.86603) | (0.334075, −0.86322, −0.79958) |

| wk | bit labels (b0 b1) | $R_c = \frac{2}{3}$, 1.3 dB, (x, y, z) | $R_c = \frac{3}{4}$, 2.2 dB, (x, y, z) |
|---|---|---|---|
| w0 | 00 | (0.943009, 0.560703, 0.544745) | (0.349973, 0.944614, 0.675467) |
| w1 | 01 | (−0.54904, 0.974405, −0.49777) | (0.735879, 0.122954, −0.9589) |
| w2 | 10 | (−0.32303, −0.76353, 0.901148) | (−0.01644, −0.88366, 0.829) |
| w3 | 11 | (−0.06959, −0.77156, −0.94867) | (−1.06295, −0.18527, −0.55139) |

| wk | bit labels (b0 b1) | $R_c = \frac{5}{6}$, 3.35 dB, (x, y, z) |
|---|---|---|
| w0 | 00 | (−1.01648, 0.404423, 0.471229) |
| w1 | 01 | (0.725854, 0.939584, 0.117155) |
| w2 | 10 | (0.145172, −1.03649, 0.560528) |
| w3 | 11 | (0.140766, −0.29884, −1.13839) | for n=4 and M=64:

| wk | LSB bit labels (b4 b5) | $R_c = \frac{1}{4}$, 0.6 dB, (x, y, z, w) | $R_c = \frac{1}{2}$, 4.7 dB, (x, y, z, w) |
|---|---|---|---|
| w0 | 00 | (0.707102, 0.707102, 0.707101, 0.707101) | (0.594667, 1.342751, 0.5791, 0.579096) |
| w1 | 01 | (0.707102, 0.707102, 0.707101, 0.707102) | (0.594666, 0.522325, 1.200416, 0.386329) |
| w2 | 10 | (0.707101, 0.707102, 0.707102, 0.707101) | (0.594668, 0.522324, 0.386331, 1.200417) |
| w3 | 11 | (0.707102, 0.707101, 0.707102, 0.707102) | (0.5947, 0.260823, 0.394221, 0.394225) |

| wk | LSB bit labels (b4 b5) | $R_c = \frac{2}{3}$, 7.1 dB, (x, y, z, w) | $R_c = \frac{3}{4}$, 8.15 dB, (x, y, z, w) |
|---|---|---|---|
| w0 | 00 | (0.533719, 0.551776, 0.533618, 1.335255) | (0.415131, 0.47307, 0.473059, 1.174576) |
| w1 | 01 | (0.438941, 0.552091, 1.247518, 0.521329) | (0.473129, 0.415164, 1.174585, 0.473076) |
| w2 | 10 | (1.248209, 0.551665, 0.438372, 0.521793) | (0.473159, 1.174799, 0.415194, 0.473154) |
| w3 | 11 | (0.379345, 0.551627, 0.379809, 0.286494) | (1.174858, 0.473175, 0.473155, 0.415242) |

| wk | LSB bit labels (b4 b5) | $R_c = \frac{5}{6}$, 9.45 dB, (x, y, z, w) |
|---|---|---|
| w0 | 00 | (0.429225, 0.468636, 0.468558, 1.17263) |
| w1 | 01 | (0.468498, 0.429212, 1.172329, 0.468549) |
| w2 | 10 | (0.468597, 1.172764, 0.429245, 0.46863) |
| w3 | 11 | (1.172465, 0.468608, 0.468507, 0.429221) | for n=4 and M=256:

| wk | LSB bit labels (b4 b5 b6 b7) | $R_c = \frac{1}{4}$, 2.1 dB, (x, y, z, w) |
|---|---|---|

-continued

| wk | | |
|---|---|---|
| w0 | 0000 | (0.853533, 0.853537, 0.435223, 0.853537) |
| w1 | 0001 | (1.388052, 0.570334, 0.570341, 0.570343) |
| w2 | 0010 | (0.535491, 0.53549, 0.326029, 0.535488) |
| w3 | 0011 | (0.770557, 0.406253, 0.406253, 0.406253) |
| w4 | 0100 | (0.570336, 0.57034, 0.570337, 1.388053) |
| w5 | 0101 | (0.853532, 0.435221, 0.853528, 0.853543) |
| w6 | 0110 | (0.406254, 0.406255, 0.406251, 0.770546) |

-continued

| wk | | |
|---|---|---|
| w7 | 0111 | (0.535493, 0.32603, 0.535484, 0.535491) |
| w8 | 1000 | (0.570338, 1.388054, 0.570346, 0.570339) |
| w9 | 1001 | (0.853534, 0.853532, 0.853551, 0.435225) |
| w10 | 1010 | (0.406255, 0.770554, 0.406256, 0.406249) |
| w11 | 1011 | (0.535492, 0.53549, 0.535495, 0.326031) |
| w12 | 1100 | (0.435219, 0.853539, 0.85354, 0.853534) |
| w13 | 1101 | (0.570339, 0.570338, 1.388047, 0.570341) |
| w14 | 1110 | (0.32603, 0.535493, 0.535491, 0.535485) |
| w15 | 1111 | (0.406255, 0.406253, 0.770551, 0.406251) |

| wk | LSB bit labels (b4 b5 b6 b7) | $R_c = \frac{1}{2}$, 4.7 dB, (x, y, z, w) |
|---|---|---|
| w0 | 0000 | (1.526509, 0.402616, 0.631195, 0.631197) |
| w1 | 0001 | (0.602165, 0.480207, 1.520122, 0.438092) |

-continued

| wk | LSB bit labels (b4 b5 b6 b7) | (1.25358, 1.046597, 0.444948, 0.444947) |
|---|---|---|
| w2 | 0010 | (1.25358, 1.046597, 0.444948, 0.444947) |
| w3 | 0011 | (0.552189, 1.201405, 1.024307, 0.313877) |
| w4 | 0100 | (0.942978, 0.243165, 0.411336, 0.411336) |
| w5 | 0101 | (0.429351, 0.270441, 0.879771, 0.304775) |
| w6 | 0110 | (0.752996, 0.432847, 0.287963, 0.28796) |
| w7 | 0111 | (0.376248, 0.491436, 0.538473, 0.221183) |
| w8 | 1000 | (0.602165, 0.48021, 0.438083, 1.520119) |
| w9 | 1001 | (0.400875, 0.468866, 1.189484, 1.189495) |
| w10 | 1010 | (0.55219, 1.201411, 0.313874, 1.024294) |
| w11 | 1011 | (0.300813, 1.415048, 0.466125, 0.466122) |
| w12 | 1100 | (0.42935, 0.270442, 0.304772, 0.879768) |
| w13 | 1101 | (0.266249, 0.279379, 0.63154, 0.631546) |
| w14 | 1110 | (0.376246, 0.491438, 0.221183, 0.538465) |
| w15 | 1111 | (0.22888, 0.552601, 0.354481, 0.35448) |

| wk | LSB bit labels (b4 b5 b6 b7) | $R_c = \frac{2}{3}$, 8.8 dB, (x, y, z, w) |
|---|---|---|
| w0 | 0000 | (1.018943, 0.365858, 1.199467, 0.481008) |
| w1 | 0001 | (0.331868, 0.361354, 1.310964, 0.283197) |
| w2 | 0010 | (1.558783, 0.459499, 0.486589, 0.463096) |
| w3 | 0011 | (1.10882, 1.198092, 0.44343, 0.399275) |
| w4 | 0100 | (0.685157, 0.196292, 0.575696, 0.442069) |
| w5 | 0101 | (0.332449, 0.279754, 0.526833, 0.246807) |
| w6 | 0110 | (1.003474, 0.302379, 0.281231, 0.436793) |
| w7 | 0111 | (0.676872, 0.666776, 0.261086, 0.255449) |
| w8 | 1000 | (0.396496, 0.465471, 1.097731, 1.183561) |
| w9 | 1001 | (0.330053, 1.038928, 1.168812, 0.447361) |
| w10 | 1010 | (0.439683, 1.062086, 0.441272, 1.301175) |
| w11 | 1011 | (0.371102, 1.447116, 0.450695, 0.467416) |
| w12 | 1100 | (0.282082, 0.246055, 0.399926, 0.957503) |
| w13 | 1101 | (0.170056, 0.386611, 0.345374, 0.425569) |
| w14 | 1110 | (0.776315, 0.39265, 0.276701, 1.241973) |
| w15 | 1111 | (0.268557, 0.861542, 0.245954, 0.354217) |

| wk | LSB bit labels (b4 b5 b6 b7) | $R_c = \frac{3}{4}$, 4.7 dB, (x, y, z, w) |
|---|---|---|
| w0 | 0000 | (1.177296, 1.1958, 0.498387, 0.389436) |
| w1 | 0001 | (1.493578, 0.394827, 0.380252, 0.355904) |
| w2 | 0010 | (0.869675, 0.903371, 0.298536, 0.906957) |
| w3 | 0011 | (0.764504, 0.533695, 0.24056, 0.280397) |
| w4 | 0100 | (1.035942, 0.403318, 1.013009, 0.971103) |
| w5 | 0101 | (0.972427, 0.325647, 0.998656, 0.300178) |
| w6 | 0110 | (0.80859, 0.29903, 0.327672, 1.144447) |
| w7 | 0111 | (0.649232, 0.205051, 0.350469, 0.357187) |
| w8 | 1000 | (0.3932, 1.544683, 0.41033, 0.388835) |
| w9 | 1001 | (0.348383, 1.035569, 1.060365, 0.330446) |
| w10 | 1010 | (0.271132, 0.997977, 0.349517, 0.907452) |
| w11 | 1011 | (0.236576, 0.713614, 0.327883, 0.278331) |
| w12 | 1100 | (0.319746, 0.398194, 1.126819, 1.073599) |
| w13 | 1101 | (0.309596, 0.330431, 1.191466, 0.335021) |
| w14 | 1110 | (0.228413, 0.325633, 0.370927, 1.102348) |
| w15 | 1111 | (0.203443, 0.239249, 0.425946, 0.367032) |

| wk | LSB bit labels (b4 b5 b6 b7) | $R_c = \frac{5}{6}$, 11.35 dB, (x, y, z, w) |
|---|---|---|
| w0 | 0000 | (1.077284, 0.957874, 1.034832, 0.441819) |
| w1 | 0001 | (0.412758, 0.398613, 1.528827, 0.375586) |
| w2 | 0010 | (1.076567, 1.07177, 0.324415, 0.428991) |
| w3 | 0011 | (1.514688, 0.385762, 0.382328, 0.357945) |
| w4 | 0100 | (0.414877, 0.390574, 0.394515, 1.572725) |
| w5 | 0101 | (0.822358, 0.246758, 0.917809, 0.321732) |
| w6 | 0110 | (0.963923, 0.374594, 0.335966, 1.001772) |
| w7 | 0111 | (0.864815, 0.291169, 0.284467, 0.299176) |
| w8 | 1000 | (0.400077, 0.935313, 0.975085, 0.955456) |
| w9 | 1001 | (0.281655, 0.906792, 0.941819, 0.290489) |
| w10 | 1010 | (0.384193, 1.120022, 0.3108, 0.875174) |
| w11 | 1011 | (0.294389, 1.020099, 0.302111, 0.266808) |
| w12 | 1100 | (0.305856, 0.294713, 0.824631, 0.992838) |
| w13 | 1101 | (0.25481, 0.285898, 0.751643, 0.298045) |

-continued

| wk | LSB bit labels (b4 b5 b6 b7) | $R_c = \frac{5}{6}$, 11.35 dB, (x, y, z, w) |
|---|---|---|
| w14 | 1110 | (0.289067, 0.356851, 0.238692, 0.822132) |
| w15 | 1111 | (0.294154, 0.340578, 0.244513, 0.277487) | wherein a transformed version of a non-uniform constellation is obtained from anyone of said constellations through a transformation including a rotation by an angle around the origin, an inversion of bit labels for all constellation points, an interchanging of bit positions and/or a predistortion for the constellation points.

According to further aspects of the present disclosure a corresponding decoding and demodulation apparatus and corresponding methods are presented.

It is to be understood that both the foregoing general description of the disclosure and the following detailed description are exemplary, but are not restrictive, of the disclosure.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein.

DESCRIPTION OF THE EMBODIMENTS

Figure 1:
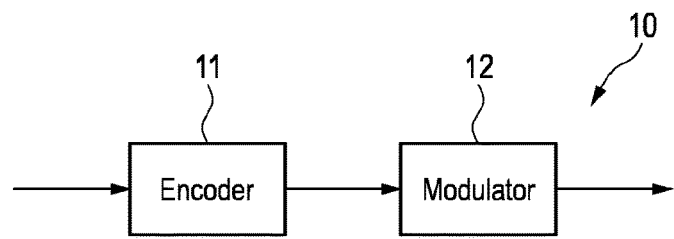
FIG. 1 shows an embodiment of a coding and modulation apparatus according to the present disclosure.

Referring now to the drawings, wherein like reference numerals designate identical or corresponding parts throughout the several views, FIG. 1 shows an embodiment of a coding and modulation apparatus 10 according to the present disclosure. It comprises an encoder 11 that encodes input data into cell words (i.e., groups of bits), and a modulator 12 that modulates said cell words into constellation values of a non-uniform constellation. Said modulator 12 is configured to use, based on the total number M of constellation points of the constellation, the signal-to-noise ratio SNR in dB and the number n of the dimension of the constellation (and, in some embodiments, the channel characteristics), an n-dimensional non-uniform constellation from a group of constellations, wherein each constellation point of an n-dimensional constellation diagram is defined by an n-tupel of constellation values, said n-tupel of constellation values defining parameter settings of a transmission parameter used by a transmission apparatus for transmitting a transmission stream obtained by conversion of said constellation values. Further, said modulator 12 is configured to use a total number M of constellation points of the constellation and a number n of the dimension of the constellation, which fulfill the condition that log 2(M)/n*2 is a non-integer number.

It should be noted that the constellation position vector w as defined in the claims does not have to contain the constellation points of the 0-th sector of the constellation, but could also contain the constellation points of any of the $2^n$ sectors (expressed by the definition "of a 0-th sector" in the claims). Due to the sector symmetry this leads to constellations with a different bit mapping but with identical performance. The constellation position vector w in the tables defined herein should therefore be considered as an example for all $2^n$ symmetric constellations with different bit mapping but identical performance.

In other embodiments of the coding and modulation apparatus 10 additional elements may be provided, such as a BCH encoder, and/or an LDPC encoder and/or a convolutional encoder, and/or a bit interleaver and/or a demultiplexer (for demultiplexing bits of encoded data into the cell words). Some or all of these elements may separate elements or may be part of the encoder 11. For instance, a BICM device as conventionally used in the transmission apparatus of a DVB system or IEEE 802.11 WiFi system may be used as coding and modulation apparatus 10.

Figure 2A:
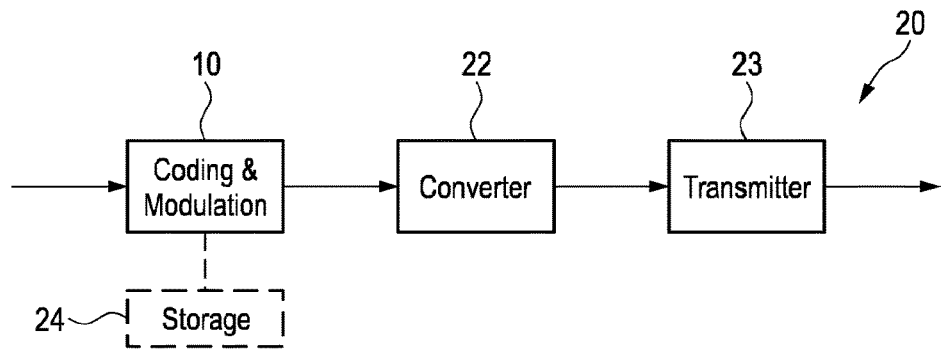
FIG. 2A shows an embodiment of a transmission apparatus according to the present disclosure.

FIG. 2A shows an embodiment of a transmission apparatus 20 according to the present disclosure comprising a coding and modulation apparatus 10 as proposed herein that encodes and modulates input data into constellation values, a converter 22 that converts said constellation values into one or more transmission streams to be transmitted, and a transmitter 23 that transmits said one or more transmission streams. In an exemplary embodiment the converter 22 may comprise one or more elements like a time, cell and/or frequency interleaver, a frame builder, an OFDM modulator, etc., as e.g. described in the various standards related to DVB. The constellations and the constellations values are generally predetermined and e.g. stored in a constellations storage 24 or retrieved from an external source.

In other embodiments of the transmission apparatus 20 additional elements may be provided, such as input processing circuitry, frame building circuitry and/or OFDM generation circuitry as e.g. conventionally used in transmission apparatus of a DVB system.

The modulator may also be configured to provide, as a first part, the function of a mapper, which is mapping the input cell words into n dimensional constellation points. Additionally, as a second part, the modulator may also provide the function of an assigner (or converter or physical translator, i.e. so that no additional converter is required as shown in FIG. 2A), which is mapping the n dimensions (i.e. the n-tupel of constellation values) into physically relevant properties.

Figure 2B:
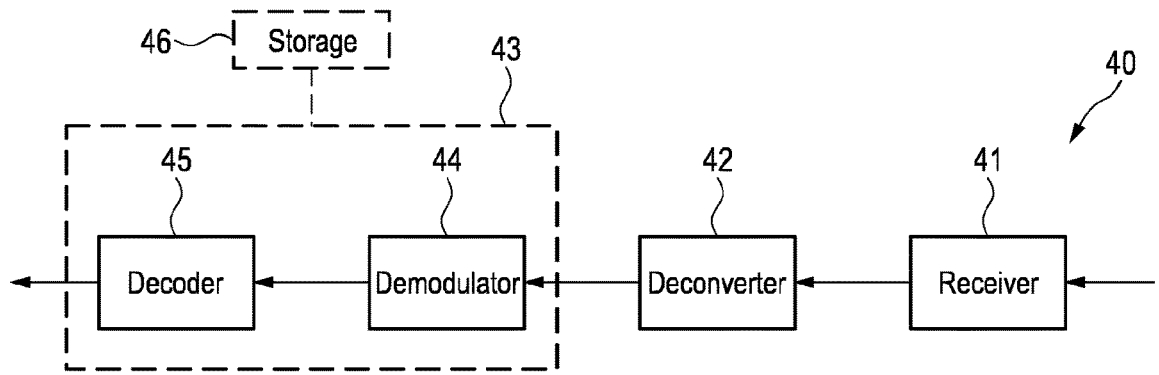
FIG. 2B shows an embodiment of a receiving apparatus according to the present disclosure.

FIG. 2B shows an embodiment of a receiving apparatus 40 according to the present disclosure. A receiving apparatus 40 generally comprises a receiver 41 that receives one or more transmission streams, a deconverter 42 that deconverts the received one or more transmission streams into constellation values, and a demodulation and decoding apparatus 43 that demodulates and decodes said constellation values into output data. The demodulation and decoding apparatus 43 generally comprises a demodulator 44 for demodulating constellation values of a non-uniform constellation into cell words, and a decoder 45 for decoding cell words into output data words, wherein based on the total number M of constellation points of the constellation, the signal-to-noise ratio in dB and the channel characteristics, and optionally based on the number n of dimensions and/or on the coding and modulation apparatus, a non-uniform constellation is selected from the group of constellations comprising the same predetermined constellations as used in the coding and modulation apparatus 10. Further, said demodulator 44 is configured to use a total number M of constellation points of the constellation and a number n of the dimension of the constellation, which fulfill the condition that log 2(M)/n*2 is a non-integer number. The constellations and the constellations values are generally predetermined and e.g. stored in a constellations storage 46 or retrieved from an external source.

The preferred demodulation and decoding considers soft values as opposed to hard decided values (0 and 1). Soft values represent the continuously distributed received values (possibly after A/D conversion including quantization) by more than two states (as in the case of binary (hard) decision). The reason is that for hard decisions, NUCs are generally not optimal. Nowadays, BICM and CM receivers typically are soft receivers anyway.

Figure 3:
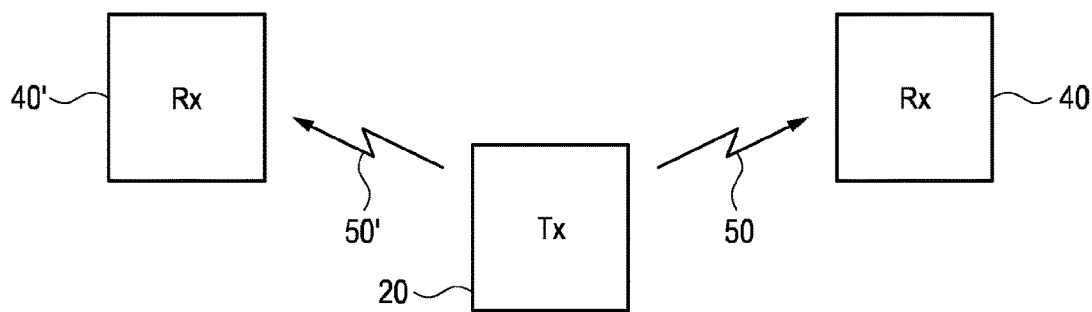
FIG. 3 shows an embodiment of a communications system according to the present disclosure.

FIG. 3 shows an embodiment of a communications system 30 according to the present disclosure comprising one (or more) transmission apparatus 20 (Tx) as shown in FIG. 2A and one or more receiving apparatus 40, 40' (Rx) as shown in FIG. 2B.

Generally, data (e.g. communications data, broadcast data, etc.) shall be transmitted from a transmission apparatus 20 to one or more of said receiving apparatus 40 over a transmission channel 50, 50'. The transmission channel 50, 50' can be unicast channel, multicast channel, a broadcast channel and may be employed as one-directional or bi-directional channel (i.e. having a return channel from the receiving apparatus to the transmission apparatus).

In an embodiment the modulator 12 is configured to use an n-dimensional non-uniform constellation based on the total number M of constellation points of the constellation, the number n of dimensions, the required signal-to-noise ratio SNR for quasi-error free decoding in dB and the channel characteristics. In broadcasting applications the constellation is generally not selected dependent on the SNR in the receiver, but dependent on the SNR that is required for error free decoding with a used channel code (if a code is used, for example LDPC codes in case of DVB $2^{nd}$ generation transmission systems) for an expected channel characteristic, e.g., static reception or multipath fading. In bi-directional communication systems such as WiFi, the SNR (or any other signal strength identifier) is usually known at both transmitter and receiver side, allowing to choose an appropriate constellation for this SNR.

The total number M of constellation points is generally selected (e.g. by the designer or user of the transmitter, e.g. a broadcaster) according to the desired payload throughput jointly with the code rate of the FEC encoder. The SNR for error free decoding for typical channel characteristic is generally known, e.g. by simulation. In broadcasting the channel characteristics of the receivers are not known, i.e. a compromise is selected. For instance, in broadcasting for each code rate of the FEC encoder one non-uniform constellation is selected, optimized for an SNR that is a compromise for all channel characteristics.

The transmitter generally targets a certain scenario. For instance, a broadcast transmission over cable or satellite considers the channel to be a non-fading AWGN (appropriate channel model), while a terrestrial broadcaster typically considers the channel to be a fading channel, e.g. with Rayleigh distribution, as several echoes are usually received.

In another embodiment the modulator 12 is configured to adaptively select a non-uniform constellation based on the total number M of constellation points of the constellation, the signal-to-noise ratio SNR in dB and the channel characteristics, wherein said signal-to-noise ratio SNR in dB and channel characteristics are received from a receiving device 40 to which data shall be transmitted. Such an adaptive selection of the constellation is generally only possible with a return channel in unicast environments. A non-uniform constellation may be adapted e.g. in time and/or frequency domain, e.g. for different OFDM subcarriers.

Depending on the SNR the optimum value for M and the code rate of the FEC encoder can be selected which offers the highest throughput (equivalent to the BICM capacity $C_B$). In other words, for a large SNR a high value of M is generally selected leading to a high data throughput (and vice versa).

The selection of the number n of dimensions used for the n-dimensional constellation generally depends on system constraints, such as tolerated complexity or amount of independent dimensions which can be supported. In general, the higher the number of dimensions n is, the better is the performance of the n-dimensional constellation, but the higher is the mapping and demapping complexity.

The channel characteristics describe the statistical properties of the channel, e.g., the extent of the multipath propagation of the transmission channel between transmitter and receiver. If the channel is characterized by no multipath propagation, corresponding to the AWGN channel, the required SNR for error free decoding is relatively low, i.e. the NUC has to be selected accordingly for optimum performance. If the transmission channel is characterized by strong multipath propagation, the required SNR for error free reception is larger compared to a channel without multipath propagation, i.e. a NUC optimized for higher SNR has to be used. Further, the NUCs should be optimized taking the fading characteristics into account, as will be discussed below.

As mentioned above, the number M of the constellation points of the constellations is selected according to the desired payload throughput. Larger values of M allow for higher data throughput, but require a larger SNR for error free reception. This is further influenced by the code rate of the FEC encoder, if any FEC encoder is used. Further, according to one aspect an optimized design for particular code rates is presented.

Another explanation for the selection of M (which is closely related to the optimization task) is that for each SNR, optimized constellations are proposed for different M. In some embodiments the optimization target is the BICM capacity. For an expected SNR, say 15 dB of SNR should be guaranteed, M is chosen, for which the respective optimized NUC yields the largest BICM capacity. As a general rule it holds that for low SNR a low value of M should be selected and vice versa. But from a theoretical point of view, a high value of M is generally optimum, e.g., choosing M=4096 or M=1024 is preferred, because even for low SNR, the optimized NUC will "look (almost) like" a constellation with effectively smaller M, as several points will overlap. However, modulation and demodulation complexity increase exponentially with increasing M, so a tradeoff has to be considered.

As mentioned above known communications systems often employ among other blocks a so called BICM apparatus which may also be used as coding and modulation apparatus according to the present disclosure. The maximum possible capacity over a BICM apparatus is described by the BICM capacity $C_B$:

$$C_B = \sum_{i=0}^{m-1} E_{b,r_k}\left[\log_2 \frac{\sum_{x_l \in \mathbb{X}_b^i} p(r_k|s_k = x_l)}{p(r_k)}\right] = \quad (1)$$

$$\int_{r_k \in \mathbb{R}^n} \sum_{i=0}^{m-1} \sum_{b=0}^{1} \sum_{x_l \in \mathbb{X}_b^i} \frac{1}{M} \cdot p(r_k|s_k = x_l)$$

$$\log_2 \frac{\sum_{x_l \in \mathbb{X}_b^i} p(r_k|s_k = x_l)}{\frac{1}{M} \cdot \sum_{x_l' \in \mathbb{X}} p(r_k|s_k = x_l')} dr_k,$$

where 1 denotes the i-th bit label of the constellation point, and m is the total number of bits/QAM symbol point. Altogether the QAM constellation consists of $M=2^m$ constellation points, each assigned a particular bit label (00 . . . 00, 00 . . . 01, . . . , 11 . . . 11). In (1), E[•] denotes expectation operator, $p(r_k)$ is the probability density function (pdf) of the received symbols, $s_k$ is the transmitted symbol according to a particular bit label, k is the discrete time (or subcarrier index in case of OFDM modulation), $x_l$ is a particular symbol of the set of all constellation symbols, this set being denoted by $\mathbb{X}$ (=symbol alphabet, with cardinality $M=2^m$). For n-dimensional NUCs, the integral in (1) is evaluated over the complete n-dimensional space $\mathbb{R}^n$.

In case a CM apparatus is used as coding and modulation apparatus according to the present disclosure, the maximum possible capacity over such CM apparatus is described by the CM capacity $C_{CM}$:

$$C_{CM} = \quad (2)$$

$$\int_{r_k \in \mathbb{R}^n} \sum_{x_l \in \mathbb{X}} \frac{1}{L} p(r_k|s_k = x_l) \log_2 \frac{p(r_k|s_k = x_l)}{\frac{1}{L} \cdot \sum_{x_l' \in \mathbb{X}} p(r_k|s_k = x_l')} dr_k.$$

While the BICM capacity $C_B$ depends on both the location of the constellation points and the bit labelling of all constellation points, the CM capacity $C_{CM}$ depends only on the location of the constellation points. Further, it is well known that $C_{CM}$ is always larger than or equal to $C_B$.

$p(r_k|s_k=x_l)$ is the likelihood function (transition probability—defined by the channel characteristics) that $r_k$ is received given the fact that $s_k=x_l$ was transmitted. The subset $\mathbb{X}_b^i$ includes all symbols from $\mathbb{X}$, where the i-th bit label is b (either b=0 or b=1).

All investigated channels here include AWGN (only or after the fading channel). This can be described by the signal-to-noise ratio SNR, typically in dB:

$$SNR=10*\log_{10}(E_s/\sigma^2), \quad (3)$$

where $E_s$ is the average symbol power of the QAM constellation in one dimension (typically the overall symbol power over two dimensions is normalized to 1), and $\sigma^2$ is the variance (=power) of the additive white Gaussian noise (which is assumed to be of zero-mean) in the same dimension. It is assumed that the noise is identically and independently distributed (iid) over the n dimensions.

Equations (1) and (2) are optimized, given all degrees of freedom, namely the constellation points of the n-dimensional constellation, subject to the power constraint, i.e.

$$\mathcal{P}_x = E_{s_k}[|s_k|^2] = E_{x_l}[|x_l|^2] = \frac{1}{M}\sum_{l=0}^{M-1} |x_l|^2 \stackrel{!}{=} n/2. \qquad (4)$$

The norm in (4) is to be taken in the n-dimensional space and corresponds to normal L2 norm (i.e., the squared Euclidean distance to the origin). By convention, the power shall be normalized to half the number of dimensions, e.g., 1 for n=2 (as in conventional 2-dimensional QAM constellations).

Figure 4:
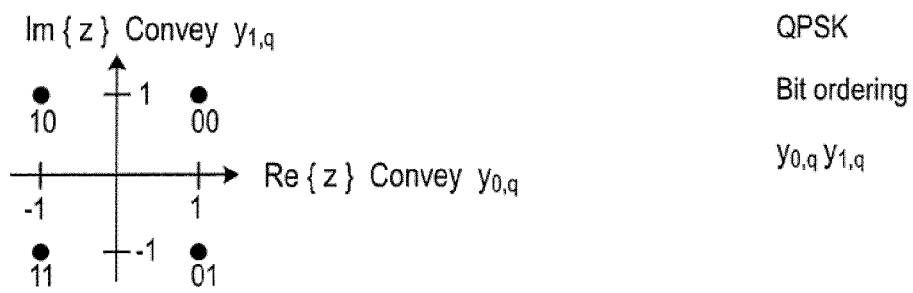
FIG. 4 shows a regular 4-QAM constellation as a simple example for a constellation.

For example, a regular two-dimensional 4-QAM consists of constellation points ($e^{j\pi/4}$, $e^{j7\pi/4}$, $e^{j3\pi/4}$, $e^{j5\pi/4}$), as can be seen in FIG. 4. The average symbol power in the two dimensions is 1 (all symbols are located on unit circle here). The above symbol vector ($e^{j\pi/4}$, $e^{j7\pi/4}$, $e^{j3\pi/4}$, $e^{j5\pi/4}$) is to be understood such that the first entry ($e^{j\pi/4}$) belongs to the bit vector 00, the second entry ($e^{j7\pi/4}$) to 01 and so on, i.e. the entries belong to bit vectors with increasing values, where the first bit position is the most significant bit (MSB) and the last one the least significant bit (LSB). This 4-QAM is a particular case of an $N^2$-QAM, with N=2. Note that this definition (of being an $N^2$ QAM) does not only require $N^2$ being a square number ($N^2=2^2$), but also that the constellation is symmetrical and can be described by two independent N-PAM constellations, here a 2-PAM: the inphase component (real-part of the complex symbols) is a 2-PAM with symbol vector (1/sqrt(2), −1/sqrt(2)) and describes the $1^{st}$ bit of the 4-QAM, whereas the quadrature-phase component (imaginary-part of the complex symbols) is the same 2-PAM, this time describing the $2^{nd}$ bit of the 4-QAM. Note further that the decomposition of the $N^2$-QAM into two N-PAMs is only possible if the bit labelling is according to binary reflected Gray mapping, which is typically applied (e.g. in DVB-systems).

Constellation shaping is generally known and has a long history. Only in recent years, constellations were investigated which maximize the BICM capacity $C_B$. In C. Fragouli, R. D. Wesel, D. Sommer, and G. P. Fettweis, "Turbo codes with non-uniform constellations", in IEEE International Conference on Communications (ICC), June 2001, the authors propose an heuristic approach to maximize $C_B$ by forcing the underlying PAM to approach a Gauss-like form (as is well known from Shannon's capacity theorem, the optimum constellation over the AWGN channel should have a Gaussian distribution; note that this means that there is an infinite number of continuously distributed input signals, having a Gaussian distribution, i.e., symbols with small power should occur more frequently than symbols with large power). There is no proof that this maximizes $C_B$, indeed those NUCs designed according to this method do not maximize $C_B$. The resulting NUCs are in general no $N^2$ NUCs, i.e., a 2-dimensional NUC was optimized, not the underlying PAM. However, in N. Muhammad, "Coding and modulation for spectral efficient transmission", Ph.D. dissertation, Universität Stuttgart, Institut für Nachrichtenübertragung, Pfaffen-waldring 47, 70569 Stuttgart, Germany, June 2006, the first time constellations have been directly optimized with respect to the target function $C_B$. For this method two differences to the current method occur:

Two-dimensional M-NUCs were proposed for M=8, 16, and 32. No higher order NUCs were investigated, as the optimization becomes very time consuming and the optimization algorithms became numerically unstable. The optimization algorithm was a hand-written gradient search algorithm, where both the BICM capacity and the gradient thereof consisted of improper integrals. No special care about either the numerical solution of the improper integral or the problematic integrants was considered. This consideration of these two issues is fundamental to obtain results for high order constellations, such as 1 k (i.e. 1024) NUC.

As described above, two problems arise when solving the optimization:
a) improper integral: integration border selection; and
b) integrant.

With respect to problem a) (improper integral: integration border selection), as seen in eq. (1), the BICM capacity involves an integral from − infinity to + infinity (=improper integral). Any numerical solution of this integral has to consider finite integration borders such as from −b to +b, with b sufficiently large. Matlab provides several functions for numerical integration, even for improper integrals, such as the function "quad", which internally optimizes the appropriate integration borders b. However, it has been observed that even these functions yield numerical instabilities and do not end up with the correct integral.

Figure 5A:
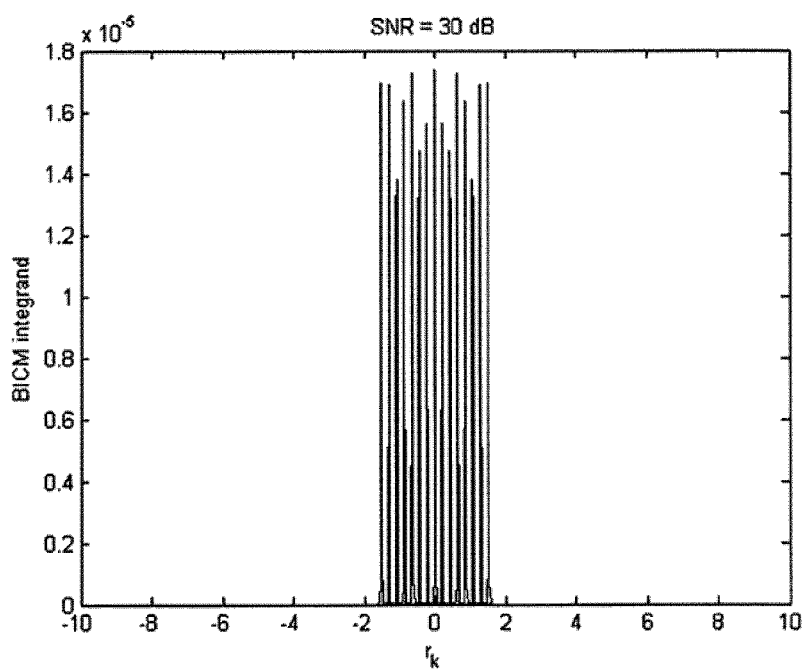
FIG. 5 shows diagrams depicting the integrant of the 1-dimensional BICM capacity function at 10 dB and at 30 dB SNR.
Figure 5B:
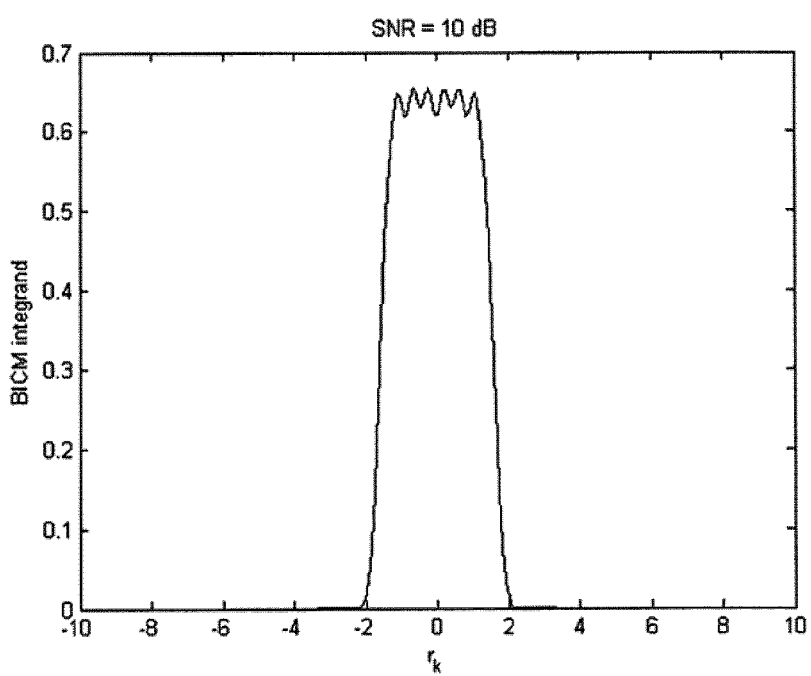

It can be observed that the integrant in (1) approaches 0 if the variable $r_k$ is sufficiently large (b→Inf). So a naïve approach would be to stepwise increase the variable $r_k$, until the integrant falls below a certain threshold (say $10^{-300}$ or if it even becomes exactly 0) and chose this value for the integration border b. However, it has further been observed that the integrant can take on very small values even before it converges to 0 for large variables, as can be seen in the two examples depicted in FIGS. 5A and 5B: the plot shown in FIG. 5B is the integrant of the 1-dimensional BICM capacity function, if a regular 32-PAM is used, at 10 dB SNR, while the plot shown in FIG. 5A 30 dB is considered.

With respect to problem b) (integrant) it has further been observed that the integrant of the BICM capacity integral can cause numerical instabilities for large SNR values. As can be seen in eq. (1), the integrant consists of sums, including terms such as $$x*\log(x), x*\log(1/x), \text{ or } x*1/\log(x).$$

The value of x is e.g. the transition probability $p(r_k|s\_k=x_l)$, or a pdf or includes parts thereof. The values of x become increasingly small (even approaching 0) if the SNR is very large, as the pdfs typically correspond to Gaussian distributions. Thus, the following limits might occur:

$$\lim_{\{x\to 0\}} x*\log(x), \lim_{\{x\to 0\}} x*\log(1/x), \text{ or } \lim_{\{x\to 0\}} x*1/\log(x).$$

Note that in theory, each limit converges to 0 (see l'Hospital's rule), but in a numerical computation, values such as + or − infinite or NaN ("not a number") will occur. Thus, the following is proposed: during the computation of each element (i.e., each addend in the integrant of (1)), the value has to be checked if it is finite (otherwise infinite or NaN), and replace it by 0 in case it is not finite. Only this way, reliable integration results can be obtained.

As explained above, according to the present disclosure the modulator may be configured to provide, as a first part, the function of a mapper, which is mapping the input cell words into n dimensional constellation points. Additionally, as a second part, the modulator may also provide the function of an assigner (or converter or physical translator, i.e. so that no additional converter is required as shown in FIG. 2A), which is mapping the n dimensions (i.e. the n-tupel of constellation values) into physical relevant properties. Said properties may include one or more of the following properties:

each dimension is assigned to one component (real- or imaginary) of a subcarrier in case of OFDM or of a symbol encoded over different independent frequencies;

each dimension is assigned to a different RF channel;

each dimension is assigned to one component (real- or imaginary) of a symbol encoded in over different a temporal symbols;

each dimension is assigned to one component (real- or imaginary) of a symbol encoded in space;

each dimension is assigned to one component (real- or imaginary) of a symbol with different polarization (horizontal vs. vertical or left-hand circular vs. right-hand circular);

each dimension is assigned to one component (real- or imaginary) of a symbol encoded by a different code, in particular a spreading code (e.g., based on code division multiple access, CDMA);

each dimension is assigned to one component (real- or imaginary) of a symbol encoded by orbital angular momentum;

each dimension is assigned to one component (real- or imaginary) of a symbol encoded by different wavelengths in an optical fiber using wavelength division multiplex.

In other words, the n-tupel of constellation values may define real values or imaginary values or a combination of real values and imaginary values of n' subcarriers at n' different frequencies or frequency ranges used for transmitting the transmission stream, wherein n' is an integer equal to or less than n. In other embodiments the n-tupel of constellation values may define real values or imaginary values or a combination of real values and imaginary values of n' symbols in one or more of time, space, different polarization, encoded by different codes, encoded by different orbital momentum, or encoded by any other (preferably orthogonal) dimensions used for transmitting the transmission stream. There may be other schemes, which are almost orthogonal, but not exactly, e.g., if there is some overlap of these dimensions (one temporal symbol overlaps with others (inter-symbol interference)). There are also alternatives to OFDM, which do not use orthogonal subcarriers, etc. Hence, "orthogonality" refers to either ideally independent dimensions, or where a small amount of interference may be tolerated.

To explain the notation n and n', in an example n=3 dimensions are used, x and y are assigned to real and imaginary part of one subcarrier, and z is assigned to the real part of a second subcarrier, so that in total n'=2 subcarriers (actually, 1.5) are used for n=3 dimensions.

Figure 6:
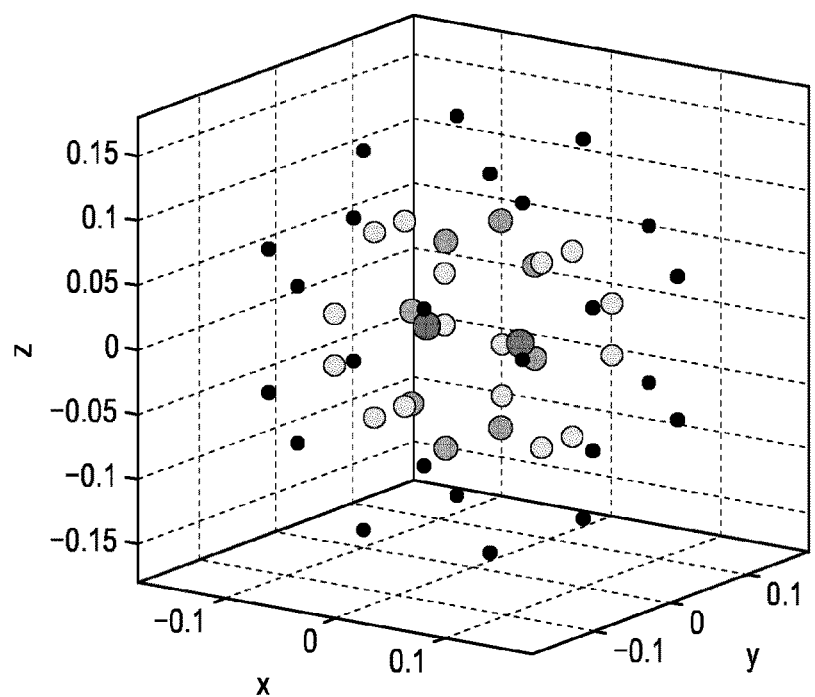
FIG. 6 shows an exemplary 64-3D non-uniform constellation with M=64.

FIG. 6 depicts an exemplary 64-3D non-uniform constellation with M=64, i.e. with M=$2^6$=64 constellation points of the 3-dimensional constellation (n=3) with M/$2^n$=8 constellation points of the $2^n$=8 sectors for enconding m=log$_2$(M) =6 bits. In the plot the size of the dots depends on the distance from the origin (larger dots are closer to the origin than smaller dots).

Figure 7:
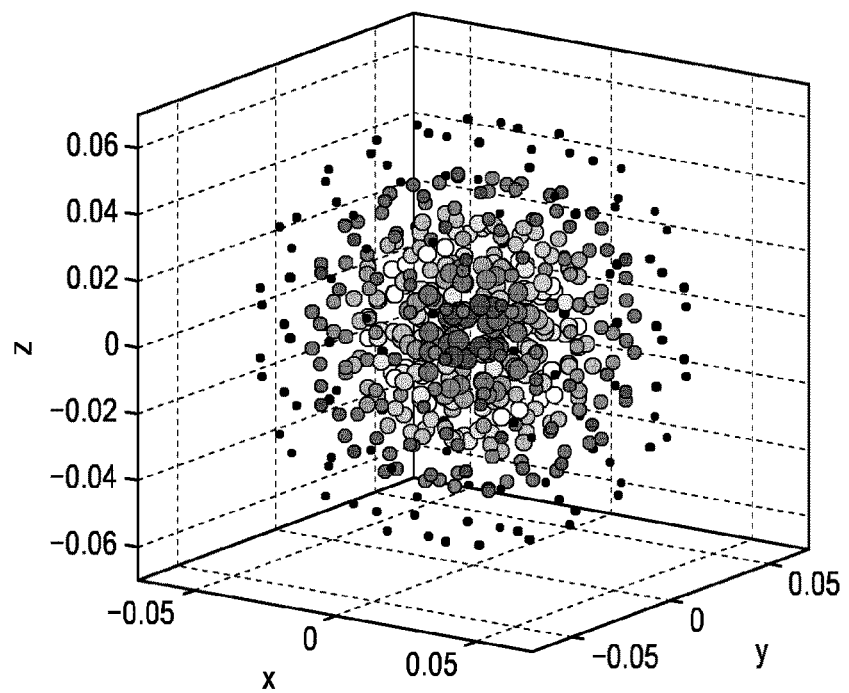
FIG. 7 shows an exemplary 512-3D non-uniform constellation with M=512.

FIG. 7 depicts an exemplary 512-3D non-uniform constellation with M=512, i.e. with M=$2^9$=512 constellation points of the 3-dimensional constellation (n=3) with M/$2^n$=64 constellation points of the $2^n$=8 sectors for enconding m=log$_2$(M)=9 bits. Also in this plot the size of the dots depends on the distance from the origin.

Both non-uniform constellations from the plots shown in FIGS. 6 and 7 are optimized with respect to their CM capacity and show a spherical constellation so that an additional gain can be achieved due to the reduced average power compared to known spherical 2D-NUCs. This emphasizes the tendency of n-dimensional constellations to form an n-dimensional sphere in order to obtain a large Euclidian distance of neighboring constellation points at a given average power. In general, the larger the number n of dimensions, the larger the shaping gain. The reason is that more degrees of freedom for optimization are available. However, complexity increases as well with dimensionality.

The creation of the n-dim. NUC based on the optimized degrees of freedom will be explained in more detail below.

Since the performance of NUCs depends on the SNR value they are optimized for, a thorough selection is preferably carried out depending on the (FEC) code rate to achieve optimum performance. If the channel characteristics are known, the required SNR value for FEC convergence can be determined by simulation. Then the NUC that has been optimized for this SNR value is chosen for best performance. If the SNR at the receiver is lower than this SNR decoding threshold, the constellation is not optimal. However, this is no drawback, since the BICM/CM capacity is too low for successful decoding anyhow. On the other hand if the SNR at the receiver is clearly higher than the decoding threshold, a sufficient amount of BICM/CM capacity for successful decoding is available, even though the NUC is suboptimal for this SNR range. Therefore, the NUC needs to be optimized for the SNR value at the waterfall region (i.e., decoding threshold for (quasi-) error free decoding) of the FEC. As the SNR value of the waterfall region depends on the code rate of the FEC, a different NUC is selected for each code rate.

The SNR value for (quasi-) error free decoding also depends on the channel characteristics of the receiver. For instance the required SNR for error free decoding of the DVB-T2 LDPC code in the AWGN channel is 0.8 dB, whereas 2.5 dB are required in the Rayleigh P1 multipath channel. The selected NUC for each code rate is thus not optimal in all channel environments and a tradeoff is necessary in a broadcasting environment that suits all (or most) users in the network. In a point-to-point network with return channel, as is the case for IEEE 802.11 WiFi systems, the optimal NUC may be selected based on the measured channel characteristics in the receiver.

In the following some more explanation is provided regarding the definition of the n-dimensional non-uniform QAM constellations. Each input cell word $(y_{0,q} \ldots y_{m-1,q})$ (i.e. provided to the modulator) shall be modulated using an n-dimensional non-uniform QAM constellation to give a constellation point $z_q$ prior to normalization, where m corresponds to the number of bits per QAM symbol m=log$_2$(M). It should be noted that the parameter q used here for discrete time or subcarrier index corresponds to the parameter k as used in the above equations (1) and (2). The exact values of the n dimensions for each combination of the relevant input bits $y_{0 \ldots m-1,q}$ are given in the following tables for the various constellation sizes depending on the NUC position vector.

In the following the n-dimensional NUC optimization having sector symmetry will be described, i.e. the optimization of an n-dimensional constellation that is derived from a single sector consisting of only M/$2^n$ points. The above described optimization of an M-QAM requires the optimization of all M degrees of freedom in n dimensions, which is significantly more time consuming than optimizing only M/$2^n$ points, since complexity increases exponentially with the number of constellation points. This is also caused by the need of calculating the BICM/CM capacity during the optimization for the n-dimensional case instead of the 1-dimensional or 2-dimensional case for conventional 1D or 2D NUCs. Since in the 2-dimensional case, the optimum 2D-constellations for the 16-QAM case are symmetric with respect to the four different quadrants of the constellations, the following simplifications can be applied during the optimization for 2D NUCs: Only one quadrant of the constellation is optimized during the constellation, reducing the degrees of freedom during the optimization from 2*M to M/2. From this quadrant the remaining quadrants can be derived, leading to a so called Q-QAM constellation. However, care must be taken to ensure that the properties of the bit labeling of the constellation points are retained. If the first quadrant is Gray-Mapped, offering a maximum Hamming distance of 1, the same must be ensured for the remaining quadrants of the Q-QAM constellation. This is ensured by the rotation algorithm defined below. The concept of quadrant symmetry can be extended to the n-dimensional case, where the four quadrants are replaced by $2^n$ sectors, each describing the subspace in the n-dimensional space, comprising all n-tuples $(x_0, x_1, x_2, \ldots, x_{n-1})$ with each $x_k$ ($k \in \{0, 1, \ldots, n-1\}$) being either positive or negative.

To uniquely define a 16-Q-QAM only 8 real values are required, corresponding to 4 complex values representing the constellation points of the first quadrant. For n dimensions, in general only M/$2^n$ real values are required. The presented Q-QAM optimization approach can be used for any channel condition, e.g. for the AWGN channel as well as for fading channels.

In the following the definition of the NUC position vectors obtained by use of the above described approach for obtaining n-dimensional constellations is provided, wherein the signal-to-noise ratio (SNR) is always denoted in dB: for n=3, M=16, BICM system:

| wk | LSB bit label (b3) | $R_c = \frac{2}{3}$, 6.15 dB, (x, y, z) |
|---|---|---|
| W0 | 0 | (1.188087, 0.609156, 0.609156) |
| w1 | 1 | (0.322326, 0.609156, 0.609156) |

This 16-3D NUC is designed for maximize BICM capacity for an SNR of 6.15 dB. The SNR has been chosen according to the use with a forward error correction code (FEC) of rate $R_c=2/3$, in particular with a low-density parity-check (LDPC) code. The SNR is obtained by trial-and-error simulations: if the SNR is smaller than 6.15 dB, the LDPC decoder will output a high bit error rate (BER), but after this SNR threshold, the decoder outputs very low BER.

Next, a definition of the n-dimensional constellation shall be provided. Each input cell word $(y_0, \ldots, y_{m-1})$ shall be modulated using an n-dimensional non-uniform constellations to give a constellation point $z_q$ prior to power normalization, where m corresponds to the number of bits per QAM symbol m=$\log_2$(M). The vector of complex constellation points $x_{0 \ldots M-1}$ for all combinations of the input bits $y_{0 \ldots m-1}$ (corresponding to the decimal values 0 to M−1) are given in the above shown tables for the various constellation sizes depending on the position vector $w_{0 \ldots b-1}$, which defines the constellation point positions of a 0-th sector of the n-dimensional non-uniform constellation. Generally, an n-dimensional constellation has $2^n$ sectors.

For instance, a 3-dimensional constellation has $2^3$=8 sectors and a 4-dimensional constellation has $2^4$=16 sectors The length p of the position vector w is defined by p=M/$2^n$=$2^m$/$2^n$=$2^{m-n}$. The position vector defines a 0-th sector of the constellation (e.g. representing the first sector of a three-dimensional Cartesian coordinate system according to which a 3-dimensional constellation is oriented).

As shown above, in a preferred embodiment, it is assumed that all n dimensions can be treated equally, so the n-dimensional constellations consisting of M constellation points will have M/$2^n$ constellation points in each hyperquadrant (also called sector). For such n-dimensional constellations, a similar symmetry as for Q-QAMs can be defined in general with respect to sectors in the n-dimensional space (each dimension consisting of real-valued numbers). The n-dimensional space can be separated into $2^n$ sectors, where each sector corresponds to the subspace comprising all n-tuples $(x_0, x_1, x_2, \ldots, x_{n-1})$ with each $x_k$ ($k \in \{0, 1, \ldots, n-1\}$) being either positive or negative. Define the binary representation of the integer number s ($s \in \{0, 1, \ldots, 2^n-1\}$) as ($b_0, b_1, b_2, \ldots, b_{n-1}$), with $b_k \in \{0, 1\}$. Without loss of generality, $b_0$ shall denote the most significant bit (MSB) and $b_{n-1}$ shall denote the least significant bit (LSB). As an example for n=3 dimensions, s=0 has the binary representation (0,0,0), s=1 has the binary representation (0,0,1), and so on until s=$2^3$−1=7 has the binary representation (1,1,1). The s-th sector (se $\{0, 1, \ldots, 2^n-1\}$) shall be defined without loss of generality as the subspace, in which $x_k$ is positive ($x_k \geq 0$), if the k-th bit representation $b_k$ is 0, or in which $x_k$ is negative ($x_k<0$), if the k-th bit representation $b_k$ is 1.

In another preferred embodiment, it is further assumed that the number of bits m per n-dimensional constellation point is larger than the number of dimensions n, m≥n. If the constellation has M constellation points in total, the m=$\log_2$ (M), which is assumed to be an integer number. The bit label for each constellation point can then be written as ($b_0, b_1, b_2, \ldots, b_{n-1}, b_n, b_{n+1}, \ldots, b_{m-1}$). If the (binary) input data is such m-tupel, it will be assigned to this constellation point. Without loss of generality, the first n most significant bits (MSBs) thereof, ($b_0, b_1, b_2, \ldots, b_{n-1}$), shall directly define the s-th sector as described above, i.e., the all-zero n-tupel shall be assigned to the p=M/$2^n$=$2^m$/$2^n$=$2^{m-n}$ constellation points of the 0-th sector. In said preferred embodiment, only the mapping (or assignment) of the remaining m-n bits to those $2^{m-n}$ constellation points shall be described, where each of the n dimensions of these constellation points will have a positive value as described above for the 0-th sector. Given this mapping for the 0-th sector, the remaining M−M/$2^n$ constellation points are given by symmetry to the 0-th sector. If the first n MSBs correspond as binary representation to the s-th sector (s>0), the corresponding constellation point from the 0-th sector is rotated to the s-th sector as follows: the component of the k-th dimension will be inverted (becomes negative), if the k-th bit representation $b_k$ is 1, otherwise it remains the same (positive) value as from the 0-th sector definition, if the k-th bit representation $b_k$ is 0.

In general, an n-dimensional non-uniform constellation from a group of constellations comprising predetermined constellations is used, wherein the M constellation points of the different sectors of a constellation are defined by a constellation position vector $w_{0 \ldots p-1}$, wherein p=M/$2^n$, wherein the constellation points $x_{0 \ldots p-1}$ of a 0-th sector are defined as $x_{0 \ldots p-1} = w_{0 \ldots p-1}$, the constellation points $x_{p \ldots 2p-1}$ of a 1-st sector are defined as $w_{0 \ldots p-1}$, but in which the last dimension is inverted, the constellation points $x_{2p \ldots 3p-1}$ of a 2-nd sector are defined as $w_{0 \ldots p-1}$, but in which the second from last dimension is inverted, the constellation points $x_{3p \ldots 4p-1}$ of a 3-rd sector are defined as $w_{0 \ldots p-1}$, but in which the last and second from last dimensions are inverted, the constellation points $x_{sp \ldots (s+1)p-1}$ of a s-th sector ($s \in \{0, 1, \ldots, 2^n-1\}$) in general are defined as $w_{0 \ldots p-1}$, but in which the component of the k-th dimensions ($k \in \{0, 1, \ldots, n-1\}$) are inverted, if the binary representation of s, i.e., ($b_0, b_1, b_2, \ldots, b_{n-1}$), with $b_i \in \{0,1\}$, has as k-th bit $b_k=0$, wherein the constellation position vectors of the different constellations of the group of constellations will be derived and shown below.

For instance, in a 3-dimensional constellation (x, y, z) define the constellation values in the three orthogonal dimensions. The constellation points of the 8 sectors sector are derived as follows:

$x_{0 \ldots p-1} = w_{0 \ldots p-1}$, (0-th sector)
$x_{p \ldots 2p-1} = w_{0 \ldots p-1}$, with z being inverted (1-st sector)
$x_{2p \ldots 3p-1} = w_{0 \ldots p-1}$, with y being inverted (2-nd sector)
$x_{3p \ldots 4p-1} = w_{0 \ldots p-1}$, with y, and z being inverted (3-rd sector)
$x_{4p \ldots 5p-1} = w_{0 \ldots p-1}$, with x being inverted (4-th sector)
$x_{5p \ldots 6p-1} = w_{0 \ldots p-1}$, with x and z being inverted (5-th sector)
$x_{6p \ldots 7p-1} = w_{0 \ldots p-1}$, with x and y being inverted (6-th sector)
$x_{7p \ldots 8p-1} = w_{0 \ldots p-1}$, with x, y and z being inverted (7-th sector)

or expressed differently:
the constellation points of a zeroth sector are defined as
$w_{0 \ldots p-1} = (x_{0 \ldots p-1}, y_{0 \ldots p-1}, z_{0 \ldots p-1})$,
the constellation points of a first sector are defined as
$w_{p \ldots 2p-1} = (x_{0 \ldots p-1}, y_{0 \ldots p-1}, -z_{0 \ldots p-1})$,
the constellation points of a second sector are defined as
$w_{2p \ldots 3p-1} = (x_{0 \ldots p-1}, -y_{0 \ldots p-1}, z_{0 \ldots p-1})$,
the constellation points of a third sector are defined as
$w_{3p \ldots 4p-1} = (x_{0 \ldots p-1}, -y_{0 \ldots p-1}, -z_{0 \ldots p-1})_p$,
the constellation points of a fourth sector are defined as
$w_{4p \ldots 5p-1} = (-x_{0 \ldots p-1}, y_{0 \ldots p-1}, z_{0 \ldots p-1})$,
the constellation points of a fifth sector are defined as
$w_{5p \ldots 6p-1} = (-x_{0 \ldots p-1}, y_{0 \ldots p-1}, -z_{0 \ldots p-1})$,
the constellation points of a sixth sector are defined as
$w_{6p \ldots 7p-1} = (-x_{0 \ldots p-1}, -y_{0 \ldots p-1}, z_{0 \ldots p-1})$,
the constellation points of a seventh sector are defined as
$w_{7p \ldots 8p-1} = (-x_{0 \ldots p-1}, -y_{0 \ldots p-1}, -z_{0 \ldots p-1})$.

In a 4-dimensional constellation (w, x, y, z) define the constellation values in the four orthogonal dimensions. In such a constellation the constellation points of the 16 sectors are derived as follows:

$x_{0 \ldots p-1} = w_{0 \ldots p-1}$, (0-th sector)
$x_{p \ldots 2p-1} = w_{0 \ldots p-1}$, with z being inverted (1-st sector)
$x_{2p \ldots 3p-1} = w_{0 \ldots p-1}$, with y being inverted (2-nd sector)
$x_{3p \ldots 4p-1} = w_{0 \ldots p-1}$, with y, and z being inverted (3-rd sector)
$x_{4p \ldots 5p-1} = w_{0 \ldots p-1}$, with x being inverted (4-th sector)
$x_{5p \ldots 6p-1} = w_{0 \ldots p-1}$, with x and z being inverted (5-th sector)
$x_{6p \ldots 7p-1} = w_{0 \ldots p-1}$, with x and y being inverted (6-th sector)
$x_{7p \ldots 8p-1} = w_{0 \ldots p-1}$, with x, y and z being inverted (7-th sector)
$x_{8p \ldots 9p-1} = w_{0 \ldots p-1}$, with w being inverted (8-th sector)
$x_{9p \ldots 10p-1} = w_{0 \ldots p-1}$, with w and z being inverted (9-th sector)
$x_{10p \ldots 11p-1} = w_{0 \ldots p-1}$, with w and y being inverted (10-th sector)
$x_{11p \ldots 12p-1} = w_{0 \ldots p-1}$, with w, y, and z being inverted (11-th sector)
$x_{12p \ldots 13p-1} = w_{0 \ldots p-1}$, with w and x being inverted (12-th sector)
$x_{13p \ldots 14p-1} = w_{0 \ldots p-1}$, with w, x and z being inverted (13-th sector)
$x_{14p \ldots 15p-1} = w_{0 \ldots p-1}$, with w, x and y being inverted (14-th sector)
$x_{15p \ldots 16p-1} = w_{0 \ldots p-1}$, with w, x, y and z being inverted (15-th sector)

or expressed differently:
the constellation points of a first sector are defined as
$w_{0 \ldots p-1} = (x_{0 \ldots p-1}, y_{0 \ldots p-1}, z_{0 \ldots p-1}, u_{0 \ldots p-1})$,
the constellation points of a second sector are defined as
$w_{p \ldots 2p-1} = (x_{0 \ldots p-1}, y_{0 \ldots p-1}, z_{0 \ldots p-1}, -u_{0 \ldots p-1})$,
the constellation points of a third sector are defined as
$w_{2p \ldots 3p-1} = (x_{0 \ldots p-1}, y_{0 \ldots p-1}, -z_{0 \ldots p-1}, u_{0 \ldots p-1})$,
the constellation points of a fourth sector are defined as
$w_{3p \ldots 4p-1} = (x_{0 \ldots p-1}, y_{0 \ldots p-1}, -z_{0 \ldots p-1}, -u_{0 \ldots p-1})$,
the constellation points of a fifth sector are defined as
$w_{4p \ldots 5p-1} = (x_{0 \ldots p-1}, -y_{0 \ldots p-1}, z_{0 \ldots p-1}, u_{0 \ldots p-1})$,
the constellation points of a sixth sector are defined as
$w_{5p \ldots 6p-1} = (x_{0 \ldots p-1}, -y_{0 \ldots p-1}, z_{0 \ldots p-1}, -u_{0 \ldots p-1})$,
the constellation points of a seventh sector are defined as
$w_{6p \ldots 7p-1} = (x_{0 \ldots p-1}, -y_{0 \ldots p-1}, -z_{0 \ldots p-1}, u_{0 \ldots p-1})$,
the constellation points of a eighth sector are defined as
$w_{7p \ldots 8p-1} = (x_{0 \ldots p-1}, -y_{0 \ldots p-1}, -z_{0 \ldots p-1}, -u_{0 \ldots p-1})$,
the constellation points of a ninth sector are defined as
$w_{8p \ldots 9p-1} = (-x_{0 \ldots p-1}, y_{0 \ldots p-1}, z_{0 \ldots p-1}, u_{0 \ldots p-1})$,
the constellation points of a tenth sector are defined as
$w_{9p \ldots 10p-1} = (-x_{0 \ldots p-1}, y_{0 \ldots p-1}, z_{0 \ldots p-1}, -u_{0 \ldots p-1})$,
the constellation points of a eleventh sector are defined as
$w_{10p \ldots 11p-1} = (-x_{0 \ldots p-1}, y_{0 \ldots p-1}, -z_{0 \ldots p-1}, u_{0 \ldots p-1})$,
the constellation points of a twelfth sector are defined as
$w_{11p \ldots 12p-1} = (-x_{0 \ldots p-1}, y_{0 \ldots p-1}, -z_{0 \ldots p-1}, -u_{0 \ldots p-1})$,
the constellation points of a thirteenth sector are defined as
$w_{12p \ldots 13p-1} = (-x_{0 \ldots p-1}, -y_{0 \ldots p-1}, z_{0 \ldots p-1}, u_{0 \ldots p-1})$,
the constellation points of a fourteenth sector are defined as
$w_{14p \ldots 14p-1} = (-x_{0 \ldots p-1}, -y_{0 \ldots p-1}, z_{0 \ldots p-1}, -u_{0 \ldots p-1})$,
the constellation points of a fifteenth sector are defined as
$w_{14p \ldots 15p-1} = (-x_{0 \ldots p-1}, -y_{0 \ldots p-1}, -z_{0 \ldots p-1}, u_{0 \ldots p-1})$,
the constellation points of a sixteenth sector are defined as
$w_{15p \ldots 16p-1} = (-x_{0 \ldots p-1}, -y_{0 \ldots p-1}, -z_{0 \ldots p-1}, -u_{0 \ldots p-1})$, Four bits ($\log_2(16)=4$) will be mapped to one of the 16 three-dimensional symbols. For a three-dimensional constellation, only $1/2^3 = 1/8$ of the constellation points need to be defined due to sector symmetry. This results in 2 points, since $p=M/2^n=2^m/2^n=2^{m-n}=16/8=2$. The bit labels of the constellation symbols will be denoted as b0, b1, b2, and b3. The first n=3 bit labels (b0, b1, and b2) define the location of the sector, the remaining m−n=4−3=1 bit defines the location (x,y,z) inside this sector. The w vector defines the constellation points, when the first three bit labels are all 0, resulting in points located in the 0-th sector. Assume, e.g., the bits are 0001, then the constellation point is w1= (0.322326, 0.609156, 0.609156). If the first three bits are 001, then the constellation points will be located in the 1$^{st}$ sector. Assume, e.g., the bits are 0011, then the constellation point is—according to the previous rule—(0.322326, 0.609156, −0.609156), i.e., w1, with the z coordinate inverted. As another example, assume the bits are 1100, then the sector is defined by 110, corresponding to the 6-th sector, in which case both the x and y coordinate of w will be inverted. Since the last bit is 0 (w0 in 0-th sector), the constellation point is (−1.188087, −0.609156, 0.609156).

Note that the power of the constellation points is normalized to occupy power 1.0 in 2 dimensions, i.e., power 1.5 in 3 dimensions.

Figure 8:
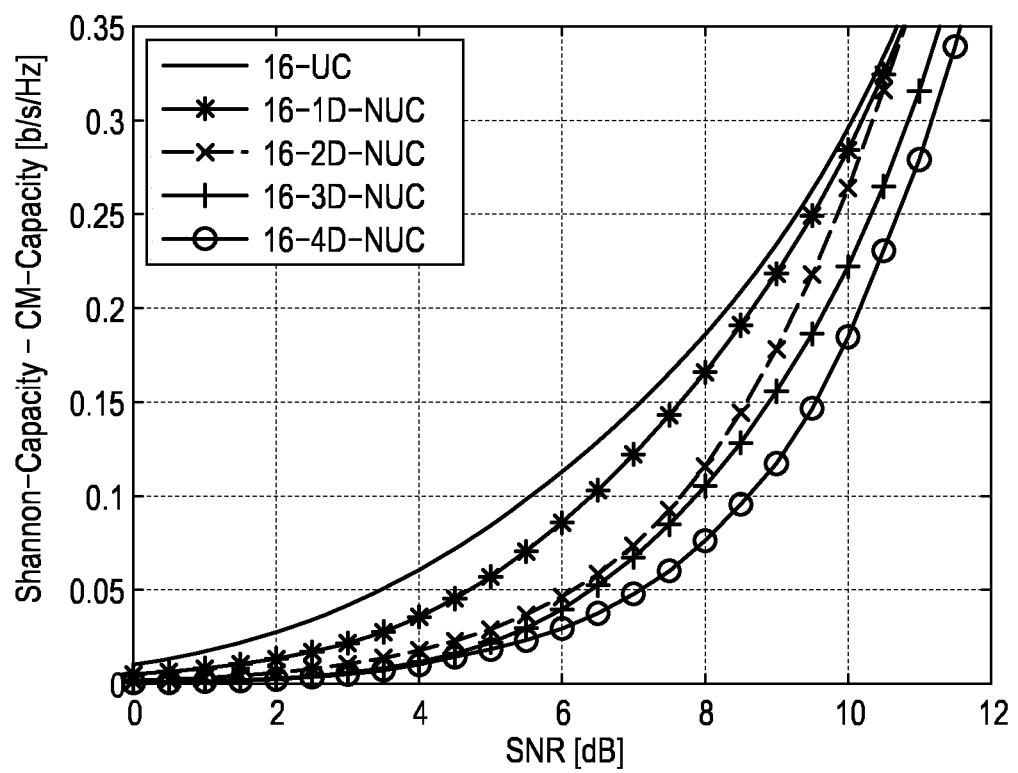
FIG. 8 shows a diagram illustrating the distance of the CM capacity to the ultimate Shannon limit.

The advantage of higher dimensional NUCs is the increased shaping gain, which can be obtained compared to conventional constellations. The design exploits all constellation points in n dimensions, which allows for more degrees of freedom as compared with conventional uniform QAM constellations. As an example, consider a 64-3D NUC in three dimensions (m=log 2(64)=6 bits in 3 dimensions, i.e., 2 bits in 1 dimension, i.e., 4 bits in 2 dimensions), which has the same spectral efficiency as a conventional 16-QAM in two-dimensions (m=log 2(16)=4 bits in 2 dimensions). FIG. 8 shows the distance of the CM capacity to the ultimate Shannon limit (ideally, the gap should be minimized). The conventional 16-QAM is a uniform constellation (UC), and shows a large gap to Shannon distance. If the NUC design considers only one dimension of the constellation points (while the second is a mirrored version), then a 1D-NUC results (notated as 16-1D-NUC), with visible shaping gains compared to the UC. Optimizing both dimensions of the 16 points jointly results in even larger gain, shown by the 16-2D-NUC curve. Optimizing the 64-3D NUCs will result in further gains (indicated by 16-3D-NUC curve, i.e., a different notation is used in the legend of the figure). Finally, optimizing over four dimensions results in the smallest gap to the Shannon limit, i.e., allows best performance compared with the other constellations, see 16-4D-NUC curve (256-4D NUC in the notation used here).

As mentioned above the constellation position vector w as defined herein does not necessarily contain the constellation points of the first sector of the constellation, but could also contain the constellation points of any of the $2^n$ sector s. Due to the sector symmetry this leads to constellations with a different bit mapping but with identical performance. The constellation position vector w in the tables defined herein should therefore be considered as an example for all $2^n$ symmetric constellations with different bit mapping but identical performance.

The above described embodiments cover the concept of shaping in more than two dimensions, called multi-dimensional NUCs. The new dimensions can be taken by grouping more than one symbol, e.g., several symbols over time, over frequency (e.g. OFDM subcarriers), space (e.g., MIMO), code (e.g., CDMA). In general, a conventional symbol is represented by two dimensions, namely inphase (I) and quadrature phase (Q) component, representing a complex symbol. I phase modulates a cosine wave, Q a sine wave of the same frequency. In contrast, a multi-dim. symbol has more than 2 components. For instance, subcarriers in OFDM may be used as follows: 3D symbol A uses subcarrier 1 (both I and Q) and the inphase dimension (real-part) of subcarrier 2, 3D symbol B uses subcarrier 3 (both I and Q) and the quadrature dimension (imaginary-part) of subcarrier 2. Joint optimization of all m dimensions (for m-dim. symbols) results in an m-dim. NUC.

Further, the above described embodiments cover 3D with 4, 16, 32, and 256 constellation points and 4D NUCs with 4, 64, and 256 points, for various target SNR values.

In the following, multi-dimensional NUCs will be described that are designed for particular code rates of a channel code (corresponding to particular target SNR values, in general different ones than considered above), namely code rates 1/4, 1/2, 2/3, 3/4, and 4/5. Further, settings will be described, which result in a non-integer spectral efficiency, e.g., 3D-16NUC, which allows 4 bits in 3D, or correspondingly 4/3*2=8/3=2.67 bits/channel use.

The above described modifications and embodiments are generally applicable with those multi-dimensional NUCs as well.

Figure 9A:
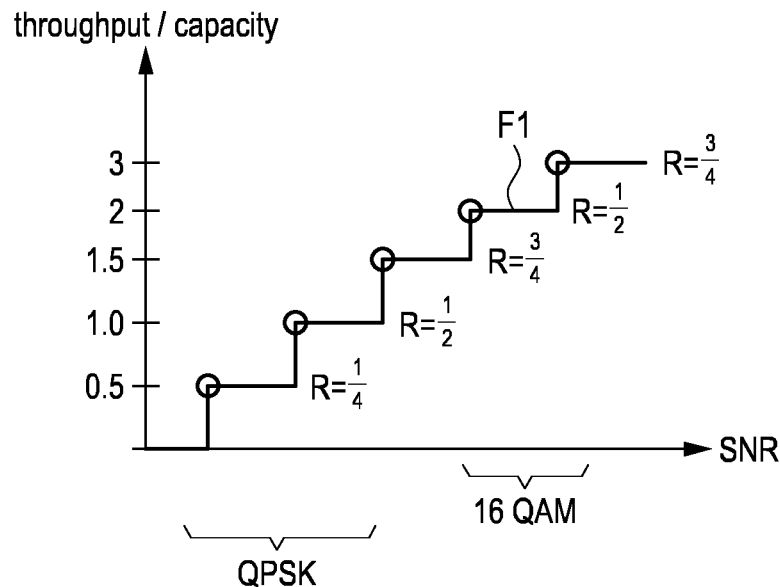
FIG. 9 shows plots illustrating a typical throughput chart and a chart in which an additional modulation and coding scheme is indicated.
Figure 9B:
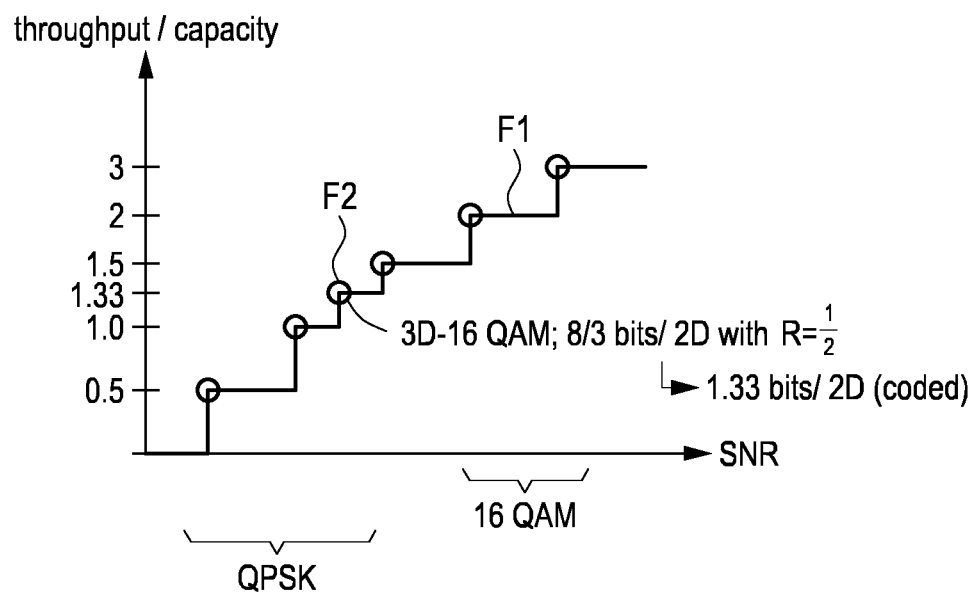

To illustrate the increased flexibility which can be introduced by new modulation schemes having a non-integer spectral efficiency per channel use, the plots shown in FIGS. 9A and 9B shall be considered. The plot in FIG. 9A shows a typical throughput chart of a system such as WiFi, with a limited amount of MCS (modulation and coding scheme) combinations. Each MCS offers a particular throughput, given by the code rate R of the forward error correction code (FEC) and the (uncoded) spectral efficiency η of the modulation. For instance, QPSK will offer (uncoded)η=2 bits/channel use, so in combination with a FEC of rate R=1/4, the coded spectral efficiency (or throughput or capacity) will be η*R=2*1/4=0.5 bits/channel use, shown by the left-most filled square marker in the figure. Corresponding to each MSC selection exists an SNR threshold, above which quasi-error free reception is possible. Those SNR values are plotted on the abscissa. The plot shows several MCS combinations, but leaves out some overlapping combinations (e.g., 16-QAM with R=1/4 will yield a throughput of 1 bit/channel use, which can also be achieved by QPSK with R=½ (and usually, the latter has lower SNR threshold). The step-function F1 shows the granularity/flexibility of the system: only if SNR exceeds the next threshold level, a higher MSC can be used, allowing higher throughput. However, in between two SNR thresholds, the system does not perform optimum: SNR would be too low for the next MSC, but too high for the currently used one.

Thus, in the plot in FIG. 9B, one intermediate MCS F2 is introduced by a multi-dimensional QAM. This is a 16QAM in 3D, e.g., by grouping 1.5 symbols over time (or 3 symbols over time, resulting in 2 3D symbols). This 3D-16QAM offers 8/3 bits in 2D, i.e., per channel use. For a coded system using R=½, the intermediate throughput at 1.33 bits/channel use is obtained. This means, that the large SNR steps in the previous staircase can be reduced by introducing such new modulation schemes. This would also be possible by using conventional QAMs (having integer uncoded spectral efficiencies), by using more FEC code rates. But this comes at the cost of more FEC code optimization, and more importantly, more HW resources for FEC encoder/decoder implementations. A multi-dimensional QAM is simply a look-up table (with M columns for each real dimension in this M-dimensional constellation), while any modern FEC is described by a very large table (e.g., in DVB, LDPC codes of 64800 bit lengths are used, with each code bit being hard- (or soft-) wired to certain parity check positions).

As mentioned above, a total number M of constellation points of the constellation and a number n of the dimension of the constellation, which fulfill the condition that log 2(M)/n*2 is a non-integer number, is used. Hereby, the condition for non-integer spectral efficiencies are:
number of modulated/transmitted bits: log 2(M)
number of dimensions: n
number of modulated/transmitted bits in 2 dimensions: log 2(M)/n*2; this number has to be non-integer.

Common examples (with integer spectral efficiencies) are:
BPSK: M=2, n=1→1/1*2→2 bits in 2D
QPSK: M=4, n=2→2/2*2→2 bits in 2D
8QAM: M=8, n=2→3/2*2→3 bits in 2D
16QAM: M=16, n=2→4/2*2→4 bits in 2D
8QAM: M=8, n=3→3/3*2→2 bits in 2D
64QAM: M=64, n=3→6/2*2→4 bits in 2D
16QAM: M=16, n=4→4/4*2→2 bits in 2D M is a power of 2, since an integer number B of bits are modulated to $2^B=M$ symbols. So for conventional 1- or 2-dimensional settings, the spectral efficiency is always an integer number: log 2(M)/n*2=B/n*2 (being B for n=2 or 2B for n=1). Also for higher dimensions (n>2), it is possible to end up with integer spectral efficiencies, such as 3D-64QAM: n=3, M=64→log 2(M)/n*2=6/3*2=4.

In the following the definition of the NUC position vectors obtained by use of the above described approach (using a symmetry approach) for obtaining 3-dimensional constellations (i.e. n=3) result in non-integer spectral efficiencies is provided, wherein the signal-to-noise ratio (SNR) is always denoted in dB:

for M=16 (yielding spectral efficiency of 4*2/3≈2.67 per 2 dimensions):

| wk | LSB bit label | $R_c = \frac{1}{4}$, −0.6 dB, (x, y, z) | $R_c = \frac{1}{2}$, 3.7 dB, (x, y, z) |
|---|---|---|---|
| w0 | 0 | (0.691896, 0.691896, 0.691896) | (0.632425, 1.084, 0.632421) |
| w1 | 1 | (0.691896, 0.691896, 0.691896) | (0.632407, 0.326843, 0.63241) |

| wk | LSB bit label | $R_c = \frac{2}{3}$, 6.15 dB, (x, y, z) | $R_c = \frac{3}{4}$, 7.2 dB, (x, y, z) |
|---|---|---|---|
| w0 | 0 | (1.188087, 0.609156, 0.609156) | (1.220012, 0.589151, 0.589151) |
| w1 | 1 | (0.322326, 0.609156, 0.609156) | (0.350927, 0.589151, 0.589151) |

| wk | LSB bit label | $R_c = \frac{2}{3}$, 6.15 dB, (x, y, z) |
|---|---|---|
| w0 | 0 | (1.188087, 0.609156, 0.609156) |
| w1 | 1 | (0.322326, 0.609156, 0.609156) | for M=32 (yielding spectral efficiency of 5*2/3≈3.33 per 2 dimensions):

| wk | LSB bit labels | $R_c = \frac{1}{4}$, 1.1 dB, (x, y, z) | $R_c = \frac{1}{2}$, 5.25 dB, (x, y, z) |
|---|---|---|---|
| w0 | 00 | (0.690335, 0.690336, 0.690336) | (0.370608, 1.147041, 0.497338) |
| w1 | 01 | (0.690335, 0.690336, 0.690335) | (0.372189, 0.372195, 0.247177) |
| w2 | 10 | (0.690335, 0.690335, 0.690335) | (0.548205, 0.548173, 1.27875) |
| w3 | 11 | (0.690335, 0.690335, 0.690334) | (1.147088, 0.370576, 0.497294) |

| wk | LSB bit labels (b3 b4) | $R_c = \frac{2}{3}$, 7.75 dB, (x, y, z) | $R_c = \frac{3}{4}$, 8.9 dB, (x, y, z) |
|---|---|---|---|
| w0 | 00 | (0.414674, 0.490757, 1.175376) | (1.248342, 0.488399, 0.488399) |
| w1 | 01 | (0.500684, 1.256404, 0.500684) | (0.482637, 1.17234, 0.425703) |
| w2 | 10 | (0.357577, 0.272802, 0.357576) | (0.482637, 0.425703, 1.17234) |
| w3 | 11 | (1.175374, 0.490758, 0.414674) | (0.303138, 0.358435, 0.358435) |

| wk | LSB bit labels (b3 b4) | $R_c = \frac{5}{6}$, 10.15 dB, (x, y, z) |
|---|---|---|
| w0 | 00 | (0.436652, 0.477235, 1.175916) |
| w1 | 01 | (0.480841, 1.248777, 0.480841) |
| w2 | 10 | (0.364177, 0.331963, 0.364178) |
| w3 | 11 | (1.175911, 0.477235, 0.436653) | for M=256 (yielding spectral efficiency of 8*2/3≈5.33 per 2 dimensions):

| wk | LSB bit labels (b3 b4 b5 b6 b7) | $R_c = \frac{1}{4}$, 4.6 dB, (x, y, z) | $R_c = \frac{1}{2}$, 9.5 dB, (x, y, z) |
|---|---|---|---|
| w0 | 00000 | (1.391424, 0.537778, 0.536699) | (1.429432, 0.398163, 0.927245) |
| w1 | 00001 | (1.390368, 0.53776, 0.537333) | (1.553649, 0.312171, 0.327864) |
| w2 | 00010 | (0.608379, 1.315757, 0.412757) | (1.127692, 1.137604, 0.822847) |
| w3 | 00011 | (0.609175, 1.315156, 0.412931) | (1.313641, 0.934611, 0.244387) |
| w4 | 00100 | (0.702969, 0.303528, 0.304283) | (0.773495, 0.185767, 0.31605) |
| w5 | 00101 | (0.703317, 0.303579, 0.304548) | (0.893113, 0.186002, 0.277308) |
| w6 | 00110 | (0.395919, 0.545612, 0.255704) | (0.688697, 0.357194, 0.194211) |
| w7 | 00111 | (0.395947, 0.545685, 0.255618) | (0.761811, 0.394269, 0.169599) |
| w8 | 01000 | (1.392334, 0.536933, 0.537948) | (0.863643, 0.428832, 1.004159) |
| w9 | 01001 | (1.391339, 0.537016, 0.538445) | (0.761645, 0.242249, 1.077306) |
| w10 | 01010 | (0.607268, 1.317332, 0.412865) | (0.756257, 0.933359, 0.614396) |
| w11 | 01011 | (0.608062, 1.316804, 0.41305) | (0.785824, 1.063219, 0.244593) |
| w12 | 01100 | (0.702795, 0.30336, 0.304291) | (0.674993, 0.296755, 0.638794) |
| w13 | 01101 | (0.703002, 0.303506, 0.304534) | (0.67095, 0.226702, 0.655424) |
| w14 | 01110 | (0.395779, 0.545624, 0.255644) | (0.616528, 0.621249, 0.381863) |
| w15 | 01111 | (0.395944, 0.545692, 0.255667) | (0.641013, 0.678244, 0.246624) |
| w16 | 10000 | (0.606175, 0.414212, 1.318067) | (0.354854, 0.938384, 1.458798) |
| w17 | 10001 | (0.607041, 0.414525, 1.317058) | (0.352171, 0.333193, 1.728259) |
| w18 | 10010 | (0.37928, 0.983804, 0.980257) | (0.355957, 1.396462, 0.985833) |
| w19 | 10011 | (0.379604, 0.983615, 0.980005) | (0.361284, 1.701687, 0.341124) |
| w20 | 10100 | (0.395741, 0.255653, 0.548129) | (0.203506, 0.176026, 0.303222) |
| w21 | 10101 | (0.395893, 0.255714, 0.548215) | (0.194748, 0.170239, 0.300007) |
| w22 | 10110 | (0.265615, 0.422714, 0.422469) | (0.210858, 0.323993, 0.184623) |
| w23 | 10111 | (0.265963, 0.422647, 0.422579) | (0.203866, 0.340975, 0.169679) |
| w24 | 11000 | (0.607335, 0.414274, 1.318682) | (0.256523, 0.590763, 1.05169) |
| w25 | 11001 | (0.608128, 0.414556, 1.317504) | (0.257717, 0.26481, 1.174993) |
| W26 | 11010 | (0.379128, 0.984779, 0.980523) | (0.261225, 1.012739, 0.674888) |
| W27 | 11011 | (0.379543, 0.984573, 0.980104) | (0.25703, 1.182464, 0.265684) |
| W28 | 11100 | (0.395559, 0.2556, 0.548077) | (0.216832, 0.332364, 0.667351) |
| W29 | 11101 | (0.39586, 0.255662, 0.548226) | (0.211855, 0.229282, 0.712741) |
| W30 | 11110 | (0.265722, 0.422654, 0.422423) | (0.217293, 0.656085, 0.395602) |
| W31 | 11111 | (0.265937, 0.422655, 0.422468) | (0.212499, 0.722301, 0.249911) |

| wk | LSB bit labels (b3 b4 b5 b6 b7) | $R_c = \frac{2}{3}$, 12.7 dB, (x, y, z) | $R_c = \frac{3}{4}$, 13.95 dB, (x, y, z) |
|---|---|---|---|
| w0 | 00000 | (1.343305, 0.258839, 0.905613) | (1.101193, 0.287274, 1.166548) |
| w1 | 00001 | (1.653074, 0.297672, 0.298597) | (0.718369, 0.7336, 1.291105) |
| w2 | 00010 | (0.836679, 1.155234, 0.887482) | (0.909009, 1.182066, 0.828725) |
| w3 | 00011 | (0.846096, 1.355831, 0.285278) | (1.021304, 1.280747, 0.269414) |
| w4 | 00100 | (1.07458, 0.241858, 0.55583) | (1.278737, 0.233583, 0.692592) |
| w5 | 00101 | (1.133165, 0.248172, 0.190841) | (1.398787, 0.250328, 0.232729) |
| w6 | 00110 | (1.181242, 0.818235, 0.627621) | (1.206118, 0.722294, 0.708509) |
| w7 | 00111 | (1.149102, 0.804038, 0.189449) | (1.281864, 0.755211, 0.231533) |
| w8 | 01000 | (0.755465, 0.284716, 1.008276) | (0.672049, 0.212704, 0.996451) |
| w9 | 01001 | (0.888842, 0.419518, 1.423497) | (0.57653, 0.264725, 1.521955) |
| w10 | 01010 | (0.58939, 0.83449, 0.711894) | (0.630766, 0.937927, 0.623456) |
| w11 | 01011 | (0.548364, 1.014431, 0.219027) | (0.66374, 1.031859, 0.205958) |
| w12 | 01100 | (0.745729, 0.247254, 0.598898) | (0.819385, 0.191617, 0.604012) |
| w13 | 01101 | (0.766941, 0.239596, 0.172946) | (0.924414, 0.182819, 0.19408) |
| w14 | 01110 | (0.674978, 0.62609, 0.528374) | (0.769625, 0.575065, 0.558614) |
| w15 | 01111 | (0.675358, 0.667302, 0.180638) | (0.842053, 0.600778, 0.18191) |
| w16 | 10000 | (0.178402, 0.185285, 1.038702) | (0.178261, 0.535628, 0.900182) |
| w17 | 10001 | (0.25, 0.235426, 1.568714) | (0.231277, 0.796575, 1.271811) |
| w18 | 10010 | (0.261156, 1.33729, 0.878516) | (0.152399, 0.822021, 0.618383) |
| w19 | 10011 | (0.266087, 1.53472, 0.30611) | (0.154969, 0.961509, 0.192206) |
| w20 | 10100 | (0.183339, 0.149536, 0.573941) | (0.137965, 0.192885, 0.483028) |
| w21 | 10101 | (0.202492, 0.136486, 0.158969) | (0.153851, 0.157216, 0.14491) |
| w22 | 10110 | (0.130754, 0.380778, 0.465579) | (0.174913, 0.520994, 0.423138) |
| w23 | 10111 | (0.13933, 0.396971, 0.161478) | (0.177189, 0.551046, 0.142485) |
| w24 | 11000 | (0.306845, 0.446148, 1.017434) | (0.269912, 0.197038, 0.937937) |
| w25 | 11001 | (0.30214, 0.747504, 1.423036) | (0.185149, 0.241634, 1.348998) |
| W26 | 11010 | (0.205177, 0.839299, 0.735868) | (0.259272, 1.270761, 0.749748) |
| W27 | 11011 | (0.185724, 1.020661, 0.231692) | (0.292049, 1.408482, 0.251353) |
| W28 | 11100 | (0.427269, 0.195848, 0.575282) | (0.426855, 0.170853, 0.541078) |
| W29 | 11101 | (0.480322, 0.168181, 0.170142) | (0.513888, 0.14643, 0.160061) |
| W30 | 11110 | (0.26548, 0.542545, 0.503715) | (0.466208, 0.474992, 0.44874) |
| W31 | 11111 | (0.279242, 0.590904, 0.172853) | (0.500401, 0.489788, 0.15146) |

| wk | LSB bit labels (b3 b4 b5 b6 b7) | $R_c = \frac{5}{6}$, 15.45 dB, (x, y, z) |
|---|---|---|
| w0 | 00000 | (1.254297, 0.574474, 0.88026) |
| w1 | 00001 | (1.107652, 0.238669, 1.200131) |
| w2 | 00010 | (1.097414, 1.027282, 0.722321) |
| w3 | 00011 | (1.082096, 1.156092, 0.240388) |
| w4 | 00100 | (1.206207, 0.21086, 0.602033) |
| w5 | 00101 | (1.115324, 0.208099, 0.190236) |
| w6 | 00110 | (1.616343, 0.291166, 0.294612) |
| w7 | 00111 | (1.237262, 0.65891, 0.227076) |
| w8 | 01000 | (0.708095, 0.687441, 1.091113) |
| w9 | 01001 | (0.664762, 0.224974, 1.17923) |
| w10 | 01010 | (0.644694, 1.009005, 0.693976) |
| w11 | 01011 | (0.645408, 1.080649, 0.224736) |
| w12 | 01100 | (0.7952, 0.203153, 0.647895) |
| w13 | 01101 | (0.786624, 0.191832, 0.202889) |
| w14 | 01110 | (0.762702, 0.597428, 0.559978) |
| w15 | 01111 | (0.800746, 0.643386, 0.185824) |
| w16 | 10000 | (0.190358, 0.536088, 0.956684) |
| w17 | 10001 | (0.182646, 0.181316, 1.076609) |
| w18 | 10010 | (0.169994, 0.866658, 0.634329) |
| w19 | 10011 | (0.172607, 0.964935, 0.204401) |
| w20 | 10100 | (0.150012, 0.187426, 0.575888) |
| w21 | 10101 | (0.150265, 0.169281, 0.180211) |
| w22 | 10110 | (0.162646, 0.53328, 0.491695) |
| w23 | 10111 | (0.158286, 0.556568, 0.164049) |
| w24 | 11000 | (0.260503, 0.882538, 1.22795) |
| w25 | 11001 | (0.276665, 0.306865, 1.497888) |
| w26 | 11010 | (0.258308, 1.277101, 0.781922) |
| w27 | 11011 | (0.270741, 1.40421, 0.259311) |
| w28 | 11100 | (0.460927, 0.177792, 0.583242) |
| w29 | 11101 | (0.466486, 0.170962, 0.184284) |
| w30 | 11110 | (0.464564, 0.521728, 0.505695) |
| w31 | 11111 | (0.468916, 0.544605, 0.164798) |

Other 3-dimensional constellations (i.e. n=3) with NUC position vectors obtained by use of the above described approach (not using a symmetry approach) with M=4 resulting in a non-integer spectral efficiency (of 2*2/3≈1.33 per 2 dimensions) are defined as follows:

| wk | bit labels (b0 b1) | $R_c = \frac{1}{4}$, 1.1 dB, (x, y, z) | $R_c = \frac{1}{2}$, 5.25 dB, (x, y, z) |
|---|---|---|---|
| w0 | 00 | (0, 0.866025, 0.866025) | (0.341973, 0.732665, 0.91801) |
| w1 | 01 | (0, 0.866025, −0.86603) | (−0.04024, 0.896206, −0.83227) |
| w2 | 10 | (0, −0.86603, 0.866025) | (−0.63438, −0.76431, 0.713423) |
| w3 | 11 | (0, −0.86603, −0.86603) | (0.334075, −0.86322, −0.79958) |

| wk | bit labels (b0 b1) | $R_c = \frac{2}{3}$, 1.3 dB, (x, y, z) | $R_c = \frac{3}{4}$, 2.2 dB, (x, y, z) |
|---|---|---|---|
| w0 | 00 | (0.943009, 0.560703, 0.544745) | (0.349973, 0.944614, 0.675467) |
| w1 | 01 | (−0.54904, 0.974405, −0.49777) | (0.735879, 0.122954, −0.9589) |
| w2 | 10 | (−0.32303, −0.76353, 0.901148) | (−0.01644, −0.88366, 0.829) |
| w3 | 11 | (−0.06959, −0.77156, −0.94867) | (−1.06295, −0.18527, −0.55139) |

| wk | bit labels (b0 b1) | $R_c = \frac{5}{6}$, 3.35 dB, (x, y, z) |
|---|---|---|
| w0 | 00 | (−1.01648, 0.404423, 0.471229) |
| w1 | 01 | (0.725854, 0.939584, 0.117155) |
| w2 | 10 | (0.145172, −1.03649, 0.560528) |
| w3 | 11 | (0.140766, −0.29884, −1.13839) |

In another aspect of the present disclosure particular constellations are provided for particular target SNRs and code rates, which result in an integer value of the spectral efficiency. Said code rates are rate $R_c=1/4$ or $R_c=1/2$ or $R_c=2/3$ or $R_c=3/4$ or $R_c=5/6$. The constellation position vectors of the different constellations of the group of constellation, assuming sector symmetry, are defined as follows: for n=3 and M=64 (yielding spectral efficiency of 6*2/3=4.00 per 2 dimensions):

| wk | LSB bit labels (b3 b4 b5) | $R_c = \frac{1}{4}$, 2.1 dB, (x, y, z) | $R_c = \frac{1}{2}$, 6.2 dB (x, y, z) |
|---|---|---|---|
| w0 | 000 | (0.679463, 1.203006, 0.519483) | (0.596549, 1.352959, 0.388406) |
| w1 | 001 | (0.483813, 0.629873, 0.355243) | (0.397732, 0.604735, 0.238847) |
| w2 | 010 | (1.252423, 0.629854, 0.629855) | (1.423781, 0.547468, 0.547469) |

| wk | LSB bit labels (b3 b4 b5) | $R_c = \frac{1}{4}$, 2.1 dB, (x, y, z) | $R_c = \frac{1}{2}$, 6.2 dB (x, y, z) |
|---|---|---|---|
| w3 | 011 | (0.759524, 0.40977, 0.40977) | (0.784715, 0.306821, 0.306822) |
| w4 | 100 | (0.456715, 0.900064, 0.900059) | (0.379632, 1.038068, 1.038067) |
| w5 | 101 | (0.349874, 0.510669, 0.51067) | (0.248578, 0.424422, 0.424422) |
| w6 | 110 | (0.679462, 0.519486, 1.203008) | (0.596547, 0.388406, 1.352962) |
| w7 | 111 | (0.483813, 0.355244, 0.629877) | (0.397731, 0.238846, 0.604736) |

| wk | LSB bit labels (b3 b4 b5) | $R_c = \frac{2}{3}$, 8.8 dB, (x, y, z) | $R_c = \frac{3}{4}$, 10 dB, (x, y, z) |
|---|---|---|---|
| w0 | 000 | (0.37522, 0.535637, 1.329562) | (0.403465, 1.429603, 0.403469) |
| w1 | 001 | (0.585588, 1.369204, 0.585594) | (0.93451, 0.917081, 0.311174) |
| w2 | 010 | (1.046301, 0.382275, 1.046309) | (1.060679, 0.381871, 1.060697) |
| w3 | 011 | (1.329562, 0.535639, 0.375227) | (1.081152, 0.290324, 0.334489) |
| w4 | 100 | (0.214422, 0.399424, 0.691315) | (0.31117, 0.917076, 0.934521) |
| w5 | 101 | (0.309062, 0.906218, 0.30906) | (0.279161, 0.606528, 0.279155) |
| w6 | 110 | (0.363725, 0.212822, 0.363724) | (0.334483, 0.29031, 1.081104) |
| w7 | 111 | (0.691321, 0.399426, 0.214424) | (0.352778, 0.205563, 0.352752) |

| wk | LSB bit labels (b3 b4 b5) | $R_c = \frac{5}{6}$, 11.35 dB, (x, y, z) |
|---|---|---|
| w0 | 000 | (1.054178, 1.043246, 0.431268) |
| w1 | 001 | (0.373323, 1.37404, 0.341879) |
| w2 | 010 | (1.073002, 0.372189, 0.909371) |
| w3 | 011 | (0.952138, 0.27332, 0.278175) |
| w4 | 100 | (0.370565, 0.907662, 1.044718) |
| w5 | 101 | (0.277451, 0.740438, 0.314124) |
| w6 | 110 | (0.341752, 0.278121, 1.025684) |
| w7 | 111 | (0.308638, 0.239727, 0.33157) | for n=4 and M=4 (yielding spectral efficiency of 2*2/4=1.00 per 2 dimensions):

| wk | bit labels (b0 b1) | $R_c = \frac{1}{4}$, −4.25 dB, (x, y, z) | $R_c = \frac{1}{2}$, −0.85 dB, (x, y, z) |
|---|---|---|---|
| w0 | 00 | (0, 0.866025, 0.866025) | (0.341973, 0.732665, 0.91801) |
| w1 | 01 | (0, 0.866025, −0.86603) | (−0.04024, 0.896206, −0.83227) |
| w2 | 10 | (0, −0.86603, 0.866025) | (−0.63438, −0.76431, 0.713423) |
| w3 | 11 | (0, −0.86603, −0.86603) | (0.334075, −0.86322, −0.79958) |

| wk | bit labels (b0 b1) | $R_c = \frac{2}{3}$, 1.3 dB, (x, y, z) | $R_c = \frac{3}{4}$, 2.2 dB, (x, y, z) |
|---|---|---|---|
| w0 | 00 | (0.943009, 0.560703, 0.544745) | (0.349973, 0.944614, 0.675467) |
| w1 | 01 | (−0.54904, 0.974405, −0.49777) | (0.735879, 0.122954, −0.9589) |
| w2 | 10 | (−0.32303, −0.76353, 0.901148) | (−0.01644, −0.88366, 0.829) |
| w3 | 11 | (−0.06959, −0.77156, −0.94867) | (−1.06295, −0.18527, −0.55139) |

| wk | bit labels (b0 b1) | $R_c = \frac{5}{6}$, 3.35 dB, (x, y, z) |
|---|---|---|
| w0 | 00 | (−1.01648, 0.404423, 0.471229) |
| w1 | 01 | (0.725854, 0.939584, 0.117155) |
| w2 | 10 | (0.145172, −1.03649, 0.560528) |
| w3 | 11 | (0.140766, −0.29884, −1.13839) | for n=4 and M=64: (yielding spectral efficiency of 6*2/4=3.00 per 2 dimensions):

| wk | LSB bit labels (b4 b5) | $R_c = \frac{1}{4}$, 0.6 dB, (x, y, z, w) | $R_c = \frac{1}{2}$, 4.7 dB, (x, y, z, w) |
|---|---|---|---|
| w0 | 00 | (0.707102, 0.707102, 0.707101, 0.707101) | (0.594667, 1.342751, 0.5791, 0.579096) |
| w1 | 01 | (0.707102, 0.707102, 0.707101, 0.707102) | (0.594666, 0.522325, 1.200416, 0.386329) |
| w2 | 10 | (0.707101, 0.707102, 0.707102, 0.707101) | (0.594668, 0.522324, 0.386331, 1.200417) |
| w3 | 11 | (0.707102, 0.707101, 0.707102, 0.707102) | (0.5947, 0.260823, 0.394221, 0.394225) |

| wk | LSB bit labels (b4 b5) | $R_c = \frac{2}{3}$, 7.1 dB, (x, y, z, w) | $R_c = \frac{3}{4}$, 8.15 dB, (x, y, z, w) |
|---|---|---|---|
| w0 | 00 | (0.533719, 0.551776, 0.533618, 1.335255) | (0.415131, 0.47307, 0.473059, 1.174576) |
| w1 | 01 | (0.438941, 0.552091, 1.247518, 0.521329) | (0.473129, 0.415164, 1.174585, 0.473076) |
| w2 | 10 | (1.248209, 0.551665, 0.438372, 0.521793) | (0.473159, 1.174799, 0.415194, 0.473154) |
| w3 | 11 | (0.379345, 0.551627, 0.379809, 0.286494) | (1.174858, 0.473175, 0.473155, 0.415242) |

| wk | LSB bit labels (b4 b5) | $R_c = \frac{5}{6}$, 9.45 dB, (x, y, z, w) |
|---|---|---|
| w0 | 00 | (0.429225, 0.468636, 0.468558, 1.17263) |
| w1 | 01 | (0.468498, 0.429212, 1.172329, 0.468549) |
| w2 | 10 | (0.468597, 1.172764, 0.429245, 0.46863) |
| w3 | 11 | (1.172465, 0.468608, 0.468507, 0.429221) | for n=4 and M=256: (yielding spectral efficiency of 8*2/4=4.00 per 2 dimensions):

| wk | LSB bit labels (b4 b5 b6 b7) | $R_c = \frac{1}{4}$, 2.1 dB, (x, y, z, w) |
|---|---|---|
| w0 | 0000 | (0.853533, 0.853537, 0.435223, 0.853537) |
| w1 | 0001 | (1.388052, 0.570334, 0.570341, 0.570343) |
| w2 | 0010 | (0.535491, 0.53549, 0.326029, 0.535488) |
| w3 | 0011 | (0.770557, 0.406253, 0.406253, 0.406253) |
| w4 | 0100 | (0.570336, 0.57034, 0.570337, 1.388053) |
| w5 | 0101 | (0.853532, 0.435221, 0.853528, 0.853543) |
| w6 | 0110 | (0.406254, 0.406255, 0.406251, 0.770546) |
| w7 | 0111 | (0.535493, 0.32603, 0.535484, 0.535491) |
| w8 | 1000 | (0.570338, 1.388054, 0.570346, 0.570339) |
| w9 | 1001 | (0.853534, 0.853532, 0.853551, 0.435225) |
| w10 | 1010 | (0.406255, 0.770554, 0.406256, 0.406249) |
| w11 | 1011 | (0.535492, 0.53549, 0.535495, 0.326031) |
| w12 | 1100 | (0.435219, 0.853539, 0.85354, 0.853534) |
| w13 | 1101 | (0.570339, 0.570338, 1.388047, 0.570341) |
| w14 | 1110 | (0.32603, 0.535493, 0.535491, 0.535485) |
| w15 | 1111 | (0.406255, 0.406253, 0.770551, 0.406251) |

| wk | LSB bit labels (b4 b5 b6 b7) | $R_c = \frac{1}{2}$, 4.7 dB, (x, y, z, w) |
|---|---|---|
| w0 | 0000 | (1.526509, 0.402616, 0.631195, 0.631197) |
| w1 | 0001 | (0.602165, 0.480207, 1.520122, 0.438092) |
| w2 | 0010 | (1.25358, 1.046597, 0.444948, 0.444947) |
| w3 | 0011 | (0.552189, 1.201405, 1.024307, 0.313877) |
| w4 | 0100 | (0.942978, 0.243165, 0.411336, 0.411336) |
| w5 | 0101 | (0.429351, 0.270441, 0.879771, 0.304775) |
| w6 | 0110 | (0.752996, 0.432847, 0.287963, 0.28796) |
| w7 | 0111 | (0.376248, 0.491436, 0.538473, 0.221183) |
| w8 | 1000 | (0.602165, 0.48021, 0.438083, 1.520119) |
| w9 | 1001 | (0.400875, 0.468866, 1.189484, 1.189495) |
| w10 | 1010 | (0.55219, 1.201411, 0.313874, 1.024294) |
| w11 | 1011 | (0.300813, 1.415048, 0.466125, 0.466122) |
| w12 | 1100 | (0.42935, 0.270442, 0.304772, 0.879768) |
| w13 | 1101 | (0.266249, 0.279379, 0.63154, 0.631546) |
| w14 | 1110 | (0.376246, 0.491438, 0.221183, 0.538465) |
| w15 | 1111 | (0.22888, 0.552601, 0.354481, 0.35448) |

| wk | LSB bit labels (b4 b5 b6 b7) | $R_c = \frac{2}{3}$, 8.8 dB, (x, y, z, w) |
|---|---|---|
| w0 | 0000 | (1.018943, 0.365858, 1.199467, 0.481008) |
| w1 | 0001 | (0.331868, 0.361354, 1.310964, 0.283197) |
| w2 | 0010 | (1.558783, 0.459499, 0.486589, 0.463096) |
| w3 | 0011 | (1.10882, 1.198092, 0.44343, 0.399275) |
| w4 | 0100 | (0.685157, 0.196292, 0.575696, 0.442069) |
| w5 | 0101 | (0.332449, 0.279754, 0.526833, 0.246807) |
| w6 | 0110 | (1.003474, 0.302379, 0.281231, 0.436793) |
| w7 | 0111 | (0.676872, 0.666776, 0.261086, 0.255449) |
| w8 | 1000 | (0.396496, 0.465471, 1.097731, 1.183561) |
| w9 | 1001 | (0.330053, 1.038928, 1.168812, 0.447361) |
| w10 | 1010 | (0.439683, 1.062086, 0.441272, 1.301175) |
| w11 | 1011 | (0.371102, 1.447116, 0.450685, 0.467416) |
| w12 | 1100 | (0.282082, 0.246055, 0.399926, 0.957503) |
| w13 | 1101 | (0.170056, 0.386611, 0.345374, 0.425569) |
| w14 | 1110 | (0.776315, 0.39265, 0.276701, 1.241973) |
| w15 | 1111 | (0.268557, 0.861542, 0.245954, 0.354217) |

| wk | LSB bit labels (b4 b5 b6 b7) | $R_c = \frac{3}{4}$, 4.7 dB, (x, y, z, w) |
|---|---|---|
| w0 | 0000 | (1.177296, 1.1958, 0.498387, 0.389436) |
| w1 | 0001 | (1.493578, 0.394827, 0.380252, 0.355904) |
| w2 | 0010 | (0.869675, 0.903371, 0.298536, 0.906957) |
| w3 | 0011 | (0.764504, 0.533695, 0.24056, 0.280397) |
| w4 | 0100 | (1.035942, 0.403318, 1.013009, 0.971103) |
| w5 | 0101 | (0.972427, 0.325647, 0.998656, 0.300178) |
| w6 | 0110 | (0.80859, 0.29903, 0.327672, 1.144447) |
| w7 | 0111 | (0.649232, 0.205051, 0.350469, 0.357187) |
| w8 | 1000 | (0.3932, 1.544683, 0.41033, 0.388835) |
| w9 | 1001 | (0.348383, 1.035569, 1.060365, 0.330446) |
| w10 | 1010 | (0.271132, 0.997977, 0.349517, 0.907452) |
| w11 | 1011 | (0.236576, 0.713614, 0.327883, 0.278331) |

-continued

| wk | LSB bit labels (b4 b5 b6 b7) | $R_c = \frac{3}{4}$, 4.7 dB, (x, y, z, w) |
|---|---|---|
| w12 | 1100 | (0.319746, 0.398194, 1.126819, 1.073599) |
| w13 | 1101 | (0.309596, 0.330431, 1.191466, 0.335021) |
| w14 | 1110 | (0.228413, 0.325633, 0.370927, 1.102348) |
| w15 | 1111 | (0.203443, 0.239249, 0.425946, 0.367032) |

| wk | LSB bit labels (b4 b5 b6 b7) | $R_c = \frac{5}{6}$, 11.35 dB, (x, y, z, w) |
|---|---|---|
| w0 | 0000 | (1.077284, 0.957874, 1.034832, 0.441819) |
| w1 | 0001 | (0.412758, 0.398613, 1.528827, 0.375586) |
| w2 | 0010 | (1.076567, 1.07177, 0.324415, 0.428991) |
| w3 | 0011 | (1.514688, 0.385762, 0.382328, 0.357945) |
| w4 | 0100 | (0.414877, 0.390574, 0.394515, 1.572725) |
| w5 | 0101 | (0.822358, 0.246758, 0.917809, 0.321732) |
| w6 | 0110 | (0.963923, 0.374594, 0.335966, 1.001772) |
| w7 | 0111 | (0.864815, 0.291169, 0.284467, 0.299176) |
| w8 | 1000 | (0.400077, 0.935313, 0.975085, 0.955456) |
| w9 | 1001 | (0.281655, 0.906792, 0.941819, 0.290489) |
| w10 | 1010 | (0.384193, 1.120022, 0.3108, 0.875174) |
| w11 | 1011 | (0.294389, 1.020099, 0.302111, 0.266808) |
| w12 | 1100 | (0.305856, 0.294713, 0.824631, 0.992838) |
| w13 | 1101 | (0.25481, 0.285898, 0.751643, 0.298045) |
| w14 | 1110 | (0.289067, 0.356851, 0.238692, 0.822132) |
| w15 | 1111 | (0.294154, 0.340578, 0.244513, 0.277487) |

In addition, not only a constellation from the above described constellations may be selected and used by the modulator and the demodulator, but also a transformed version of such an n-dimensional constellation of said group of constellations may be selected and used. Such a transformed version may be obtained from anyone of said constellations through a transformation including a rotation by an angle around the origin, an inversion of bit labels for all constellation points, an interchanging of bit positions and/or a predistortion for the constellation points.

In summary, the new multi-dimensional NUCs are designed for practical usage with particular LDPC codes. Further, those n-dimensional NUCs, offering non-spectral efficiencies allow for more flexibility. A communication system, in which only a small amount of channel codes is used (for complexity reasons), shall be considered. Conventionally, different overall spectral efficiencies can be obtained by combining conventional 2D NUCs or regular QAMs (allowing (uncoded) spectral efficiencies of 1 (BPSK), 2 (QPSK), 3 (8QAM), 4 (16QAM), 5, . . . , i.e., integer values) with the code rates of the channel codes. For instance, code rate 1/2 with 16QAM results in a (coded, i.e., overall) spectral efficiency of 4*1/2=2. The flexibility of the system is basically determined by combination of all code rates with all uncoded spectral efficiencies. Newly proposed m-dimensional NUCs with non-integer (uncoded) spectral efficiencies offer further combination possibilities.

Obviously, numerous modifications and variations of the present disclosure are possible in light of the above teachings. It is therefore to be understood that within the scope of the appended claims, the disclosure may be practiced otherwise than as specifically described herein (e.g., if the NUC position vectors are rounded to a smaller number of digits).

It should also be noted that one or more of the following "invariant transformations" do not affect the properties of the n-dimensional constellations:
1. rotation of all symbols by an arbitrary angle φ in an arbitrary orientation,
2. inversion of m-th bit $y\_m = b \in \{0,1\}$ to $y\_m = \bar{b}$, where the bar indicates inversion,
3. interchanging of bit positions $y\_k1$ and $y\_k2$,
4. reflection on one more (n−1)-dimensional hyperplanes,
5. predistortion, e.g. to compensate for channel distortions.

Thus, the modulator may also use a non-uniform constellation obtained from a constellation through rotation by an angle around the origin, an inversion of bit labels for all constellation points, an interchanging of bit positions for all constellation points and/or a reflection on one more (n−1)-dimensional hyperplanes. For instance, if one constellation point has bit labels 0010 for 16-QAM, all first bit labels can be inverted such that this point becomes 1010. Further, constellation obtained through any other trivial manipulation, such as rounding of the constellation points' positions (i.e. rounding the values given in the above tables for the values of w to less than the given six digits) shall generally be covered by the claims. Through one or more of these operations an equivalent mapping to the mapping of the constellations defined in the above mentioned groups is achieved.

In the claims, the word "comprising" does not exclude other elements or steps, and the indefinite article "a" or "an" does not exclude a plurality. A single element or other unit may fulfill the functions of several items recited in the claims. The mere fact that certain measures are recited in mutually different dependent claims does not indicate that a combination of these measures cannot be used to advantage.

In so far as embodiments of the disclosure have been described as being implemented, at least in part, by software-controlled data processing apparatus, it will be appreciated that a non-transitory machine-readable medium carrying such software, such as an optical disk, a magnetic disk, semiconductor memory or the like, is also considered to represent an embodiment of the present disclosure. Further, such a software may also be distributed in other forms, such as via the Internet or other wired or wireless telecommunication systems.

A circuit that may be used for implementing one or more of the elements of the claimed apparatus is a structural assemblage of electronic components including conventional circuit elements, integrated circuits including application specific integrated circuits, standard integrated circuits, application specific standard products, and field programmable gate arrays. Further a circuit includes central processing units, graphics processing units, and microprocessors which are programmed or configured according to software code. A circuit does not include pure software, although a circuit includes the above-described hardware executing software.

Any reference signs in the claims should not be construed as limiting the scope.

It follows a list of further embodiments.
1. A coding and modulation apparatus comprising
an encoder (11) configured to encode input data into cell words, and
a modulator (12) configured to modulate said cell words into constellation values of a non-uniform constellation and to assign bit combinations to constellation values of the used non-uniform constellation,
wherein said modulator (12) is configured to use, based on the total number M of constellation points of the constellation, the signal-to-noise ratio SNR and the number n of the dimension of the constellation, an n-dimensional non-uniform constellation from a group of constellations, wherein each constellation point of an n-dimensional constellation diagram is defined by an n-tupel of constellation values, said n-tupel of constellation values defining parameter settings of a transmission parameter used by a transmission apparatus for transmitting a transmission stream obtained by conversion of said constellation values, and
wherein said modulator is configured to use a constellation having a total number M of constellation points of the constellation and a number n of the dimension of the constellation which fulfill the condition that log 2(M)/n*2 is a non-integer number.

2. The coding and modulation apparatus as defined in embodiment 1,
wherein said n-tupel of constellation values defines real values or imaginary values or a combination of real values and imaginary values of n' subcarriers at n' different frequencies or frequency ranges, n' symbols in one or more of time, space, different polarization, encoded by different codes, encoded by different orbital momentum, encoded by different wavelengths, or encoded by any other, preferably orthogonal dimension used for transmitting the transmission stream, wherein n' is an integer equal to or less than n.

3. The coding and modulation apparatus as defined in any preceding embodiment,
wherein said n-tupel of constellation values defines n different symbols coded in time, frequency, space, wavelengths, polarizations and/or spreading codes used for transmitting the transmission stream.

4. The coding and modulation apparatus as defined in any preceding embodiment,
wherein n=3 with M=4 or M=16 or M=32 or M=128 or M=256.

5. The coding and modulation apparatus as defined in any preceding embodiment,
wherein the constellation points of a 0-th sector of the n-dimensional constellation diagram are defined by a constellation position vector $w_{0\ldots p-1}$, wherein $p=M/(2^n)$ and wherein the constellation points of the other sectors of the n-dimensional constellation diagram are obtained from the constellation position vector $w_{0\ldots p-1}$ by symmetry from the constellation points of the 0-th sector by inverting the components from those dimensions, where the corresponding bit is a 1.

6. The coding and modulation apparatus as defined in embodiment 5,
wherein n=3 and wherein
the constellation points of a zeroth sector are defined as $w_{0\ldots p-1}=(x_{0\ldots p-1}, y_{0\ldots p-1}, z_{0\ldots p-1})$,
the constellation points of a first sector are defined as $w_{p\ldots 2p-1}=(x_{0\ldots p-1}, y_{0\ldots p-1}, -z_{0\ldots p-1})$,
the constellation points of a second sector are defined as $w_{2p\ldots 3p-1}=(x_{0\ldots p-1}, -y_{0\ldots p-1}, z_{0\ldots p-1})$,
the constellation points of a third sector are defined as $w_{3p\ldots 4p-1}=(x_{0\ldots p-1}, -y_{0\ldots p-1}, -z_{0\ldots p-1})_p$,
the constellation points of a fourth sector are defined as $w_{4p\ldots 5p-1}=(-x_{0\ldots p-1}, y_{0\ldots p-1}, z_{0\ldots p-1})$,
the constellation points of a fifth sector are defined as $w_{5p\ldots 6p-1}=(-x_{0\ldots p-1}, y_{0\ldots p-1}, -z_{0\ldots p-1})$
the constellation points of a sixth sector are defined as $w_{6p\ldots 7p-1}=(-x_{0\ldots p-1}, -y_{0\ldots p-1}, z_{0\ldots p-1})$
the constellation points of a seventh sector are defined as $w_{7p\ldots 8p-1}=(-x_{0\ldots p-1}, -y_{0\ldots p-1}, -z_{0\ldots p-1})$.

7. The coding and modulation apparatus as defined in embodiment 6,
wherein the constellation position vectors of the different constellations of the group of constellations are defined as follows:
for M=16:

| wk | LSB bit label | $R_c = \frac{1}{4}$, −0.6 dB, (x, y, z) | $R_c = \frac{1}{2}$, 3.7 dB, (x, y, z) |
|---|---|---|---|
| w0 | 0 | (0.691896, 0.691896, 0.691896) | (0.632425, 1.084, 0.632421) |
| w1 | 1 | (0.691896, 0.691896, 0.691896) | (0.632407, 0.326843, 0.63241) |

| wk | LSB bit label (b3) | $R_c = \frac{2}{3}$, 6.15 dB, (x, y, z) | $R_c = \frac{3}{4}$, 7.2 dB, (x, y, z) |
|---|---|---|---|
| w0 | 0 | (1.188087, 0.609156, 0.609156) | (1.220012, 0.589151, 0.589151) |
| w1 | 1 | (0.322326, 0.609156, 0.609156) | (0.350927, 0.589151, 0.589151) |

| wk | LSB bit label (b3) | $R_c = \frac{2}{3}$, 6.15 dB, (x, y, z) |
|---|---|---|
| w0 | 0 | (1.188087, 0.609156, 0.609156) |
| w1 | 1 | (0.322326, 0.609156, 0.609156) | for M=32:

| wk | LSB bit labels (b3 b4) | $R_c = \frac{1}{4}$, 1.1 dB, (x, y, z) | $R_c = \frac{1}{2}$, 5.25 dB, (x, y, z) |
|---|---|---|---|
| w0 | 00 | (0.690335, 0.690336, 0.690336) | (0.370608, 1.147041, 0.497338) |
| w1 | 01 | (0.690335, 0.690336, 0.690335) | (0.372189, 0.372195, 0.247177) |
| w2 | 10 | (0.690335, 0.690335, 0.690335) | (0.548205, 0.548173, 1.27875) |
| w3 | 11 | (0.690335, 0.690335, 0.690334) | (1.147088, 0.370576, 0.497294) |

| wk | LSB bit labels (b3 b4) | $R_c = \frac{2}{3}$, 7.75 dB, (x, y, z) | $R_c = \frac{3}{4}$, 8.9 dB, (x, y, z) |
|---|---|---|---|
| w0 | 00 | (0.414674, 0.490757, 1.175376) | (1.248342, 0.488399, 0.488399) |
| w1 | 01 | (0.500684, 1.256404, 0.500684) | (0.482637, 1.17234, 0.425703) |
| w2 | 10 | (0.357577, 0.272802, 0.357576) | (0.482637, 0.425703, 1.17234) |
| w3 | 11 | (1.175374, 0.490758, 0.414674) | (0.303138, 0.358435, 0.358435) |

| wk | LSB bit labels (b3 b4) | $R_c = \frac{5}{6}$, 10.15 dB, (x, y, z) |
|---|---|---|
| w0 | 00 | (0.436652, 0.477235, 1.175916) |
| w1 | 01 | (0.480841, 1.248777, 0.480841) |
| w2 | 10 | (0.364177, 0.331963, 0.364178) |
| w3 | 11 | (1.175911, 0.477235, 0.436653) | for M=256:

| wk | LSB bit labels (b3 b4 b5 b6 b7) | $R_c = \frac{1}{4}$, 4.6 dB, (x, y, z) | $R_c = \frac{1}{2}$, 9.5 dB, (x, y, z) |
|---|---|---|---|
| w0 | 00000 | (1.391424, 0.537778, 0.536699) | (1.429432, 0.398163, 0.927245) |
| w1 | 00001 | (1.390368, 0.53776, 0.537333) | (1.553649, 0.312171, 0.327864) |
| w2 | 00010 | (0.608379, 1.315757, 0.412757) | (1.127692, 1.137604, 0.822847) |
| w3 | 00011 | (0.609175, 1.315156, 0.412931) | (1.313641, 0.934611, 0.244387) |
| w4 | 00100 | (0.702969, 0.303528, 0.304283) | (0.773495, 0.185767, 0.31605) |
| w5 | 00101 | (0.703317, 0.303579, 0.304548) | (0.893113, 0.186002, 0.277308) |
| w6 | 00110 | (0.395919, 0.545612, 0.255704) | (0.688697, 0.357194, 0.194211) |
| w7 | 00111 | (0.395947, 0.545685, 0.255618) | (0.761811, 0.394269, 0.169599) |
| w8 | 01000 | (1.392334, 0.536933, 0.537948) | (0.863643, 0.428832, 1.004159) |
| w9 | 01001 | (1.391339, 0.537016, 0.538445) | (0.761645, 0.242249, 1.077306) |
| w10 | 01010 | (0.607268, 1.317332, 0.412865) | (0.756257, 0.933359, 0.614396) |
| w11 | 01011 | (0.608062, 1.316804, 0.41305) | (0.785824, 1.063219, 0.244593) |
| w12 | 01100 | (0.702795, 0.30336, 0.304291) | (0.674993, 0.296755, 0.638794) |
| w13 | 01101 | (0.703002, 0.303506, 0.304534) | (0.67095, 0.226702, 0.655424) |
| w14 | 01110 | (0.395779, 0.545624, 0.255644) | (0.616528, 0.621249, 0.381863) |
| w15 | 01111 | (0.395944, 0.545692, 0.255667) | (0.641013, 0.678244, 0.246624) |
| w16 | 10000 | (0.606175, 0.414212, 1.318067) | (0.354854, 0.938384, 1.458798) |
| w17 | 10001 | (0.607041, 0.414525, 1.317058) | (0.352171, 0.333193, 1.728259) |
| w18 | 10010 | (0.37928, 0.983804, 0.980257) | (0.355957, 1.396462, 0.985833) |
| w19 | 10011 | (0.379604, 0.983615, 0.980005) | (0.361284, 1.701687, 0.341124) |
| w20 | 10100 | (0.395741, 0.255653, 0.548129) | (0.203506, 0.176026, 0.303222) |
| w21 | 10101 | (0.395893, 0.255714, 0.548215) | (0.194748, 0.170239, 0.300007) |
| w22 | 10110 | (0.265615, 0.422714, 0.422469) | (0.210858, 0.323993, 0.184623) |
| w23 | 10111 | (0.265963, 0.422647, 0.422579) | (0.203866, 0.340975, 0.169679) |
| w24 | 11000 | (0.607335, 0.414274, 1.318682) | (0.256523, 0.590763, 1.05169) |
| w25 | 11001 | (0.608128, 0.414556, 1.317504) | (0.257717, 0.26481, 1.174993) |
| W26 | 11010 | (0.379128, 0.984779, 0.980523) | (0.261225, 1.012739, 0.674888) |
| W27 | 11011 | (0.379543, 0.984573, 0.980104) | (0.25703, 1.182464, 0.265684) |
| W28 | 11100 | (0.395559, 0.2556, 0.548077) | (0.216832, 0.332364, 0.667351) |
| W29 | 11101 | (0.39586, 0.255662, 0.548226) | (0.211855, 0.229282, 0.712741) |
| W30 | 11110 | (0.265722, 0.422654, 0.422423) | (0.217293, 0.656085, 0.395602) |
| W31 | 11111 | (0.265937, 0.422655, 0.422468) | (0.212499, 0.722301, 0.249911) |

| wk | LSB bit labels (b3 b4 b5 b6 b7) | $R_c = \frac{2}{3}$, 12.7 dB, (x, y, z) | $R_c = \frac{3}{4}$, 13.95 dB, (x, y, z) |
|---|---|---|---|
| w0 | 00000 | (1.343305, 0.258839, 0.905613) | (1.101193, 0.287274, 1.166548) |
| w1 | 00001 | (1.653074, 0.297672, 0.298597) | (0.718369, 0.7336, 1.291105) |
| w2 | 00010 | (0.836679, 1.155234, 0.887482) | (0.909009, 1.182066, 0.828725) |
| w3 | 00011 | (0.846096, 1.355831, 0.285278) | (1.021304, 1.280747, 0.269414) |
| w4 | 00100 | (1.07458, 0.241858, 0.55583) | (1.278737, 0.233583, 0.692592) |
| w5 | 00101 | (1.133165, 0.248172, 0.190841) | (1.398787, 0.250328, 0.232729) |
| w6 | 00110 | (1.181242, 0.818235, 0.627621) | (1.206118, 0.722294, 0.708509) |
| w7 | 00111 | (1.149102, 0.804038, 0.189449) | (1.281864, 0.755211, 0.231533) |
| w8 | 01000 | (0.755465, 0.284716, 1.008276) | (0.672049, 0.212704, 0.996451) |
| w9 | 01001 | (0.888842, 0.419518, 1.423497) | (0.57653, 0.264725, 1.521955) |
| w10 | 01010 | (0.58939, 0.83449, 0.711894) | (0.630766, 0.937927, 0.623456) |
| w11 | 01011 | (0.548364, 1.014431, 0.219027) | (0.66374, 1.031859, 0.205958) |

-continued

| wk | LSB bit labels (b3 b4 b5 b6 b7) | $R_c = \frac{2}{3}$, 12.7 dB, (x, y, z) | $R_c = \frac{3}{4}$, 13.95 dB, (x, y, z) |
|---|---|---|---|
| w12 | 01100 | (0.745729, 0.247254, 0.598898) | (0.819385, 0.191617, 0.604012) |
| w13 | 01101 | (0.766941, 0.239596, 0.172946) | (0.924414, 0.182819, 0.19408) |
| w14 | 01110 | (0.674978, 0.62609, 0.528374) | (0.769625, 0.575065, 0.558614) |
| w15 | 01111 | (0.675358, 0.667302, 0.180638) | (0.842053, 0.600778, 0.18191) |
| w16 | 10000 | (0.178402, 0.185285, 1.038702) | (0.178261, 0.535628, 0.900182) |
| w17 | 10001 | (0.25, 0.235426, 1.568714) | (0.231277, 0.796575, 1.271811) |
| w18 | 10010 | (0.261156, 1.33729, 0.878516) | (0.152399, 0.822021, 0.618383) |
| w19 | 10011 | (0.266087, 1.53472, 0.30611) | (0.154969, 0.961509, 0.192206) |
| w20 | 10100 | (0.183339, 0.149536, 0.573941) | (0.137965, 0.192885, 0.483028) |
| w21 | 10101 | (0.202492, 0.136486, 0.158969) | (0.153851, 0.157216, 0.14491) |
| w22 | 10110 | (0.130754, 0.380778, 0.465579) | (0.174913, 0.520994, 0.423138) |
| w23 | 10111 | (0.13933, 0.396971, 0.161478) | (0.177189, 0.551046, 0.142485) |
| w24 | 11000 | (0.306845, 0.446148, 1.017434) | (0.269912, 0.197038, 0.937937) |
| w25 | 11001 | (0.30214, 0.747504, 1.423036) | (0.185149, 0.241634, 1.348998) |
| W26 | 11010 | (0.205177, 0.839299, 0.735868) | (0.259272, 1.270761, 0.749748) |
| W27 | 11011 | (0.185724, 1.020661, 0.231692) | (0.292049, 1.408482, 0.251353) |
| W28 | 11100 | (0.427269, 0.195848, 0.575282) | (0.426855, 0.170853, 0.541078) |
| W29 | 11101 | (0.480322, 0.168181, 0.170142) | (0.513888, 0.14643, 0.160061) |
| W30 | 11110 | (0.26548, 0.542545, 0.503715) | (0.466208, 0.474992, 0.44874) |
| W31 | 11111 | (0.279242, 0.590904, 0.172853) | (0.500401, 0.489788, 0.15146) |

| wk | LSB bit labels (b3 b4 b5 b6 b7) | $R_c = \frac{5}{6}$, 15.45 dB, (x, y, z) |
|---|---|---|
| w0 | 00000 | (1.254297, 0.574474, 0.88026) |
| w1 | 00001 | (1.107652, 0.238669, 1.200131) |
| w2 | 00010 | (1.097414, 1.027282, 0.722321) |
| w3 | 00011 | (1.082096, 1.156092, 0.240388) |
| w4 | 00100 | (1.206207, 0.21086, 0.602033) |
| w5 | 00101 | (1.115324, 0.208099, 0.190236) |
| w6 | 00110 | (1.616343, 0.291166, 0.294612) |
| w7 | 00111 | (1.237262, 0.65891, 0.227076) |
| w8 | 01000 | (0.708095, 0.687441, 1.091113) |
| w9 | 01001 | (0.664762, 0.224974, 1.17923) |
| w10 | 01010 | (0.644694, 1.009005, 0.693976) |
| w11 | 01011 | (0.645408, 1.080649, 0.224736) |
| w12 | 01100 | (0.7952, 0.203153, 0.647895) |
| w13 | 01101 | (0.786624, 0.191832, 0.202889) |
| w14 | 01110 | (0.762702, 0.597428, 0.559978) |
| w15 | 01111 | (0.800746, 0.643386, 0.185824) |
| w16 | 10000 | (0.190358, 0.536088, 0.956684) |
| w17 | 10001 | (0.182646, 0.181316, 1.076609) |
| w18 | 10010 | (0.169994, 0.866658, 0.634329) |
| w19 | 10011 | (0.172607, 0.964935, 0.204401) |
| w20 | 10100 | (0.150012, 0.187426, 0.575888) |
| w21 | 10101 | (0.150265, 0.169281, 0.180211) |
| w22 | 10110 | (0.162646, 0.53328, 0.491695) |
| w23 | 10111 | (0.158286, 0.556568, 0.164049) |
| w24 | 11000 | (0.260503, 0.882538, 1.22795) |
| w25 | 11001 | (0.276665, 0.306865, 1.497888) |
| W26 | 11010 | (0.258308, 1.277101, 0.781922) |
| W27 | 11011 | (0.270741, 1.40421, 0.259311) |
| W28 | 11100 | (0.460927, 0.177792, 0.583242) |
| W29 | 11101 | (0.466486, 0.170962, 0.184284) |
| W30 | 11110 | (0.464564, 0.521728, 0.505695) |
| W31 | 11111 | (0.468916, 0.544605, 0.164798) | or are defined by a transformed version of a constellation from said group of constellations, wherein a transformed version of a non-uniform constellation is obtained from anyone of said constellations through a transformation including a rotation by an angle around the origin, an inversion of bit labels for all constellation points, an interchanging of bit positions and/or a predistortion for the constellation points.

8. The coding and modulation apparatus as defined in any preceding embodiment,
wherein n=3 and M=4 and wherein the constellation position vectors of the different constellations of the group of constellations are defined as follows:

| wk | bit labels (b0 b1) | $R_c = \frac{1}{4}$, 1.1 dB, (x, y, z) | $R_c = \frac{1}{2}$, 5.25 dB, (x, y, z) |
|---|---|---|---|
| w0 | 00 | (0, 0.866025, 0.866025) | (0.341973, 0.732665, 0.91801) |
| w1 | 01 | (0, 0.866025, −0.86603) | (−0.04024, 0.896206, −0.83227) |
| w2 | 10 | (0, −0.86603, 0.866025) | (−0.63438, −0.76431, 0.713423) |
| w3 | 11 | (0, −0.86603, −0.86603) | (0.334075, −0.86322, −0.79958) |

| wk | bit labels (b0 b1) | $R_c = \frac{2}{3}$, 1.3 dB, (x, y, z) | $R_c = \frac{3}{4}$, 2.2 dB, (x, y, z) |
|---|---|---|---|
| w0 | 00 | (0.943009, 0.560703, 0.544745) | (0.349973, 0.944614, 0.675467) |
| w1 | 01 | (−0.54904, 0.974405, −0.49777) | (0.735879, 0.122954, −0.9589) |
| w2 | 10 | (−0.32303, −0.76353, 0.901148) | (−0.01644, −0.88366, 0.829) |
| w3 | 11 | (−0.06959, −0.77156, −0.94867) | (−1.06295, −0.18527, −0.55139) |

| wk | bit labels (b0 b1) | $R_c = \frac{5}{6}$, 3.35 dB, (x, y, z) |
|---|---|---|
| w0 | 00 | (−1.01648, 0.404423, 0.471229) |
| w1 | 01 | (0.725854, 0.939584, 0.117155) |
| w2 | 10 | (0.145172, −1.03649, 0.560528) |
| w3 | 11 | (0.140766, −0.29884, −1.13839) | or are defined by a transformed version of a constellation from said group of constellations, wherein a transformed version of a non-uniform constellation is obtained from anyone of said constellations through a transformation including a rotation by an angle around the origin, an inversion of bit labels for all constellation points, an interchanging of bit positions and/or a predistortion for the constellation points.

9. A coding and modulation apparatus comprising an encoder configured to encode input data into cell words, and a modulator configured to modulate said cell words into constellation values of a non-uniform constellation and to assign bit combinations to constellation values of the used non-uniform constellation, wherein said modulator is configured to use, based on the total number M of constellation points of the constellation, the signal-to-noise ratio SNR and the number n of the dimension of the constellation, an n-dimensional non-uniform constellation from a group of constellations or a transformed version of an n-dimensional constellation from said group of constellations, wherein each constellation point of an n-dimensional constellation diagram is defined by an n-tupel of constellation values, said n-tupel of constellation values defining parameter settings of a transmission parameter used by a transmission apparatus for transmitting a transmission stream obtained by conversion of said constellation values, and wherein the constellation position vectors of the different constellations of the group of constellation are defined as follows:

for n=3 and M=64:

| wk | LSB bit labels (b3 b4 b5) | $R_c = \frac{1}{4}$, 2.1 dB, (x, y, z) | $R_c = \frac{1}{2}$, 6.2 dB, (x, y, z) |
|---|---|---|---|
| w0 | 000 | (0.679463, 1.203006, 0.519483) | (0.596549, 1.352959, 0.388406) |
| w1 | 001 | (0.483813, 0.629873, 0.355243) | (0.397732, 0.604735, 0.238847) |
| w2 | 010 | (1.252423, 0.629854, 0.629855) | (1.423781, 0.547468, 0.547469) |
| w3 | 011 | (0.759524, 0.40977, 0.40977) | (0.784715, 0.306821, 0.306822) |
| w4 | 100 | (0.456715, 0.900064, 0.900059) | (0.379632, 1.038068, 1.038067) |
| w5 | 101 | (0.349874, 0.510669, 0.51067) | (0.248578, 0.424422, 0.424422) |
| w6 | 110 | (0.679462, 0.519486, 1.203008) | (0.596547, 0.388406, 1.352962) |
| w7 | 111 | (0.483813, 0.355244, 0.629877) | (0.397731, 0.238846, 0.604736) |

| wk | LSB bit labels (b3 b4 b5) | $R_c = \frac{2}{3}$, 8.8 dB, (x, y, z) | $R_c = \frac{3}{4}$, 10 dB, (x, y, z) |
|---|---|---|---|
| w0 | 000 | (0.37522, 0.535637, 1.329562) | (0.403465, 1.429603, 0.403469) |
| w1 | 001 | (0.585588, 1.369204, 0.585594) | (0.93451, 0.917081, 0.311174) |
| w2 | 010 | (1.046301, 0.382275, 1.046309) | (1.060679, 0.381871, 1.060697) |
| w3 | 011 | (1.329562, 0.535639, 0.375227) | (1.081152, 0.290324, 0.334489) |
| w4 | 100 | (0.214422, 0.399424, 0.691315) | (0.31117, 0.917076, 0.934521) |
| w5 | 101 | (0.309062, 0.906218, 0.30906) | (0.279161, 0.606528, 0.279155) |
| w6 | 110 | (0.363725, 0.212822, 0.363724) | (0.334483, 0.29031, 1.081104) |
| w7 | 111 | (0.691321, 0.399426, 0.214424) | (0.352778, 0.205563, 0.352752) |

| wk | LSB bit labels (b3 b4 b5) | $R_c = \frac{5}{6}$, 11.35 dB, (x, y, z) |
|---|---|---|
| w0 | 000 | (1.054178, 1.043246, 0.431268) |
| w1 | 001 | (0.373323, 1.37404, 0.341879) |
| w2 | 010 | (1.073002, 0.372189, 0.909371) |
| w3 | 011 | (0.952138, 0.27332, 0.278175) |
| w4 | 100 | (0.370565, 0.907662, 1.044718) |
| w5 | 101 | (0.277451, 0.740438, 0.314124) |
| w6 | 110 | (0.341752, 0.278121, 1.025684) |
| w7 | 111 | (0.308638, 0.239727, 0.33157) | for n=4 and M=4:

| wk | bit labels (b0 b1) | $R_c = \frac{1}{4}$, −4.25 dB, (x, y, z) | $R_c = \frac{1}{2}$, −0.85 dB, (x, y, z) |
|---|---|---|---|
| w0 | 00 | (0, 0.866025, 0.866025) | (0.341973, 0.732665, 0.91801) |
| w1 | 01 | (0, 0.866025, −0.86603) | (−0.04024, 0.896206, −0.83227) |

-continued

| wk | bit labels (b0 b1) | $R_c = \frac{1}{4}$, -4.25 dB, (x, y, z) | $R_c = \frac{1}{2}$, -0.85 dB, (x, y, z) |
|---|---|---|---|
| w2 | 10 | (0, -0.86603, 0.866025) | (-0.63438, -0.76431, 0.713423) |
| w3 | 11 | (0, -0.86603, -0.86603) | (0.334075, -0.86322, -0.79958) |

| wk | bit labels (b0 b1) | $R_c = \frac{2}{3}$, 1.3 dB, (x, y, z) | $R_c = \frac{3}{4}$, 2.2 dB, (x, y, z) |
|---|---|---|---|
| w0 | 00 | (0.943009, 0.560703, 0.544745) | (0.349973, 0.944614, 0.675467) |
| w1 | 01 | (-0.54904, 0.974405, -0.49777) | (0.735879, 0.122954, -0.9589) |
| w2 | 10 | (-0.32303, -0.76353, 0.901148) | (-0.01644, -0.88366, 0.829) |
| w3 | 11 | (-0.06959, -0.77156, -0.94867) | (-1.06295, -0.18527, -0.55139) |

| wk | bit labels (b0 b1) | $R_c = \frac{5}{6}$, 3.35 dB, (x, y, z) |
|---|---|---|
| w0 | 00 | (-1.01648, 0.404423, 0.471229) |
| w1 | 01 | (0.725854, 0.939584, 0.117155) |
| w2 | 10 | (0.145172, -1.03649, 0.560528) |
| w3 | 11 | (0.140766, -0.29884, -1.13839) | for n=4 and M=64:

| wk | LSB bit labels (b4 b5) | $R_c = \frac{1}{4}$, 0.6 dB, (x, y, z, w) | $R_c = \frac{1}{2}$, 4.7 dB, (x, y, z, w) |
|---|---|---|---|
| w0 | 00 | (0.707102, 0.707102, 0.707101, 0.707101) | (0.594667, 1.342751, 0.5791, 0.579096) |
| w1 | 01 | (0.707102, 0.707102, 0.707101, 0.707102) | (0.594666, 0.522325, 1.200416, 0.386329) |
| w2 | 10 | (0.707101, 0.707102, 0.707102, 0.707101) | (0.594668, 0.522324, 0.386331, 1.200417) |
| w3 | 11 | (0.707102, 0.707101, 0.707102, 0.707102) | (0.5947, 0.260823, 0.394221, 0.394225) |

| wk | LSB bit labels (b4 b5) | $R_c = \frac{2}{3}$, 7.1 dB, (x, y, z, w) | $R_c = \frac{3}{4}$, 8.15 dB, (x, y, z, w) |
|---|---|---|---|
| w0 | 00 | (0.533719, 0.551776, 0.533618, 1.335255) | (0.415131, 0.47307, 0.473059, 1.174576) |
| w1 | 01 | (0.438941, 0.552091, 1.247518, 0.521329) | (0.473129, 0.415164, 1.174585, 0.473076) |
| w2 | 10 | (1.248209, 0.551665, 0.438372, 0.521793) | (0.473159, 1.174799, 0.415194, 0.473154) |
| w3 | 11 | (0.379345, 0.551627, 0.379809, 0.286494) | (1.174858, 0.473175, 0.473155, 0.415242) |

| wk | LSB bit labels (b4 b5) | $R_c = \frac{5}{6}$, 9.45 dB, (x, y, z, w) |
|---|---|---|
| w0 | 00 | (0.429225, 0.468636, 0.468558, 1.17263) |
| w1 | 01 | (0.468498, 0.429212, 1.172329, 0.468549) |
| w2 | 10 | (0.468597, 1.172764, 0.429245, 0.46863) |
| w3 | 11 | (1.172465, 0.468608, 0.468507, 0.429221) | for n=4 and M=256:

| wk | LSB bit labels (b4 b5 b6 b7) | $R_c = \frac{1}{4}$, 2.1 dB, (x, y, z, w) |
|---|---|---|
| w0 | 0000 | (0.853533, 0.853537, 0.435223, 0.853537) |
| w1 | 0001 | (1.388052, 0.570334, 0.570341, 0.570343) |
| w2 | 0010 | (0.535491, 0.53549, 0.326029, 0.535488) |
| w3 | 0011 | (0.770557, 0.406253, 0.406253, 0.406253) |
| w4 | 0100 | (0.570336, 0.57034, 0.570337, 1.388053) |
| w5 | 0101 | (0.853532, 0.435221, 0.853528, 0.853543) |
| w6 | 0110 | (0.406254, 0.406255, 0.406251, 0.770546) |
| w7 | 0111 | (0.535493, 0.32603, 0.535484, 0.535491) |
| w8 | 1000 | (0.570338, 1.388054, 0.570346, 0.570339) |
| w9 | 1001 | (0.853534, 0.853532, 0.853551, 0.435225) |
| w10 | 1010 | (0.406255, 0.770554, 0.406256, 0.406249) |
| w11 | 1011 | (0.535492, 0.53549, 0.535495, 0.326031) |
| w12 | 1100 | (0.435219, 0.853539, 0.85354, 0.853534) |
| w13 | 1101 | (0.570339, 0.570338, 1.388047, 0.570341) |
| w14 | 1110 | (0.32603, 0.535493, 0.535491, 0.535485) |
| w15 | 1111 | (0.406255, 0.406253, 0.770551, 0.406251) |

| wk | LSB bit labels (b4 b5 b6 b7) | $R_c = \frac{1}{2}$, 4.7 dB, (x, y, z, w) |
|---|---|---|
| w0 | 0000 | (1.526509, 0.402616, 0.631195, 0.631197) |
| w1 | 0001 | (0.602165, 0.480207, 1.520122, 0.438092) |
| w2 | 0010 | (1.25358, 1.046597, 0.444948, 0.444947) |
| w3 | 0011 | (0.552189, 1.201405, 1.024307, 0.313877) |
| w4 | 0100 | (0.942978, 0.243165, 0.411336, 0.411336) |
| w5 | 0101 | (0.429351, 0.270441, 0.879771, 0.304775) |
| w6 | 0110 | (0.752996, 0.432847, 0.287963, 0.28796) |
| w7 | 0111 | (0.376248, 0.491436, 0.538473, 0.221183) |
| w8 | 1000 | (0.602165, 0.48021, 0.438083, 1.520119) |
| w9 | 1001 | (0.400875, 0.468866, 1.189484, 1.189495) |
| w10 | 1010 | (0.55219, 1.201411, 0.313874, 1.024294) |
| w11 | 1011 | (0.300813, 1.415048, 0.466125, 0.466122) |
| w12 | 1100 | (0.42935, 0.270442, 0.304772, 0.879768) |
| w13 | 1101 | (0.266249, 0.279379, 0.63154, 0.631546) |
| w14 | 1110 | (0.376246, 0.491438, 0.221183, 0.538465) |
| w15 | 1111 | (0.22888, 0.552601, 0.354481, 0.35448) |

| wk | LSB bit labels (b4 b5 b6 b7) | $R_c = \frac{2}{3}$, 8.8 dB, (x, y, z, w) |
|---|---|---|
| w0 | 0000 | (1.018943, 0.365858, 1.199467, 0.481008) |
| w1 | 0001 | (0.331868, 0.361354, 1.310964, 0.283197) |
| w2 | 0010 | (1.558783, 0.459499, 0.486589, 0.463096) |
| w3 | 0011 | (1.10882, 1.198092, 0.44343, 0.399275) |
| w4 | 0100 | (0.685157, 0.196292, 0.575696, 0.442069) |
| w5 | 0101 | (0.332449, 0.279754, 0.526833, 0.246807) |
| w6 | 0110 | (1.003474, 0.302379, 0.281231, 0.436793) |
| w7 | 0111 | (0.676872, 0.666776, 0.261086, 0.255449) |
| w8 | 1000 | (0.396496, 0.465471, 1.097731, 1.183561) |
| w9 | 1001 | (0.330053, 1.038928, 1.168812, 0.447361) |
| w10 | 1010 | (0.439683, 1.062086, 0.441272, 1.301175) |
| w11 | 1011 | (0.371102, 1.447116, 0.450695, 0.467416) |
| w12 | 1100 | (0.282082, 0.246055, 0.399926, 0.957503) |
| w13 | 1101 | (0.170056, 0.386611, 0.345374, 0.425569) |
| w14 | 1110 | (0.776315, 0.39265, 0.276701, 1.241973) |
| w15 | 1111 | (0.268557, 0.861542, 0.245954, 0.354217) |

| wk | LSB bit labels (b4 b5 b6 b7) | $R_c = \frac{3}{4}$, 4.7 dB, (x, y, z, w) |
|---|---|---|
| w0 | 0000 | (1.177296, 1.1958, 0.498387, 0.389436) |
| w1 | 0001 | (1.493578, 0.394827, 0.380252, 0.355904) |
| w2 | 0010 | (0.869675, 0.903371, 0.298536, 0.906957) |
| w3 | 0011 | (0.764504, 0.533695, 0.24056, 0.280397) |
| w4 | 0100 | (1.035942, 0.403318, 1.013009, 0.971103) |
| w5 | 0101 | (0.972427, 0.325647, 0.998656, 0.300178) |
| w6 | 0110 | (0.80859, 0.29903, 0.327672, 1.144447) |
| w7 | 0111 | (0.649232, 0.205051, 0.350469, 0.357187) |
| w8 | 1000 | (0.3932, 1.544683, 0.41033, 0.388835) |
| w9 | 1001 | (0.348383, 1.035569, 1.060365, 0.330446) |
| w10 | 1010 | (0.271132, 0.997977, 0.349517, 0.907452) |
| w11 | 1011 | (0.236576, 0.713614, 0.327883, 0.278331) |
| w12 | 1100 | (0.319746, 0.398194, 1.126819, 1.073599) |
| w13 | 1101 | (0.309596, 0.330431, 1.191466, 0.335021) |
| w14 | 1110 | (0.228413, 0.325633, 0.370927, 1.102348) |
| w15 | 1111 | (0.203443, 0.239249, 0.425946, 0.367032) |

| wk | LSB bit labels (b4 b5 b6 b7) | $R_c = \frac{5}{6}$, 11.35 dB, (x, y, z, w) |
|---|---|---|
| w0 | 0000 | (1.077284, 0.957874, 1.034832, 0.441819) |
| w1 | 0001 | (0.412758, 0.398613, 1.528827, 0.375586) |
| w2 | 0010 | (1.076567, 1.07177, 0.324415, 0.428991) |
| w3 | 0011 | (1.514688, 0.385762, 0.382328, 0.357945) |
| w4 | 0100 | (0.414877, 0.390574, 0.394515, 1.572725) |
| w5 | 0101 | (0.822358, 0.246758, 0.917809, 0.321732) |
| w6 | 0110 | (0.963923, 0.374594, 0.335966, 1.001772) |
| w7 | 0111 | (0.864815, 0.291169, 0.284467, 0.299176) |
| w8 | 1000 | (0.400077, 0.935313, 0.975085, 0.955456) |
| w9 | 1001 | (0.281655, 0.906792, 0.941819, 0.290489) |
| w10 | 1010 | (0.384193, 1.120022, 0.3108, 0.875174) |
| w11 | 1011 | (0.294389, 1.020099, 0.302111, 0.266808) |
| w12 | 1100 | (0.305856, 0.294713, 0.824631, 0.992838) |
| w13 | 1101 | (0.25481, 0.285898, 0.751643, 0.298045) |
| w14 | 1110 | (0.289067, 0.356851, 0.238692, 0.822132) |
| w15 | 1111 | (0.294154, 0.340578, 0.244513, 0.277487) | wherein a transformed version of a non-uniform constellation is obtained from anyone of said constellations through a transformation including a rotation by an angle around the origin, an inversion of bit labels for all constellation points, an interchanging of bit positions and/or a predistortion for the constellation points.

10. A coding and modulation method comprising encoding input data into cell words, and modulating said cell words into constellation values of a non-uniform constellation and to assign bit combinations to constellation values of the used non-uniform constellation, wherein said modulating uses, based on the total number M of constellation points of the constellation and the signal-to-noise ratio SNR, an n-dimensional non-uniform constellation from a group of constellations, wherein each constellation point of an n-dimensional constellation diagram is defined by an n-tupel of constellation values, said n-tupel of constellation values defining parameter settings of a transmission parameter used by a transmission apparatus for transmitting a transmission stream obtained by conversion of said constellation values, and wherein said modulating uses a constellation having a total number M of constellation points of the constellation and a number n of the dimension of the constellation which fulfill the condition that log 2(M)/n*2 is a non-integer number.

11. A coding and modulation method comprising encoding input data into cell words, and modulating said cell words into constellation values of a non-uniform constellation and to assign bit combinations to constellation values of the used non-uniform constellation, wherein said modulating uses, based on the total number M of constellation points of the constellation, the signal-to-noise ratio SNR and the number n of the dimension of the constellation, an n-dimensional non-uniform constellation from a group of constellations or a transformed version of an n-dimensional constellation from said group of constellations, wherein each constellation point of an n-dimensional constellation diagram is defined by an n-tupel of constellation values, said n-tupel of constellation values defining parameter settings of a transmission parameter used by a transmission apparatus for transmitting a transmission stream obtained by conversion of said constellation values, and wherein the constellation position vectors of the different constellations of the group of constellation are defined as follows:

for n=3 and M=64:

| wk | LSB bit labels (b3 b4 b5) | $R_c = \frac{1}{4}$, 2.1 dB, (x, y, z) | $R_c = \frac{1}{2}$, 6.2 dB (x, y, z) |
|---|---|---|---|
| w0 | 000 | (0.679463, 1.203006, 0.519483) | (0.596549, 1.352959, 0.388406) |
| w1 | 001 | (0.483813, 0.629873, 0.355243) | (0.397732, 0.604735, 0.238847) |
| w2 | 010 | (1.252423, 0.629854, 0.629855) | (1.423781, 0.547468, 0.547469) |
| w3 | 011 | (0.759524, 0.40977, 0.40977) | (0.784715, 0.306821, 0.306822) |
| w4 | 100 | (0.456715, 0.900064, 0.900059) | (0.379632, 1.038068, 1.038067) |
| w5 | 101 | (0.349874, 0.510669, 0.51067) | (0.248578, 0.424422, 0.424422) |
| w6 | 110 | (0.679462, 0.519486, 1.203008) | (0.596547, 0.388406, 1.352962) |
| w7 | 111 | (0.483813, 0.355244, 0.629877) | (0.397731, 0.238846, 0.604736) |

| wk | LSB bit labels (b3 b4 b5) | $R_c = \frac{2}{3}$, 8.8 dB, (x, y, z) | $R_c = \frac{3}{4}$, 10 dB, (x, y, z) |
|---|---|---|---|
| w0 | 000 | (0.37522, 0.535637, 1.329562) | (0.403465, 1.429603, 0.403469) |
| w1 | 001 | (0.585588, 1.369204, 0.585594) | (0.93451, 0.917081, 0.311174) |
| w2 | 010 | (1.046301, 0.382275, 1.046309) | (1.060679, 0.381871, 1.060697) |
| w3 | 011 | (1.329562, 0.535639, 0.375227) | (1.081152, 0.290324, 0.334489) |
| w4 | 100 | (0.214422, 0.399424, 0.691315) | (0.31117, 0.917076, 0.934521) |
| w5 | 101 | (0.309062, 0.906218, 0.30906) | (0.279161, 0.606528, 0.279155) |
| w6 | 110 | (0.363725, 0.212822, 0.363724) | (0.334483, 0.29031, 1.081104) |
| w7 | 111 | (0.691321, 0.399426, 0.214424) | (0.352778, 0.205563, 0.352752) |

| wk | LSB bit labels (b3 b4 b5) | $R_c = \frac{5}{6}$, 11.35 dB, (x, y, z) |
|---|---|---|
| w0 | 000 | (1.054178, 1.043246, 0.431268) |
| w1 | 001 | (0.373323, 1.37404, 0.341879) |
| w2 | 010 | (1.073002, 0.372189, 0.909371) |
| w3 | 011 | (0.952138, 0.27332, 0.278175) |
| w4 | 100 | (0.370565, 0.907662, 1.044718) |
| w5 | 101 | (0.277451, 0.740438, 0.314124) |
| w6 | 110 | (0.341752, 0.278121, 1.025684) |
| w7 | 111 | (0.308638, 0.239727, 0.33157) | for n=4 and M=4:

| wk | bit labels (b0 b1) | $R_c = \frac{1}{4}$, −4.25 dB, (x, y, z) | $R_c = \frac{1}{2}$, −0.85 dB, (x, y, z) |
|---|---|---|---|
| w0 | 00 | (0, 0.866025, 0.866025) | (0.341973, 0.732665, 0.91801) |
| w1 | 01 | (0, 0.866025, −0.86603) | (−0.04024, 0.896206, −0.83227) |
| w2 | 10 | (0, −0.86603, 0.866025) | (−0.63438, −0.76431, 0.713423) |
| w3 | 11 | (0, −0.86603, −0.86603) | (0.334075, −0.86322, −0.79958) |

| wk | bit labels (b0 b1) | $R_c = \frac{2}{3}$, 1.3 dB, (x, y, z) | $R_c = \frac{3}{4}$, 2.2 dB, (x, y, z) |
|---|---|---|---|
| w0 | 00 | (0.943009, 0.560703, 0.544745) | (0.349973, 0.944614, 0.675467) |
| w1 | 01 | (−0.54904, 0.974405, −0.49777) | (0.735879, 0.122954, −0.9589) |
| w2 | 10 | (−0.32303, −0.76353, 0.901148) | (−0.01644, −0.88366, 0.829) |
| w3 | 11 | (−0.06959, −0.77156, −0.94867) | (−1.06295, −0.18527, −0.55139) |

| wk | bit labels (b0 b1) | $R_c = \frac{5}{6}$, 3.35 dB, (x, y, z) |
|---|---|---|
| w0 | 00 | (−1.01648, 0.404423, 0.471229) |
| w1 | 01 | (0.725854, 0.939584, 0.117155) |
| w2 | 10 | (0.145172, −1.03649, 0.560528) |
| w3 | 11 | (0.140766, −0.29884, −1.13839) | for n=4 and M=64:

| wk | LSB bit labels (b4 b5) | $R_c = \frac{1}{4}$, 0.6 dB, (x, y, z, w) | $R_c = \frac{1}{2}$, 4.7 dB, (x, y, z, w) |
|---|---|---|---|
| w0 | 00 | (0.707102, 0.707102, 0.707101, 0.707101) | (0.594667, 1.342751, 0.5791, 0.579096) |
| w1 | 01 | (0.707102, 0.707102, 0.707101, 0.707102) | (0.594666, 0.522325, 1.200416, 0.386329) |
| w2 | 10 | (0.707101, 0.707102, 0.707102, 0.707101) | (0.594668, 0.522324, 0.386331, 1.200417) |
| w3 | 11 | (0.707102, 0.707101, 0.707102, 0.707102) | (0.5947, 0.260823, 0.394221, 0.394225) |

| wk | LSB bit labels (b4 b5) | $R_c = \frac{2}{3}$, 7.1 dB, (x, y, z, w) | $R_c = \frac{3}{4}$, 8.15 dB, (x, y, z, w) |
|---|---|---|---|
| w0 | 00 | (0.533719, 0.551776, 0.533618, 1.335255) | (0.415131, 0.47307, 0.473059, 1.174576) |
| w1 | 01 | (0.438941, 0.552091, 1.247518, 0.521329) | (0.473129, 0.415164, 1.174585, 0.473076) |
| w2 | 10 | (1.248209, 0.551665, 0.438372, 0.521793) | (0.473159, 1.174799, 0.415194, 0.473154) |
| w3 | 11 | (0.379345, 0.551627, 0.379809, 0.286494) | (1.174858, 0.473175, 0.473155, 0.415242) |

| wk | LSB bit labels (b4 b5) | $R_c = \frac{5}{6}$, 9.45 dB, (x, y, z, w) |
|---|---|---|
| w0 | 00 | (0.429225, 0.468636, 0.468558, 1.17263) |
| w1 | 01 | (0.468498, 0.429212, 1.172329, 0.468549) |
| w2 | 10 | (0.468597, 1.172764, 0.429245, 0.46863) |
| w3 | 11 | (1.172465, 0.468608, 0.468507, 0.429221) | for n=4 and M=256:

| wk | LSB bit labels (b4 b5 b6 b7) | $R_c = \frac{1}{4}$, 2.1 dB, (x, y, z, w) |
|---|---|---|
| w0 | 0000 | (0.853533, 0.853537, 0.435223, 0.853537) |
| w1 | 0001 | (1.388052, 0.570334, 0.570341, 0.570343) |
| w2 | 0010 | (0.535491, 0.53549, 0.326029, 0.535488) |
| w3 | 0011 | (0.770557, 0.406253, 0.406253, 0.406253) |
| w4 | 0100 | (0.570336, 0.57034, 0.570337, 1.388053) |
| w5 | 0101 | (0.853532, 0.435221, 0.853528, 0.853543) |
| w6 | 0110 | (0.406254, 0.406255, 0.406251, 0.770546) |
| w7 | 0111 | (0.535493, 0.32603, 0.535484, 0.535491) |
| w8 | 1000 | (0.570338, 1.388054, 0.570346, 0.570339) |
| w9 | 1001 | (0.853534, 0.853532, 0.853551, 0.435225) |
| w10 | 1010 | (0.406255, 0.770554, 0.406256, 0.406249) |
| w11 | 1011 | (0.535492, 0.53549, 0.535495, 0.326031) |
| w12 | 1100 | (0.435219, 0.853539, 0.85354, 0.853534) |
| w13 | 1101 | (0.570339, 0.570338, 1.388047, 0.570341) |
| w14 | 1110 | (0.32603, 0.535493, 0.535491, 0.535485) |
| w15 | 1111 | (0.406255, 0.406253, 0.770551, 0.406251) |

| wk | LSB bit labels (b4 b5 b6 b7) | $R_c = \frac{1}{2}$, 4.7 dB, (x, y, z, w) |
|---|---|---|
| w0 | 0000 | (1.526509, 0.402616, 0.631195, 0.631197) |
| w1 | 0001 | (0.602165, 0.480207, 1.520122, 0.438092) |
| w2 | 0010 | (1.25358, 1.046597, 0.444948, 0.444947) |
| w3 | 0011 | (0.552189, 1.201405, 1.024307, 0.313877) |
| w4 | 0100 | (0.942978, 0.243165, 0.411336, 0.411336) |
| w5 | 0101 | (0.429351, 0.270441, 0.879771, 0.304775) |
| w6 | 0110 | (0.752996, 0.432847, 0.287963, 0.28796) |
| w7 | 0111 | (0.376248, 0.491436, 0.538473, 0.221183) |
| w8 | 1000 | (0.602165, 0.48021, 0.438083, 1.520119) |
| w9 | 1001 | (0.400875, 0.468866, 1.189484, 1.189495) |
| w10 | 1010 | (0.55219, 1.201411, 0.313874, 1.024294) |
| w11 | 1011 | (0.300813, 1.415048, 0.466125, 0.466122) |
| w12 | 1100 | (0.42935, 0.270442, 0.304772, 0.879768) |
| w13 | 1101 | (0.266249, 0.279379, 0.63154, 0.631546) |

-continued

| wk | LSB bit labels (b4 b5 b6 b7) | $R_c = \frac{1}{2}$, 4.7 dB, (x, y, z, w) |
|---|---|---|
| w14 | 1110 | (0.376246, 0.491438, 0.221183, 0.538465) |
| w15 | 1111 | (0.22888, 0.552601, 0.354481, 0.35448) |

| wk | LSB bit labels (b4 b5 b6 b7) | $R_c = \frac{2}{3}$, 8.8 dB, (x, y, z, w) |
|---|---|---|
| w0 | 0000 | (1.018943, 0.365858, 1.199467, 0.481008) |
| w1 | 0001 | (0.331868, 0.361354, 1.310964, 0.283197) |
| w2 | 0010 | (1.558783, 0.459499, 0.486589, 0.463096) |
| w3 | 0011 | (1.10882, 1.198092, 0.44343, 0.399275) |
| w4 | 0100 | (0.685157, 0.196292, 0.575696, 0.442069) |
| w5 | 0101 | (0.332449, 0.279754, 0.526833, 0.246807) |
| w6 | 0110 | (1.003474, 0.302379, 0.281231, 0.436793) |
| w7 | 0111 | (0.676872, 0.666776, 0.261086, 0.255449) |
| w8 | 1000 | (0.396496, 0.465471, 1.097731, 1.183561) |
| w9 | 1001 | (0.330053, 1.038928, 1.168812, 0.447361) |
| w10 | 1010 | (0.439683, 1.062086, 0.441272, 1.301175) |
| w11 | 1011 | (0.371102, 1.447116, 0.450695, 0.467416) |
| w12 | 1100 | (0.282082, 0.246055, 0.399926, 0.957503) |
| w13 | 1101 | (0.170056, 0.386611, 0.345374, 0.425569) |
| w14 | 1110 | (0.776315, 0.39265, 0.276701, 1.241973) |
| w15 | 1111 | (0.268557, 0.861542, 0.245954, 0.354217) |

| wk | LSB bit labels (b4 b5 b6 b7) | $R_c = \frac{3}{4}$, 4.7 dB, (x, y, z, w) |
|---|---|---|
| w0 | 0000 | (1.177296, 1.1958, 0.498387, 0.389436) |
| w1 | 0001 | (1.493578, 0.394827, 0.380252, 0.355904) |
| w2 | 0010 | (0.869675, 0.903371, 0.298536, 0.906957) |
| w3 | 0011 | (0.764504, 0.533695, 0.24056, 0.280397) |
| w4 | 0100 | (1.035942, 0.403318, 1.013009, 0.971103) |
| w5 | 0101 | (0.972427, 0.325647, 0.998656, 0.300178) |
| w6 | 0110 | (0.80859, 0.29903, 0.327672, 1.144447) |
| w7 | 0111 | (0.649232, 0.205051, 0.350469, 0.357187) |
| w8 | 1000 | (0.3932, 1.544683, 0.41033, 0.388835) |
| w9 | 1001 | (0.348383, 1.035569, 1.060365, 0.330446) |
| w10 | 1010 | (0.271132, 0.997977, 0.349517, 0.907452) |
| w11 | 1011 | (0.236576, 0.713614, 0.327883, 0.278331) |
| w12 | 1100 | (0.319746, 0.398194, 1.126819, 1.073599) |
| w13 | 1101 | (0.309596, 0.330431, 1.191466, 0.335021) |
| w14 | 1110 | (0.228413, 0.325633, 0.370927, 1.102348) |
| w15 | 1111 | (0.203443, 0.239249, 0.425946, 0.367032) |

| wk | LSB bit labels (b4 b5 b6 b7) | $R_c = \frac{5}{6}$, 11.35 dB, (x, y, z, w) |
|---|---|---|
| w0 | 0000 | (1.077284, 0.957874, 1.034832, 0.441819) |
| w1 | 0001 | (0.412758, 0.398613, 1.528827, 0.375586) |
| w2 | 0010 | (1.076567, 1.07177, 0.324415, 0.428991) |
| w3 | 0011 | (1.514688, 0.385762, 0.382328, 0.357945) |
| w4 | 0100 | (0.414877, 0.390574, 0.394515, 1.572725) |
| w5 | 0101 | (0.822358, 0.246758, 0.917809, 0.321732) |
| w6 | 0110 | (0.963923, 0.374594, 0.335966, 1.001772) |
| w7 | 0111 | (0.864815, 0.291169, 0.284467, 0.299176) |
| w8 | 1000 | (0.400077, 0.935313, 0.975085, 0.955456) |
| w9 | 1001 | (0.281655, 0.906792, 0.941819, 0.290489) |
| w10 | 1010 | (0.384193, 1.120022, 0.3108, 0.875174) |
| w11 | 1011 | (0.294389, 1.020099, 0.302111, 0.266808) |
| w12 | 1100 | (0.305856, 0.294713, 0.824631, 0.992838) |
| w13 | 1101 | (0.25481, 0.285898, 0.751643, 0.298045) |
| w14 | 1110 | (0.289067, 0.356851, 0.238692, 0.822132) |
| w15 | 1111 | (0.294154, 0.340578, 0.244513, 0.277487) | wherein a transformed version of a non-uniform constellation is obtained from anyone of said constellations through a transformation including a rotation by an angle around the origin, an inversion of bit labels for all constellation points, an interchanging of bit positions and/or a predistortion for the constellation points.

12. A transmission apparatus comprising:
a coding and modulation apparatus as defined in any one of embodiments 1 to 9 configured to encode and modulate input data into constellation values,
a converter configured to convert said constellation values into one or more transmission streams to be transmitted, and
a transmitter configured to transmit said one or more transmission streams.

13. A transmission method comprising:
a coding and modulation method as defined in embodiment 10 or 11 that encodes and modulates input data into constellation values,
converting said constellation values into one or more transmission streams to be transmitted, and
transmitting said one or more transmission streams.

14. A demodulation and decoding apparatus comprising:
a demodulator (44) configured to demodulate constellation values of a non-uniform constellation into cell words and to assign bit combinations to constellation values of the used non-uniform constellation, and
a decoder (45) configured to decode cell words into output data,
wherein said demodulator (44) is configured to use, based on signalling information indicating the total number M of constellation points of the constellation, the signal-to-noise ratio SNR and the number n of the dimension of the constellation, an n-dimensional non-uniform constellation from a group of constellations, wherein each constellation point of an n-dimensional constellation diagram is defined by an n-tupel of constellation values, said n-tupel of constellation values defining parameter settings of a transmission parameter used by a transmission apparatus for transmitting a transmission stream obtained by conversion of said constellation values, and
wherein said demodulator (45) is configured to use a constellation having a total number M of constellation points of the constellation and a number n of the dimension of the constellation which fulfill the condition that log 2(M)/n*2 is a non-integer number.

15. A demodulation and decoding apparatus comprising:
a demodulator configured to demodulate constellation values of a non-uniform constellation into cell words and to assign bit combinations to constellation values of the used non-uniform constellation, and
a decoder configured to decode cell words into output data,
wherein said demodulator is configured to use, based on signalling information indicating the total number M of constellation points of the constellation, the signal-to-noise ratio SNR and the number n of the dimension of the constellation, an n-dimensional non-uniform constellation from a group of constellations or a transformed version of an n-dimensional constellation from said group of constellations, wherein each constellation point of an n-dimensional constellation diagram is defined by an n-tupel of constellation values, said n-tupel of constellation values defining parameter settings of a transmission parameter used by a transmission apparatus for transmitting a transmission stream obtained by conversion of said constellation values, and
wherein the constellation position vectors of the different constellations of the group of constellation are defined as follows:
for n=3 and M=64:

| wk | LSB bit labels (b3 b4 b5) | $R_c = \frac{1}{4}$, 2.1 dB, (x, y, z) | $R_c = \frac{1}{2}$, 6.2 dB (x, y, z) |
|---|---|---|---|
| w0 | 000 | (0.679463, 1.203006, 0.519483) | (0.596549, 1.352959, 0.388406) |
| w1 | 001 | (0.483813, 0.629873, 0.355243) | (0.397732, 0.604735, 0.238847) |
| w2 | 010 | (1.252423, 0.629854, 0.629855) | (1.423781, 0.547468, 0.547469) |
| w3 | 011 | (0.759524, 0.40977, 0.40977) | (0.784715, 0.306821, 0.306822) |
| w4 | 100 | (0.456715, 0.900064, 0.900059) | (0.379632, 1.038068, 1.038067) |
| w5 | 101 | (0.349874, 0.510669, 0.51067) | (0.248578, 0.424422, 0.424422) |
| w6 | 110 | (0.679462, 0.519486, 1.203008) | (0.596547, 0.388406, 1.352962) |
| w7 | 111 | (0.483813, 0.355244, 0.629877) | (0.397731, 0.238846, 0.604736) |

| wk | LSB bit labels (b3 b4 b5) | $R_c = \frac{2}{3}$, 8.8 dB, (x, y, z) | $R_c = \frac{3}{4}$, 10 dB (x, y, z) |
|---|---|---|---|
| w0 | 000 | (0.37522, 0.535637, 1.329562) | (0.403465, 1.429603, 0.403469) |
| w1 | 001 | (0.585588, 1.369204, 0.585594) | (0.93451, 0.917081, 0.311174) |
| w2 | 010 | (1.046301, 0.382275, 1.046309) | (1.060679, 0.381871, 1.060697) |
| w3 | 011 | (1.329562, 0.535639, 0.375227) | (1.081152, 0.290324, 0.334489) |

-continued

| wk | LSB bit labels (b3 b4 b5) | $R_c = \frac{2}{3}$, 8.8 dB, (x, y, z) | $R_c = \frac{3}{4}$, 10 dB (x, y, z) |
|---|---|---|---|
| w4 | 100 | (0.214422, 0.399424, 0.691315) | (0.31117, 0.917076, 0.934521) |
| w5 | 101 | (0.309062, 0.906218, 0.30906) | (0.279161, 0.606528, 0.279155) |
| w6 | 110 | (0.363725, 0.212822, 0.363724) | (0.334483, 0.29031, 1.081104) |
| w7 | 111 | (0.691321, 0.399426, 0.214424) | (0.352778, 0.205563, 0.352752) |

| wk | LSB bit labels (b3 b4 b5) | $R_c = \frac{5}{6}$, 11.35 dB, (x, y, z) |
|---|---|---|
| w0 | 000 | (1.054178, 1.043246, 0.431268) |
| w1 | 001 | (0.373323, 1.37404, 0.341879) |
| w2 | 010 | (1.073002, 0.372189, 0.909371) |
| w3 | 011 | (0.952138, 0.27332, 0.278175) |
| w4 | 100 | (0.370565, 0.907662, 1.044718) |
| w5 | 101 | (0.277451, 0.740438, 0.314124) |
| w6 | 110 | (0.341752, 0.278121, 1.025684) |
| w7 | 111 | (0.308638, 0.239727, 0.33157) | for n=4 and M=4:

| wk | bit labels (b0 b1) | $R_c = \frac{1}{4}$, −4.25 dB, (x, y, z) | $R_c = \frac{1}{2}$, −0.85 dB, (x, y, z) |
|---|---|---|---|
| w0 | 00 | (0, 0.866025, 0.866025) | (0.341973, 0.732665, 0.91801) |
| w1 | 01 | (0, 0.866025, −0.86603) | (−0.04024, 0.896206, −0.83227) |
| w2 | 10 | (0, −0.86603, 0.866025) | (−0.63438, −0.76431, 0.713423) |
| w3 | 11 | (0, −0.86603, −0.86603) | (0.334075, −0.86322, −0.79958) |

| wk | bit labels (b0 b1) | $R_c = \frac{2}{3}$, 1.3 dB, (x, y, z) | $R_c = \frac{3}{4}$, 2.2 dB, (x, y, z) |
|---|---|---|---|
| w0 | 00 | (0.943009, 0.560703, 0.544745) | (0.349973, 0.944614, 0.675467) |
| w1 | 01 | (−0.54904, 0.974405, −0.49777) | (0.735879, 0.122954, −0.9589) |
| w2 | 10 | (−0.32303, −0.76353, 0.901148) | (−0.01644, −0.88366, 0.829) |
| w3 | 11 | (−0.06959, −0.77156, −0.94867) | (−1.06295, −0.18527, −0.55139) |

| wk | bit labels (b0 b1) | $R_c = \frac{5}{6}$, 3.35 dB, (x, y, z) |
|---|---|---|
| w0 | 00 | (−1.01648, 0.404423, 0.471229) |
| w1 | 01 | (0.725854, 0.939584, 0.117155) |
| w2 | 10 | (0.145172, −1.03649, 0.560528) |
| w3 | 11 | (0.140766, −0.29884, −1.13839) | for n=4 and M=64:

| wk | LSB bit labels (b4 b5) | $R_c = \frac{1}{4}$, 0.6 dB, (x, y, z, w) | $R_c = \frac{1}{2}$, 4.7 dB, (x, y, z, w) |
|---|---|---|---|
| w0 | 00 | (0.707102, 0.707102, 0.707101, 0.707101) | (0.594667, 1.342751, 0.5791, 0.579096) |
| w1 | 01 | (0.707102, 0.707102, 0.707101, 0.707102) | (0.594666, 0.522325, 1.200416, 0.386329) |
| w2 | 10 | (0.707101, 0.707102, 0.707102, 0.707101) | (0.594668, 0.522324, 0.386331, 1.200417) |
| w3 | 11 | (0.707102, 0.707102, 0.707101, 0.707102) | (0.5947, 0.260823, 0.394221, 0.394225) |

| wk | LSB bit labels (b4 b5) | $R_c = \frac{2}{3}$, 7.1 dB, (x, y, z, w) | $R_c = \frac{3}{4}$, 8.15 dB, (x, y, z, w) |
|---|---|---|---|
| w0 | 00 | (0.533719, 0.551776, 0.533618, 1.335255) | (0.415131, 0.47307, 0.473059, 1.174576) |
| w1 | 01 | (0.438941, 0.552091, 1.247518, 0.521329) | (0.473129, 0.415164, 1.174585, 0.473076) |
| w2 | 10 | (1.248209, 0.551665, 0.438372, 0.521793) | (0.473159, 1.174799, 0.415194, 0.473154) |
| w3 | 11 | (0.379345, 0.551627, 0.379809, 0.286494) | (1.174858, 0.473175, 0.473155, 0.415242) |

| wk | LSB bit labels (b4 b5) | $R_c = \frac{5}{6}$, 9.45 dB, (x, y, z, w) |
|---|---|---|
| w0 | 00 | (0.429225, 0.468636, 0.468558, 1.17263) |
| w1 | 01 | (0.468498, 0.429212, 1.172329, 0.468549) |
| w2 | 10 | (0.468597, 1.172764, 0.429245, 0.46863) |
| w3 | 11 | (1.172465, 0.468608, 0.468507, 0.429221) | for n=4 and M=256:

| wk | LSB bit labels (b4 b5 b6 b7) | $R_c = \frac{1}{4}$, 2.1 dB, (x, y, z, w) |
|---|---|---|
| w0 | 0000 | (0.853533, 0.853537, 0.435223, 0.853537) |
| w1 | 0001 | (1.388052, 0.570334, 0.570341, 0.570343) |
| w2 | 0010 | (0.535491, 0.53549, 0.326029, 0.535488) |
| w3 | 0011 | (0.770557, 0.406253, 0.406253, 0.406253) |
| w4 | 0100 | (0.570336, 0.57034, 0.570337, 1.388053) |
| w5 | 0101 | (0.853532, 0.435221, 0.853528, 0.853543) |
| w6 | 0110 | (0.406254, 0.406255, 0.406251, 0.770546) |
| w7 | 0111 | (0.535493, 0.32603, 0.535484, 0.535491) |
| w8 | 1000 | (0.570338, 1.388054, 0.570346, 0.570339) |
| w9 | 1001 | (0.853534, 0.853532, 0.853551, 0.435225) |
| w10 | 1010 | (0.406255, 0.770554, 0.406256, 0.406249) |
| w11 | 1011 | (0.535492, 0.53549, 0.535495, 0.326031) |
| w12 | 1100 | (0.435219, 0.853539, 0.85354, 0.853534) |
| w13 | 1101 | (0.570339, 0.570338, 1.388047, 0.570341) |
| w14 | 1110 | (0.32603, 0.535493, 0.535491, 0.535485) |
| w15 | 1111 | (0.406255, 0.406253, 0.770551, 0.406251) |

| wk | LSB bit labels (b4 b5 b6 b7) | $R_c = \frac{1}{2}$, 4.7 dB, (x, y, z, w) |
|---|---|---|
| w0 | 0000 | (1.526509, 0.402616, 0.631195, 0.631197) |
| w1 | 0001 | (0.602165, 0.480207, 1.520122, 0.438092) |
| w2 | 0010 | (1.25358, 1.046597, 0.444948, 0.444947) |
| w3 | 0011 | (0.552189, 1.201405, 1.024307, 0.313877) |
| w4 | 0100 | (0.942978, 0.243165, 0.411336, 0.411336) |
| w5 | 0101 | (0.429351, 0.270441, 0.879771, 0.304775) |
| w6 | 0110 | (0.752996, 0.432847, 0.287963, 0.28796) |
| w7 | 0111 | (0.376248, 0.491436, 0.538473, 0.221183) |
| w8 | 1000 | (0.602165, 0.48021, 0.438083, 1.520119) |
| w9 | 1001 | (0.400875, 0.468866, 1.189484, 1.189495) |
| w10 | 1010 | (0.55219, 1.201411, 0.313874, 1.024294) |
| w11 | 1011 | (0.300813, 1.415048, 0.466125, 0.466122) |
| w12 | 1100 | (0.42935, 0.270442, 0.304772, 0.879768) |
| w13 | 1101 | (0.266249, 0.279379, 0.63154, 0.631546) |
| w14 | 1110 | (0.376246, 0.491438, 0.221183, 0.538465) |
| w15 | 1111 | (0.22888, 0.552601, 0.354481, 0.35448) |

| wk | LSB bit labels (b4 b5 b6 b7) | $R_c = \frac{2}{3}$, 8.8 dB, (x, y, z, w) |
|---|---|---|
| w0 | 0000 | (1.018943, 0.365858, 1.199467, 0.481008) |
| w1 | 0001 | (0.331868, 0.361354, 1.310964, 0.283197) |
| w2 | 0010 | (1.558783, 0.459499, 0.486589, 0.463096) |
| w3 | 0011 | (1.10882, 1.198092, 0.44343, 0.399275) |
| w4 | 0100 | (0.685157, 0.196292, 0.575696, 0.442069) |
| w5 | 0101 | (0.332449, 0.279754, 0.526833, 0.246807) |
| w6 | 0110 | (1.003474, 0.302379, 0.281231, 0.436793) |
| w7 | 0111 | (0.676872, 0.666776, 0.261086, 0.255449) |
| w8 | 1000 | (0.396496, 0.465471, 1.097731, 1.183561) |
| w9 | 1001 | (0.330053, 1.038928, 1.168812, 0.447361) |
| w10 | 1010 | (0.439683, 1.062086, 0.441272, 1.301175) |
| w11 | 1011 | (0.371102, 1.447116, 0.450695, 0.467416) |
| w12 | 1100 | (0.282082, 0.246055, 0.399926, 0.957503) |
| w13 | 1101 | (0.170056, 0.386611, 0.345374, 0.425569) |
| w14 | 1110 | (0.776315, 0.39265, 0.276701, 1.241973) |
| w15 | 1111 | (0.268557, 0.861542, 0.245954, 0.354217) |

| wk | LSB bit labels (b4 b5 b6 b7) | $R_c = \frac{3}{4}$, 4.7 dB, (x, y, z, w) |
|---|---|---|
| w0 | 0000 | (1.177296, 1.1958, 0.498387, 0.389436) |
| w1 | 0001 | (1.493578, 0.394827, 0.380252, 0.355904) |
| w2 | 0010 | (0.869675, 0.903371, 0.298536, 0.906957) |
| w3 | 0011 | (0.764504, 0.533695, 0.24056, 0.280397) |
| w4 | 0100 | (1.035942, 0.403318, 1.013009, 0.971103) |
| w5 | 0101 | (0.972427, 0.325647, 0.998656, 0.300178) |
| w6 | 0110 | (0.80859, 0.29903, 0.327672, 1.144447) |
| w7 | 0111 | (0.649232, 0.205051, 0.350469, 0.357187) |
| w8 | 1000 | (0.3932, 1.544683, 0.41033, 0.388835) |
| w9 | 1001 | (0.348383, 1.035569, 1.060365, 0.330446) |
| w10 | 1010 | (0.271132, 0.997977, 0.349517, 0.907452) |
| w11 | 1011 | (0.236576, 0.713614, 0.327883, 0.278331) |
| w12 | 1100 | (0.319746, 0.398194, 1.126819, 1.073599) |
| w13 | 1101 | (0.309596, 0.330431, 1.191466, 0.335021) |
| w14 | 1110 | (0.228413, 0.325633, 0.370927, 1.102348) |
| w15 | 1111 | (0.203443, 0.239249, 0.425946, 0.367032) |

| wk | LSB bit labels (b4 b5 b6 b7) | $R_c = \frac{5}{6}$, 11.35 dB, (x, y, z, w) |
|---|---|---|
| w0 | 0000 | (1.077284, 0.957874, 1.034832, 0.441819) |
| w1 | 0001 | (0.412758, 0.398613, 1.528827, 0.375586) |
| w2 | 0010 | (1.076567, 1.07177, 0.324415, 0.428991) |
| w3 | 0011 | (1.514688, 0.385762, 0.382328, 0.357945) |
| w4 | 0100 | (0.414877, 0.390574, 0.394515, 1.572725) |
| w5 | 0101 | (0.822358, 0.246758, 0.917809, 0.321732) |
| w6 | 0110 | (0.963923, 0.374594, 0.335966, 1.001772) |
| w7 | 0111 | (0.864815, 0.291169, 0.284467, 0.299176) |
| w8 | 1000 | (0.400077, 0.935313, 0.975085, 0.955456) |
| w9 | 1001 | (0.281655, 0.906792, 0.941819, 0.290489) |
| w10 | 1010 | (0.384193, 1.120022, 0.3108, 0.875174) |
| w11 | 1011 | (0.294389, 1.020099, 0.302111, 0.266808) |
| w12 | 1100 | (0.305856, 0.294713, 0.824631, 0.992838) |
| w13 | 1101 | (0.25481, 0.285898, 0.751643, 0.298045) |
| w14 | 1110 | (0.289067, 0.356851, 0.238692, 0.822132) |
| w15 | 1111 | (0.294154, 0.340578, 0.244513, 0.277487) | wherein a transformed version of a non-uniform constellation is obtained from anyone of said constellations through a transformation including a rotation by an angle around the origin, an inversion of bit labels for all constellation points, an interchanging of bit positions and/or a predistortion for the constellation points.

16. A demodulation and decoding method comprising:
    demodulating constellation values of a non-uniform constellation into cell words and to assign bit combinations to constellation values of the used non-uniform constellation, and
    decoding cell words into output data,
wherein said demodulating uses, based on signalling information indicating the total number M of constellation points of the constellation, the signal-to-noise ratio SNR in dB and the number n of the dimension of the constellation, an n-dimensional non-uniform constellation from a group of constellations, wherein each constellation point of an n-dimensional constellation diagram is defined by an n-tupel of constellation values, said n-tupel of constellation values defining parameter settings of a transmission parameter used by a transmission apparatus for transmitting a transmission stream obtained by conversion of said constellation values, and
wherein said demodulating uses a total number M of constellation points of the constellation and a number n of the dimension of the constellation, which fulfill the condition that log 2(M)/n*2 is a non-integer number.

17. A demodulation and decoding method comprising:
    demodulating constellation values of a non-uniform constellation into cell words and to assign bit combinations to constellation values of the used non-uniform constellation, and
    decoding cell words into output data,
wherein said demodulating uses, based on signalling information indicating the total number M of constellation points of the constellation, the signal-to-noise ratio SNR and the number n of the dimension of the constellation, an n-dimensional non-uniform constellation from a group of constellations or a transformed version of an n-dimensional constellation from said group of constellations, wherein each constellation point of an n-dimensional constellation diagram is defined by an n-tupel of constellation values, said n-tupel of constellation values defining parameter settings of a transmission parameter used by a transmission apparatus for transmitting a transmission stream obtained by conversion of said constellation values, and
wherein the constellation position vectors of the different constellations of the group of constellation are defined as follows:

for n=3 and M=64:

| wk | LSB bit labels (b3 b4 b5) | $R_c = \frac{1}{4}$, 2.1 dB, (x, y, z) | $R_c = \frac{1}{2}$, 6.2 dB(x, y, z) |
|---|---|---|---|
| w0 | 000 | (0.679463, 1.203006, 0.519483) | (0.596549, 1.352959, 0.388406) |
| w1 | 001 | (0.483813, 0.629873, 0.355243) | (0.397732, 0.604735, 0.238847) |
| w2 | 010 | (1.252423, 0.629854, 0.629855) | (1.423781, 0.547468, 0.547469) |
| w3 | 011 | (0.759524, 0.40977, 0.40977) | (0.784715, 0.306821, 0.306822) |
| w4 | 100 | (0.456715, 0.900064, 0.900059) | (0.379632, 1.038068, 1.038067) |
| w5 | 101 | (0.349874, 0.510669, 0.51067) | (0.248578, 0.424422, 0.424422) |
| w6 | 110 | (0.679462, 0.519486, 1.203008) | (0.596547, 0.388406, 1.352962) |
| w7 | 111 | (0.483813, 0.355244, 0.629877) | (0.397731, 0.238846, 0.604736) |

| wk | LSB bit labels (b3 b4 b5) | $R_c = \frac{2}{3}$, 8.8 dB, (x, y, z) | $R_c = \frac{3}{4}$, 10 dB(x, y, z) |
|---|---|---|---|
| w0 | 000 | (0.37522, 0.535637, 1.329562) | (0.403465, 1.429603, 0.403469) |
| w1 | 001 | (0.585588, 1.369204, 0.585594) | (0.93451, 0.917081, 0.311174) |
| w2 | 010 | (1.046301, 0.382275, 1.046309) | (1.060679, 0.381871, 1.060697) |
| w3 | 011 | (1.329562, 0.535639, 0.375227) | (1.081152, 0.290324, 0.334489) |
| w4 | 100 | (0.214422, 0.399424, 0.691315) | (0.31117, 0.917076, 0.934521) |
| w5 | 101 | (0.309062, 0.906218, 0.30906) | (0.279161, 0.606528, 0.279155) |
| w6 | 110 | (0.363725, 0.212822, 0.363724) | (0.334483, 0.29031, 1.081104) |
| w7 | 111 | (0.691321, 0.399426, 0.214424) | (0.352778, 0.205563, 0.352752) |

| wk | LSB bit labels (b3 b4 b5) | $R_c = \frac{5}{6}$, 11.35 dB, (x, y, z) |
|---|---|---|
| w0 | 000 | (1.054178, 1.043246, 0.431268) |
| w1 | 001 | (0.373323, 1.37404, 0.341879) |
| w2 | 010 | (1.073002, 0.372189, 0.909371) |
| w3 | 011 | (0.952138, 0.27332, 0.278175) |
| w4 | 100 | (0.370565, 0.907662, 1.044718) |
| w5 | 101 | (0.277451, 0.740438, 0.314124) |
| w6 | 110 | (0.341752, 0.278121, 1.025684) |
| w7 | 111 | (0.308638, 0.239727, 0.33157) | for n=4 and M=4:

| wk | bit labels (b0 b1) | $R_c = \frac{1}{4}$, −4.25 dB, (x, y, z) | $R_c = \frac{1}{2}$, −0.85 dB, (x, y, z) |
|---|---|---|---|
| w0 | 00 | (0, 0.866025, 0.866025) | (0.341973, 0.732665, 0.91801) |
| w1 | 01 | (0, 0.866025, −0.86603) | (−0.04024, 0.896206, −0.83227) |
| w2 | 10 | (0, −0.86603, 0.866025) | (−0.63438, −0.76431, 0.713423) |
| w3 | 11 | (0, −0.86603, −0.86603) | (0.334075, −0.86322, −0.79958) |

| wk | bit labels (b0 b1) | $R_c = \frac{2}{3}$, 1.3 dB, (x, y, z) | $R_c = \frac{3}{4}$, 2.2 dB, (x, y, z) |
|---|---|---|---|
| w0 | 00 | (0.943009, 0.560703, 0.544745) | (0.349973, 0.944614, 0.675467) |
| w1 | 01 | (−0.54904, 0.974405, −0.49777) | (0.735879, 0.122954, −0.9589) |
| w2 | 10 | (−0.32303, −0.76353, 0.901148) | (−0.01644, −0.88366, 0.829) |
| w3 | 11 | (−0.06959, −0.77156, −0.94867) | (−1.06295, −0.18527, −0.55139) |

| wk | bit labels (b0 b1) | $R_c = \frac{5}{6}$, 3.35 dB, (x, y, z) |
|---|---|---|
| w0 | 00 | (−1.01648, 0.404423, 0.471229) |
| w1 | 01 | (0.725854, 0.939584, 0.117155) |
| w2 | 10 | (0.145172, −1.03649, 0.560528) |
| w3 | 11 | (0.140766, −0.29884, −1.13839) | for n=4 and M=64:

| wk | LSB bit labels (b4 b5) | $R_c = \frac{1}{4}$, 0.6 dB, (x, y, z, w) | $R_c = \frac{1}{2}$, 4.7 dB, (x, y, z, w) |
|---|---|---|---|
| w0 | 00 | (0.707102, 0.707102, 0.707101, 0.707101) | (0.594667, 1.342751, 0.5791, 0.579096) |
| w1 | 01 | (0.707102, 0.707102, 0.707101, 0.707102) | (0.594666, 0.522325, 1.200416, 0.386329) |
| w2 | 10 | (0.707101, 0.707102, 0.707102, 0.707101) | (0.594668, 0.522324, 0.386331, 1.200417) |
| w3 | 11 | (0.707102, 0.707101, 0.707102, 0.707102) | (0.5947, 0.260823, 0.394221, 0.394225) |

| wk | LSB bit labels (b4 b5) | $R_c = \frac{2}{3}$, 7.1 dB, (x, y, z, w) | $R_c = \frac{3}{4}$, 8.15 dB, (x, y, z, w) |
|---|---|---|---|
| w0 | 00 | (0.533719, 0.551776, 0.533618, 1.335255) | (0.415131, 0.47307, 0.473059, 1.174576) |
| w1 | 01 | (0.438941, 0.552091, 1.247518, 0.521329) | (0.473129, 0.415164, 1.174585, 0.473076) |
| w2 | 10 | (1.248209, 0.551665, 0.438372, 0.521793) | (0.473159, 1.174799, 0.415194, 0.473154) |
| w3 | 11 | (0.379345, 0.551627, 0.379809, 0.286494) | (1.174858, 0.473175, 0.473155, 0.415242) |

| wk | LSB bit labels (b4 b5) | $R_c = \frac{5}{6}$, 9.45 dB, (x, y, z, w) |
|---|---|---|
| w0 | 00 | (0.429225, 0.468636, 0.468558, 1.17263) |
| w1 | 01 | (0.468498, 0.429212, 1.172329, 0.468549) |
| w2 | 10 | (0.468597, 1.172764, 0.429245, 0.46863) |
| w3 | 11 | (1.172465, 0.468608, 0.468507, 0.429221) | for n=4 and M=256:

| wk | LSB bit labels (b4 b5 b6 b7) | $R_c = \frac{1}{4}$, 2.1 dB, (x, y, z, w) |
|---|---|---|
| w0 | 0000 | (0.853533, 0.853537, 0.435223, 0.853537) |
| w1 | 0001 | (1.388052, 0.570334, 0.570341, 0.570343) |
| w2 | 0010 | (0.535491, 0.53549, 0.326029, 0.535488) |
| w3 | 0011 | (0.770557, 0.406253, 0.406253, 0.406253) |
| w4 | 0100 | (0.570336, 0.57034, 0.570337, 1.388053) |
| w5 | 0101 | (0.853532, 0.435221, 0.853528, 0.853543) |
| w6 | 0110 | (0.406254, 0.406255, 0.406251, 0.770546) |
| w7 | 0111 | (0.535493, 0.32603, 0.535484, 0.535491) |
| w8 | 1000 | (0.570338, 1.388054, 0.570346, 0.570339) |
| w9 | 1001 | (0.853534, 0.853532, 0.853551, 0.435225) |
| w10 | 1010 | (0.406255, 0.770554, 0.406256, 0.406249) |
| w11 | 1011 | (0.535492, 0.53549, 0.535495, 0.326031) |
| w12 | 1100 | (0.435219, 0.853539, 0.85354, 0.853534) |
| w13 | 1101 | (0.570339, 0.570338, 1.388047, 0.570341) |
| w14 | 1110 | (0.32603, 0.535493, 0.535491, 0.535485) |
| w15 | 1111 | (0.406255, 0.406253, 0.770551, 0.406251) |

| wk | LSB bit labels (b4 b5 b6 b7) | $R_c = \frac{1}{2}$, 4.7 dB, (x, y, z, w) |
|---|---|---|
| w0 | 0000 | (1.526509, 0.402616, 0.631195, 0.631197) |
| w1 | 0001 | (0.602165, 0.480207, 1.520122, 0.438092) |
| w2 | 0010 | (1.25358, 1.046597, 0.444948, 0.444947) |
| w3 | 0011 | (0.552189, 1.201405, 1.024307, 0.313877) |
| w4 | 0100 | (0.942978, 0.243165, 0.411336, 0.411336) |
| w5 | 0101 | (0.429351, 0.270441, 0.879771, 0.304775) |
| w6 | 0110 | (0.752996, 0.432847, 0.287963, 0.28796) |
| w7 | 0111 | (0.376248, 0.491436, 0.538473, 0.221183) |
| w8 | 1000 | (0.602165, 0.48021, 0.438083, 1.520119) |
| w9 | 1001 | (0.400875, 0.468866, 1.189484, 1.189495) |
| w10 | 1010 | (0.55219, 1.201411, 0.313874, 1.024294) |
| w11 | 1011 | (0.300813, 1.415048, 0.466125, 0.466122) |
| w12 | 1100 | (0.42935, 0.270442, 0.304772, 0.879768) |
| w13 | 1101 | (0.266249, 0.279379, 0.63154, 0.631546) |
| w14 | 1110 | (0.376246, 0.491438, 0.221183, 0.538465) |
| w15 | 1111 | (0.22888, 0.552601, 0.354481, 0.35448) |

| wk | LSB bit labels (b4 b5 b6 b7) | $R_c = \frac{2}{3}$, 8.8 dB, (x, y, z, w) |
|---|---|---|
| w0 | 0000 | (1.018943, 0.365858, 1.199467, 0.481008) |
| w1 | 0001 | (0.331868, 0.361354, 1.310964, 0.283197) |
| w2 | 0010 | (1.558783, 0.459499, 0.486589, 0.463096) |
| w3 | 0011 | (1.10882, 1.198092, 0.44343, 0.399275) |
| w4 | 0100 | (0.685157, 0.196292, 0.575696, 0.442069) |
| w5 | 0101 | (0.332449, 0.279754, 0.526833, 0.246807) |
| w6 | 0110 | (1.003474, 0.302379, 0.281231, 0.436793) |
| w7 | 0111 | (0.676872, 0.666776, 0.261086, 0.255449) |
| w8 | 1000 | (0.396496, 0.465471, 1.097731, 1.183561) |
| w9 | 1001 | (0.330053, 1.038928, 1.168812, 0.447361) |
| w10 | 1010 | (0.439683, 1.062086, 0.441272, 1.301175) |
| w11 | 1011 | (0.371102, 1.447116, 0.450695, 0.467416) |
| w12 | 1100 | (0.282082, 0.246055, 0.399926, 0.957503) |
| w13 | 1101 | (0.170056, 0.386611, 0.345374, 0.425569) |
| w14 | 1110 | (0.776315, 0.39265, 0.276701, 1.241973) |
| w15 | 1111 | (0.268557, 0.861542, 0.245954, 0.354217) |

| wk | LSB bit labels (b4 b5 b6 b7) | $R_c = \frac{3}{4}$, 4.7 dB, (x, y, z, w) |
|---|---|---|
| w0 | 0000 | (1.177296, 1.1958, 0.498387, 0.389436) |
| w1 | 0001 | (1.493578, 0.394827, 0.380252, 0.355904) |
| w2 | 0010 | (0.869675, 0.903371, 0.298536, 0.906957) |
| w3 | 0011 | (0.764504, 0.533695, 0.24056, 0.280397) |
| w4 | 0100 | (1.035942, 0.403318, 1.013009, 0.971103) |
| w5 | 0101 | (0.972427, 0.325647, 0.998656, 0.300178) |
| w6 | 0110 | (0.80859, 0.29903, 0.327672, 1.144447) |
| w7 | 0111 | (0.649232, 0.205051, 0.350469, 0.357187) |
| w8 | 1000 | (0.3932, 1.544683, 0.41033, 0.388835) |
| w9 | 1001 | (0.348383, 1.035569, 1.060365, 0.330446) |
| w10 | 1010 | (0.271132, 0.997977, 0.349517, 0.907452) |
| w11 | 1011 | (0.236576, 0.713614, 0.327883, 0.278331) |
| w12 | 1100 | (0.319746, 0.398194, 1.126819, 1.073599) |
| w13 | 1101 | (0.309596, 0.330431, 1.191466, 0.335021) |
| w14 | 1110 | (0.228413, 0.325633, 0.370927, 1.102348) |
| w15 | 1111 | (0.203443, 0.239249, 0.425946, 0.367032) |

| wk | LSB bit labels (b4 b5 b6 b7) | $R_c = \frac{5}{6}$, 11.35 dB, (x, y, z, w) |
|---|---|---|
| w0 | 0000 | (1.077284, 0.957874, 1.034832, 0.441819) |
| w1 | 0001 | (0.412758, 0.398613, 1.528827, 0.375586) |
| w2 | 0010 | (1.076567, 1.07177, 0.324415, 0.428991) |
| w3 | 0011 | (1.514688, 0.385762, 0.382328, 0.357945) |
| w4 | 0100 | (0.414877, 0.390574, 0.394515, 1.572725) |
| w5 | 0101 | (0.822358, 0.246758, 0.917809, 0.321732) |

-continued

| wk | LSB bit labels (b4 b5 b6 b7) | $R_c = \frac{5}{6}$, 11.35 dB, (x, y, z, w) |
|---|---|---|
| w6 | 0110 | (0.963923, 0.374594, 0.335966, 1.001772) |
| w7 | 0111 | (0.864815, 0.291169, 0.284467, 0.299176) |
| w8 | 1000 | (0.400077, 0.935313, 0.975085, 0.955456) |
| w9 | 1001 | (0.281655, 0.906792, 0.941819, 0.290489) |
| w10 | 1010 | (0.384193, 1.120022, 0.3108, 0.875174) |
| w11 | 1011 | (0.294389, 1.020099, 0.302111, 0.266808) |
| w12 | 1100 | (0.305856, 0.294713, 0.824631, 0.992838) |
| w13 | 1101 | (0.25481, 0.285898, 0.751643, 0.298045) |
| w14 | 1110 | (0.289067, 0.356851, 0.238692, 0.822132) |
| w15 | 1111 | (0.294154, 0.340578, 0.244513, 0.277487) | wherein a transformed version of a non-uniform constellation is obtained from anyone of said constellations through a transformation including a rotation by an angle around the origin, an inversion of bit labels for all constellation points, an interchanging of bit positions and/or a predistortion for the constellation points.

18. Receiving apparatus comprising:
a receiver configured to receive one or more transmission streams,
a deconverter configured to deconvert one or more transmission streams into said constellation values, and
a demodulation and decoding apparatus as defined in embodiment 14 or 15 configured to demodulate and decode said constellation values into output data.

19. Receiving method comprising:
receiving one or more transmission streams,
deconverting one or more transmission streams into said constellation values, and
a demodulation and decoding method as defined in embodiment 16 or 17 for demodulating and decoding said constellation values into output data.

20. A computer program comprising program code means for causing a computer to perform the steps of said method as defined in embodiment 10, 11 or 16 or 17 when said computer program is carried out on a computer.

21. A non-transitory computer-readable recording medium that stores therein a computer program product, which, when executed by a processor, causes the method according to embodiment 10, 11, 16 or 17 to be performed.

22. Communications system comprising one or more transmission apparatus as defined in embodiment 12 and one or more receiving apparatus as defined in embodiment 18.

The invention claimed is:
1. A coding and modulation apparatus comprising
an encoder configured to encode input data into cell words, and
a modulator configured to modulate said cell words into constellation values of a non-uniform constellation and to assign bit combinations to constellation values of the used non-uniform constellation,
wherein said modulator is configured to use, based on a total number M of constellation points of the constellation, a signal-to-noise ratio SNR and a number n of the dimension of the constellation, an n-dimensional non-uniform constellation from a group of constellations, wherein each constellation point of an n-dimensional constellation diagram is defined by an n-tupel of constellation values, said n-tupel of constellation values defining parameter settings of a transmission parameter used by a transmission apparatus for transmitting a transmission stream obtained by conversion of said constellation values, and wherein said modulator is configured to use a constellation having the total number M of constellation points of the constellation and the number n of the dimension of the constellation which fulfill the condition that $\log 2(M)/n*2$ is a non-integer number.

2. The coding and modulation apparatus as claimed in claim 1,
wherein said n-tupel of constellation values defines real values or imaginary values or a combination of the real values and imaginary values of n' subcarriers at n' different frequencies or frequency ranges, n' symbols in one or more of time, space, different polarization, encoded by different codes, encoded by different orbital momentum, encoded by different wavelengths, or encoded by any other, preferably orthogonal dimensions used for transmitting the transmission stream, wherein n' is an integer equal to or less than n.

3. The coding and modulation apparatus as claimed in claim 1,
wherein said n-tupel of constellation values defines n different symbols coded in time, frequency, space, wavelengths, polarizations and/or spreading codes used for transmitting the transmission stream.

4. The coding and modulation apparatus as claimed in claim 1,
wherein n=3 with M=4 or M=16 or M=32 or M=256.

5. The coding and modulation apparatus as claimed in claim 1,
wherein constellation points of a 0-th sector of the n-dimensional constellation diagram are defined by a constellation position vector $w_{0\ldots p-1}$, wherein $p=M/(2^n)$ and wherein constellation points of the other sectors of the n-dimensional constellation diagram are obtained from the constellation position vector $w_{0\ldots p-1}$ by symmetry from the constellation points of the 0-th sector by inverting components from said dimensions, where the corresponding hit is a 1.

6. The coding and modulation apparatus as claimed in claim 5,
wherein n=3 and wherein
the constellation points of a zeroth sector are defined as
$w_{0\ldots p-1}=(x_{0\ldots p-1}, y_{0\ldots p-1}, z_{0\ldots p-1})$,
constellation points of a first sector are defined as
$w_{p\ldots 2p-1}=(x_{0\ldots p-1}, y_{0\ldots p-1}, -z_{0\ldots p-1})$,
constellation points of a second sector are defined as
$w_{2p\ldots 3p-1}=(x_{0\ldots p-1}, -y_{0\ldots p-1}, z_{0\ldots p-1})$,
constellation points of a third sector are defined as
$w_{3p\ldots 4p-1}=(x_{0\ldots p-1}, -y_{0\ldots p-1}, -z_{0\ldots p-1})_p$,
constellation points of a fourth sector are defined as
$w_{4p\ldots 5p-1}=(-x_{0\ldots p-1}, y_{0\ldots p-1}, z_{0\ldots p-1})$,
constellation points of a fifth sector are defined as
$w_{5p\ldots 6p-1}=(-x_{0\ldots p-1}, y_{0\ldots p-1}, -z_{0\ldots p-1})$,
constellation points of a sixth sector are defined as
$w_{6p\ldots 7p-1}=(-x_{0\ldots p-1}, -y_{0\ldots p-1}, z_{0\ldots p-1})$,
constellation points of a seventh sector are defined as
$w_{7p\ldots 8p-1}=(-x_{0\ldots p-1}, -y_{0\ldots p-1}, -z_{0\ldots p-1})$.

7. The coding and modulation apparatus as claimed in claim 6,
wherein constellation position vectors of different constellations of the group of constellations are defined as follows:
for M=16:

| wk | LSB bit label (b3) | $R_c = \frac{1}{4}$, −0.6 dB, (x, y, z) | $R_c = \frac{1}{2}$, 3.7 dB, (x, y, z) |
|---|---|---|---|
| w0 | 0 | (0.691896, 0.691896, 0.691896) | (0.632425, 1.084, 0.632421) |
| w1 | 1 | (0.691896, 0.691896, 0.691896) | (0.632407, 0.326843, 0.63241) |

| wk | LSB bit label | $R_c = \frac{2}{3}$, 6.15 dB, (x, y, z) | $R_c = \frac{3}{4}$, 7.2 dB, (x, y, z) |
|---|---|---|---|
| w0 | 0 | (1.188087, 0.609156, 0.609156) | (1.220012, 0.589151, 0.589151) |
| w1 | 1 | (0.322326, 0.609156, 0.609156) | (0.350927, 0.589151, 0.589151) |

| wk | LSB bit label | $R_c = \frac{2}{3}$, 6.15 dB, (x, y, z) |
|---|---|---|
| w0 | 0 | (1.188087, 0.609156, 0.609156) |
| w1 | 1 | (0.322326, 0.609156, 0.609156) | for M=32:

| wk | LSB bit labels | $R_c = \frac{1}{4}$, 1.1 dB, (x, y, z) | $R_c = \frac{1}{2}$, 5.25 dB, (x, y, z) |
|---|---|---|---|
| w0 | 00 | (0.690335, 0.690336, 0.690336) | (0.370608, 1.147041, 0.497338) |
| w1 | 01 | (0.690335, 0.690336, 0.690335) | (0.372189, 0.372195, 0.247177) |
| w2 | 10 | (0.690335, 0.690335, 0.690335) | (0.548205, 0.548173, 1.27875) |
| w3 | 11 | (0.690335, 0.690335, 0.690334) | (1.147088, 0.370576, 0.497294) |

| wk | LSB bit labels (b3 b4) | $R_c = \frac{2}{3}$, 7.75 dB, (x, y, z) | $R_c = \frac{3}{4}$, 8.9 dB, (x, y, z) |
|---|---|---|---|
| w0 | 00 | (0.414674, 0.490757, 1.175376) | (1.248342, 0.488399, 0.488399) |
| w1 | 01 | (0.500684, 1.256404, 0.500684) | (0.482637, 1.17234, 0.425703) |
| w2 | 10 | (0.357577, 0.272802, 0.357576) | (0.482637, 0.425703, 1.17234) |
| w3 | 11 | (1.175374, 0.490758, 0.414674) | (0.303138, 0.358435, 0.358435) |

| wk | LSB bit labels (b3 b4) | $R_c = \frac{5}{6}$, 10.15 dB, (x, y, z) |
|---|---|---|
| w0 | 00 | (0.436652, 0.477235, 1.175916) |
| w1 | 01 | (0.480841, 1.248777, 0.480841) |
| w2 | 10 | (0.364177, 0.331963, 0.364178) |
| w3 | 11 | (1.175911, 0.477235, 0.436653) | for M=256:

| wk | LSB bit labels (b3 b4 b5 b6 b7) | $R_c = \frac{1}{4}$, 4.6 dB, (x, y, z) | $R_c = \frac{1}{2}$, 9.5 dB, (x, y, z) |
|---|---|---|---|
| w0 | 00000 | (1.391424, 0.537778, 0.536699) | (1.429432, 0.398163, 0.927245) |
| w1 | 00001 | (1.390368, 0.53776, 0.537333) | (1.553649, 0.312171, 0.327864) |
| w2 | 00010 | (0.608379, 1.315757, 0.412757) | (1.127692, 1.137604, 0.822847) |
| w3 | 00011 | (0.609175, 1.315156, 0.412931) | (1.313641, 0.934611, 0.244387) |
| w4 | 00100 | (0.702969, 0.303528, 0.304283) | (0.773495, 0.185767, 0.31605) |
| w5 | 00101 | (0.703317, 0.303579, 0.304548) | (0.893113, 0.186002, 0.277308) |
| w6 | 00110 | (0.395919, 0.545612, 0.255704) | (0.688697, 0.357194, 0.194211) |
| w7 | 00111 | (0.395947, 0.545685, 0.255618) | (0.761811, 0.394269, 0.169599) |
| w8 | 01000 | (1.392334, 0.536933, 0.537948) | (0.863643, 0.428832, 1.004159) |
| w9 | 01001 | (1.391339, 0.537016, 0.538445) | (0.761645, 0.242249, 1.077306) |
| w10 | 01010 | (0.607268, 1.317332, 0.412865) | (0.756257, 0.933359, 0.614396) |
| w11 | 01011 | (0.608062, 1.316804, 0.41305) | (0.785824, 1.063219, 0.244593) |
| w12 | 01100 | (0.702795, 0.30336, 0.304291) | (0.674993, 0.296755, 0.638794) |
| w13 | 01101 | (0.703002, 0.303506, 0.304534) | (0.67095, 0.226702, 0.655424) |
| w14 | 01110 | (0.395779, 0.545624, 0.255644) | (0.616528, 0.621249, 0.381863) |
| w15 | 01111 | (0.395944, 0.545692, 0.255667) | (0.641013, 0.678244, 0.246624) |
| w16 | 10000 | (0.606175, 0.414212, 1.318067) | (0.354854, 0.938384, 1.458798) |
| w17 | 10001 | (0.607041, 0.414525, 1.317058) | (0.352171, 0.333193, 1.728259) |
| w18 | 10010 | (0.37928, 0.983804, 0.980257) | (0.355957, 1.396462, 0.985833) |
| w19 | 10011 | (0.379604, 0.983615, 0.980005) | (0.361284, 1.701687, 0.341124) |
| w20 | 10100 | (0.395741, 0.255653, 0.548129) | (0.203506, 0.176026, 0.303222) |
| w21 | 10101 | (0.395893, 0.255714, 0.548215) | (0.194748, 0.170239, 0.300007) |
| w22 | 10110 | (0.265615, 0.422714, 0.422469) | (0.210858, 0.323993, 0.184623) |
| w23 | 10111 | (0.265963, 0.422647, 0.422579) | (0.203866, 0.340975, 0.169679) |
| w24 | 11000 | (0.607335, 0.414274, 1.318682) | (0.256523, 0.590763, 1.05169) |
| w25 | 11001 | (0.608128, 0.414556, 1.317504) | (0.257717, 0.26481, 1.174993) |
| W26 | 11010 | (0.379128, 0.984779, 0.980523) | (0.261225, 1.012739, 0.674888) |
| W27 | 11011 | (0.379543, 0.984573, 0.980104) | (0.25703, 1.182464, 0.265684) |
| W28 | 11100 | (0.395559, 0.2556, 0.548077) | (0.216832, 0.332364, 0.667351) |
| W29 | 11101 | (0.39586, 0.255662, 0.548226) | (0.211855, 0.229282, 0.712741) |
| W30 | 11110 | (0.265722, 0.422654, 0.422423) | (0.217293, 0.656085, 0.395602) |
| W31 | 11111 | (0.265937, 0.422655, 0.422468) | (0.212499, 0.722301, 0.249911) |

| wk | LSB bit labels (b3 b4 b5 b6 b7) | $R_c = \frac{2}{3}$, 12.7 dB, (x, y, z) | $R_c = \frac{3}{4}$, 13.95 dB, (x, y, z) |
|---|---|---|---|
| w0 | 00000 | (1.343305, 0.258839, 0.905613) | (1.101193, 0.287274, 1.166548) |
| w1 | 00001 | (1.653074, 0.297672, 0.298597) | (0.718369, 0.7336, 1.291105) |
| w2 | 00010 | (0.836679, 1.155234, 0.887482) | (0.909009, 1.182066, 0.828725) |
| w3 | 00011 | (0.846096, 1.355831, 0.285278) | (1.021304, 1.280747, 0.269414) |
| w4 | 00100 | (1.07458, 0.241858, 0.55583) | (1.278737, 0.233583, 0.692592) |
| w5 | 00101 | (1.133165, 0.248172, 0.190841) | (1.398787, 0.250328, 0.232729) |
| w6 | 00110 | (1.181242, 0.818235, 0.627621) | (1.206118, 0.722294, 0.708509) |
| w7 | 00111 | (1.149102, 0.804038, 0.189449) | (1.281864, 0.755211, 0.231533) |
| w8 | 01000 | (0.755465, 0.284716, 1.008276) | (0.672049, 0.212704, 0.996451) |
| w9 | 01001 | (0.888842, 0.419518, 1.423497) | (0.57653, 0.264725, 1.521955) |
| w10 | 01010 | (0.58939, 0.83449, 0.711894) | (0.630766, 0.937927, 0.623456) |
| w11 | 01011 | (0.548364, 1.014431, 0.219027) | (0.66374, 1.031859, 0.205958) |

-continued

| wk | LSB bit labels (b3 b4 b5 b6 b7) | $R_c = \frac{2}{3}$, 12.7 dB, (x, y, z) | $R_c = \frac{3}{4}$, 13.95 dB, (x, y, z) |
|---|---|---|---|
| w12 | 01100 | (0.745729, 0.247254, 0.598898) | (0.819385, 0.191617, 0.604012) |
| w13 | 01101 | (0.766941, 0.239596, 0.172946) | (0.924414, 0.182819, 0.19408) |
| w14 | 01110 | (0.674978, 0.62609, 0.528374) | (0.769625, 0.575065, 0.558614) |
| w15 | 01111 | (0.675358, 0.667302, 0.180638) | (0.842053, 0.600778, 0.18191) |
| w16 | 10000 | (0.178402, 0.185285, 1.038702) | (0.178261, 0.535628, 0.900182) |
| w17 | 10001 | (0.25, 0.235426, 1.568714) | (0.231277, 0.796575, 1.271811) |
| w18 | 10010 | (0.261156, 1.33729, 0.878516) | (0.152399, 0.822021, 0.618383) |
| w19 | 10011 | (0.266087, 1.53472, 0.30611) | (0.154969, 0.961509, 0.192206) |
| w20 | 10100 | (0.183339, 0.149536, 0.573941) | (0.137965, 0.192885, 0.483028) |
| w21 | 10101 | (0.202492, 0.136486, 0.158969) | (0.153851, 0.157216, 0.14491) |
| w22 | 10110 | (0.130754, 0.380778, 0.465579) | (0.174913, 0.520994, 0.423138) |
| w23 | 10111 | (0.13933, 0.396971, 0.161478) | (0.177189, 0.551046, 0.142485) |
| w24 | 11000 | (0.306845, 0.446148, 1.017434) | (0.269912, 0.197038, 0.937937) |
| w25 | 11001 | (0.30214, 0.747504, 1.423036) | (0.185149, 0.241634, 1.348998) |
| W26 | 11010 | (0.205177, 0.839299, 0.735868) | (0.259272, 1.270761, 0.749748) |
| W27 | 11011 | (0.185724, 1.020661, 0.231692) | (0.292049, 1.408482, 0.251353) |
| W28 | 11100 | (0.427269, 0.195848, 0.575282) | (0.426855, 0.170853, 0.541078) |
| W29 | 11101 | (0.480322, 0.168181, 0.170142) | (0.513888, 0.14643, 0.160061) |
| W30 | 11110 | (0.26548, 0.542545, 0.503715) | (0.466208, 0.474992, 0.44874) |
| W31 | 11111 | (0.279242, 0.590904, 0.172853) | (0.500401, 0.489788, 0.15146) |

| wk | LSB bit labels (b3 b4 b5 b6 b7) | $R_c = \frac{5}{6}$, 15.45 dB, (x, y, z) |
|---|---|---|
| w0 | 00000 | (1.254297, 0.574474, 0.88026) |
| w1 | 00001 | (1.107652, 0.238669, 1.200131) |
| w2 | 00010 | (1.097414, 1.027282, 0.722321) |
| w3 | 00011 | (1.082096, 1.156092, 0.240388) |
| w4 | 00100 | (1.206207, 0.21086, 0.602033) |
| w5 | 00101 | (1.115324, 0.208099, 0.190236) |
| w6 | 00110 | (1.616343, 0.291166, 0.294612) |
| w7 | 00111 | (1.237262, 0.65891, 0.227076) |
| w8 | 01000 | (0.708095, 0.687441, 1.091113) |
| w9 | 01001 | (0.664762, 0.224974, 1.17923) |
| w10 | 01010 | (0.644694, 1.009005, 0.693976) |
| w11 | 01011 | (0.645408, 1.080649, 0.224736) |
| w12 | 01100 | (0.7952, 0.203153, 0.647895) |
| w13 | 01101 | (0.786624, 0.191832, 0.202889) |
| w14 | 01110 | (0.762702, 0.597428, 0.559978) |
| w15 | 01111 | (0.800746, 0.643386, 0.185824) |
| w16 | 10000 | (0.190358, 0.536088, 0.956684) |
| w17 | 10001 | (0.182646, 0.181316, 1.076609) |
| w18 | 10010 | (0.169994, 0.866658, 0.634329) |
| w19 | 10011 | (0.172607, 0.964935, 0.204401) |
| w20 | 10100 | (0.150012, 0.187426, 0.575888) |
| w21 | 10101 | (0.150265, 0.169281, 0.180211) |
| w22 | 10110 | (0.162646, 0.53328, 0.491695) |
| w23 | 10111 | (0.158286, 0.556568, 0.164049) |
| w24 | 11000 | (0.260503, 0.882538, 1.22795) |
| w25 | 11001 | (0.276665, 0.306865, 1.497888) |
| W26 | 11010 | (0.258308, 1.277101, 0.781922) |
| W27 | 11011 | (0.270741, 1.40421, 0.259311) |
| W28 | 11100 | (0.460927, 0.177792, 0.583242) |
| W29 | 11101 | (0.466486, 0.170962, 0.184284) |
| W30 | 11110 | (0.464564, 0.521728, 0.505695) |
| W31 | 11111 | (0.468916, 0.544605, 0.164798) | or are defined by a transformed version of a constellation from said group of constellations, wherein a transformed version of Rail the non-uniform constellation is obtained from anyone of said constellations through a transformation including a rotation by an angle around an origin, an inversion of bit labels for all constellation points, an interchanging of bit positions and/or a predistortion for the constellation points.

8. The coding and modulation apparatus as claimed in claim 1,
wherein n=3 and M=4 and wherein the constellation position vectors of different constellations of the group of constellations are defined as follows:

| wk | bit labels (b0 b1) | $R_c = \frac{1}{4}$, 1.1 dB, (x, y, z) | $R_c = \frac{1}{2}$, 5.25 dB, (x, y, z) |
|---|---|---|---|
| w0 | 00 | (0, 0.866025, 0.866025) | (0.341973, 0.732665, 0.91801) |
| w1 | 01 | (0, 0.866025, −0.86603) | (−0.04024, 0.896206, −0.83227) |
| w2 | 10 | (0, −0.86603, 0.866025) | (−0.63438, −0.76431, 0.713423) |
| w3 | 11 | (0, −0.86603, −0.86603) | (0.334075, −0.86322, −0.79958) |

| wk | bit labels (b0 b1) | $R_c = \frac{2}{3}$, 1.3 dB, (x, y, z) | $R_c = \frac{3}{4}$, 2.2 dB, (x, y, z) |
|---|---|---|---|
| w0 | 00 | (0.943009, 0.560703, 0.544745) | (0.349973, 0.944614, 0.675467) |
| w1 | 01 | (−0.54904, 0.974405, −0.49777) | (0.735879, 0.122954, −0.9589) |

-continued

| wk | bit labels (b0 b1) | $R_c = \frac{2}{3}$, 1.3 dB, (x, y, z) | $R_c = \frac{3}{4}$, 2.2 dB, (x, y, z) |
|---|---|---|---|
| w2 | 10 | (−0.32303, −0.76353, 0.901148) | (−0.01644, −0.88366, 0.829) |
| w3 | 11 | (−0.06959, −0.77156, −0.94867) | (−1.06295, −0.18527, −0.55139) |

| wk | bit labels (b0 b1) | $R_c = \frac{5}{6}$, 3.35 dB, (x, y, z) |
|---|---|---|
| w0 | 00 | (−1.01648, 0.404423, 0.471229) |
| w1 | 01 | (0.725854, 0.939584, 0.117155) |
| w2 | 10 | (0.145172, −1.03649, 0.560528) |
| w3 | 11 | (0.140766, −0.29884, −1.13839) | or are defined by a transformed version of a constellation from said group of constellations, wherein a transformed version of Hall the non-uniform constellation is obtained from anyone of said constellations through a transformation including a rotation by an angle around an origin, an inversion of bit labels for all constellation points, an interchanging of bit positions and/or a predistortion for the constellation points.

9. A transmission apparatus comprising:
a coding and modulation apparatus as claimed in claim 1 configured to encode and modulate the input data into the constellation values,
a converter configured to convert said constellation values into one or more transmission streams to be transmitted, and
a transmitter configured to transmit said one or more transmission streams.

10. A coding and modulation apparatus comprising
an encoder configured to encode input data into cell words, and
a modulator configured to modulate said cell words into constellation values of a non-uniform constellation and to assign bit combinations to constellation values of the used non-uniform constellation,
wherein said modulator is configured to use, based on a total number M of constellation points of the constellation, a signal-to-noise ratio SNR and a number n of the dimension of the constellation, an n-dimensional non-uniform constellation from a group of constellations or a transformed version of an n-dimensional constellation from said group of constellations, wherein each constellation point of an n-dimensional constellation diagram is defined by an n-tupel of constellation values, said n-tupel of constellation values defining parameter settings of a transmission parameter used by a transmission apparatus for transmitting a transmission stream obtained by conversion of said constellation values, and
wherein constellation position vectors of different constellations of the group of constellation are defined as follows: for n=3 and M=64:

| wk | LSB bit labels (b3 b4 b5) | $R_c = \frac{1}{4}$, 2.1 dB, (x, y, z) | $R_c = \frac{1}{2}$, 6.2 dB (x, y, z) |
|---|---|---|---|
| w0 | 000 | (0.679463, 1.203006, 0.519483) | (0.596549, 1.352959, 0.388406) |
| w1 | 001 | (0.483813, 0.629873, 0.355243) | (0.397732, 0.604735, 0.238847) |
| w2 | 010 | (1.252423, 0.629854, 0.629855) | (1.423781, 0.547468, 0.547469) |
| w3 | 011 | (0.759524, 0.40977, 0.40977) | (0.784715, 0.306821, 0.306822) |
| w4 | 100 | (0.456715, 0.900064, 0.900059) | (0.379632, 1.038068, 1.038067) |
| w5 | 101 | (0.349874, 0.510669, 0.51067) | (0.248578, 0.424422, 0.424422) |
| w6 | 110 | (0.679462, 0.519486, 1.203008) | (0.596547, 0.388406, 1.352962) |
| w7 | 111 | (0.483813, 0.355244, 0.629877) | (0.397731, 0.238846, 0.604736) |

| wk | LSB bit labels (b3 b4 b5) | $R_c = \frac{2}{3}$, 8.8 dB, (x, y, z) | $R_c = \frac{3}{4}$, 10 dB (x, y, z) |
|---|---|---|---|
| w0 | 000 | (0.37522, 0.535637, 1.329562) | (0.403465, 1.429603, 0.403469) |
| w1 | 001 | (0.585588, 1.369204, 0.585594) | (0.93451, 0.917081, 0.311174) |
| w2 | 010 | (1.046301, 0.382275, 1.046309) | (1.060679, 0.381871, 1.060697) |
| w3 | 011 | (1.329562, 0.535639, 0.375227) | (1.081152, 0.290324, 0.334489) |
| w4 | 100 | (0.214422, 0.399424, 0.691315) | (0.31117, 0.917076, 0.934521) |
| w5 | 101 | (0.309062, 0.906218, 0.30906) | (0.279161, 0.606528, 0.279155) |
| w6 | 110 | (0.363725, 0.212822, 0.363724) | (0.334483, 0.29031, 1.081104) |
| w7 | 111 | (0.691321, 0.399426, 0.214424) | (0.352778, 0.205563, 0.352752) |

| wk | LSB bit labels (b3 b4 b5) | $R_c = \frac{5}{6}$, 11.35 dB, (x, y, z) |
|---|---|---|
| w0 | 000 | (1.054178, 1.043246, 0.431268) |
| w1 | 001 | (0.373323, 1.37404, 0.341879) |
| w2 | 010 | (1.073002, 0.372189, 0.909371) |
| w3 | 011 | (0.952138, 0.27332, 0.278175) |
| w4 | 100 | (0.370565, 0.907662, 1.044718) |
| w5 | 101 | (0.277451, 0.740438, 0.314124) |
| w6 | 110 | (0.341752, 0.278121, 1.025684) |
| w7 | 111 | (0.308638, 0.239727, 0.33157) | for n=4 and M=4:

| wk | bit labels (b0 b1) | $R_c = \frac{1}{4}$, −4.25 dB, (x, y, z) | $R_c = \frac{1}{2}$, −0.85 dB, (x, y, z) |
|---|---|---|---|
| w0 | 00 | (0, 0.866025, 0.866025) | (0.341973, 0.732665, 0.91801) |
| w1 | 01 | (0, 0.866025, −0.86603) | (−0.04024, 0.896206, −0.83227) |
| w2 | 10 | (0, −0.86603, 0.866025) | (−0.63438, −0.76431, 0.713423) |
| w3 | 11 | (0, −0.86603, −0.86603) | (0.334075, −0.86322, −0.79958) |

| wk | bit labels (b0 b1) | $R_c = \frac{2}{3}$, 1.3 dB, (x, y, z) | $R_c = \frac{3}{4}$, 2.2 dB, (x, y, z) |
|---|---|---|---|
| w0 | 00 | (0.943009, 0.560703, 0.544745) | (0.349973, 0.944614, 0.675467) |
| w1 | 01 | (−0.54904, 0.974405, −0.49777) | (0.735879, 0.122954, −0.9589) |
| w2 | 10 | (−0.32303, −0.76353, 0.901148) | (−0.01644, −0.88366, 0.829) |
| w3 | 11 | (−0.06959, −0.77156, −0.94867) | (−1.06295, −0.18527, −0.55139) |

| wk | bit labels (b0 b1) | $R_c = \frac{5}{6}$, 3.35 dB, (x, y, z) |
|---|---|---|
| w0 | 00 | (−1.01648, 0.404423, 0.471229) |
| w1 | 01 | (0.725854, 0.939584, 0.117155) |
| w2 | 10 | (0.145172, −1.03649, 0.560528) |
| w3 | 11 | (0.140766, −0.29884, −1.13839) | for n=4 and M=64:

| wk | LSB bit labels (b4 b5) | $R_c = \frac{1}{4}$, 0.6 dB, (x, y, z, w) | $R_c = \frac{1}{2}$, 4.7 dB, (x, y, z, w) |
|---|---|---|---|
| w0 | 00 | (0.707102, 0.707102, 0.707101, 0.707101) | (0.594667, 1.342751, 0.5791, 0.579096) |
| w1 | 01 | (0.707102, 0.707102, 0.707101, 0.707102) | (0.594666, 0.522325, 1.200416, 0.386329) |
| w2 | 10 | (0.707101, 0.707102, 0.707102, 0.707101) | (0.594668, 0.522324, 0.386331, 1.200417) |
| w3 | 11 | (0.707102, 0.707101, 0.707102, 0.707102) | (0.5947, 0.260823, 0.394221, 0.394225) |

| wk | LSB bit labels (b4 b5) | $R_c = \frac{2}{3}$, 7.1 dB, (x, y, z, w) | $R_c = \frac{3}{4}$, 8.15 dB, (x, y, z, w) |
|---|---|---|---|
| w0 | 00 | (0.533719, 0.551776, 0.533618, 1.335255) | (0.415131, 0.47307, 0.473059, 1.174576) |
| w1 | 01 | (0.438941, 0.552091, 1.247518, 0.521329) | (0.473129, 0.415164, 1.174585, 0.473076) |
| w2 | 10 | (1.248209, 0.551665, 0.438372, 0.521793) | (0.473159, 1.174799, 0.415194, 0.473154) |
| w3 | 11 | (0.379345, 0.551627, 0.379809, 0.286494) | (1.174858, 0.473175, 0.473155, 0.415242) |

| wk | LSB bit labels (b4 b5) | $R_c = \frac{5}{6}$, 9.45 dB, (x, y, z, w) |
|---|---|---|
| w0 | 00 | (0.429225, 0.468636, 0.468558, 1.17263) |
| w1 | 01 | (0.468498, 0.429212, 1.172329, 0.468549) |
| w2 | 10 | (0.468597, 1.172764, 0.429245, 0.46863) |
| w3 | 11 | (1.172465, 0.468608, 0.468507, 0.429221) | for n=4 and M=256:

| wk | LSB bit labels (b4 b5 b6 b7) | $R_c = \frac{1}{4}$, 2.1 dB, (x, y, z, w) |
|---|---|---|
| w0 | 0000 | (0.853533, 0.853537, 0.435223, 0.853537) |
| w1 | 0001 | (1.388052, 0.570334, 0.570341, 0.570343) |
| w2 | 0010 | (0.535491, 0.53549, 0.326029, 0.535488) |
| w3 | 0011 | (0.770557, 0.406253, 0.406253, 0.406253) |
| w4 | 0100 | (0.570336, 0.57034, 0.570337, 1.388053) |
| w5 | 0101 | (0.853532, 0.435221, 0.853528, 0.853543) |
| w6 | 0110 | (0.406254, 0.406255, 0.406251, 0.770546) |
| w7 | 0111 | (0.535493, 0.32603, 0.535484, 0.535491) |
| w8 | 1000 | (0.570338, 1.388054, 0.570346, 0.570339) |
| w9 | 1001 | (0.853534, 0.853532, 0.853551, 0.435225) |
| w10 | 1010 | (0.406255, 0.770554, 0.406256, 0.406249) |
| w11 | 1011 | (0.535492, 0.53549, 0.535495, 0.326031) |
| w12 | 1100 | (0.435219, 0.853539, 0.85354, 0.853534) |
| w13 | 1101 | (0.570339, 0.570338, 1.388047, 0.570341) |
| w14 | 1110 | (0.32603, 0.535493, 0.535491, 0.535485) |
| w15 | 1111 | (0.406255, 0.406253, 0.770551, 0.406251) |

| wk | LSB bit labels (b4 b5 b6 b7) | $R_c = \frac{1}{2}$, 4.7 dB, (x, y, z, w) |
|---|---|---|
| w0 | 0000 | (1.526509, 0.402616, 0.631195, 0.631197) |
| w1 | 0001 | (0.602165, 0.480207, 1.520122, 0.438092) |
| w2 | 0010 | (1.25358, 1.046597, 0.444948, 0.444947) |
| w3 | 0011 | (0.552189, 1.201405, 1.024307, 0.313877) |
| w4 | 0100 | (0.942978, 0.243165, 0.411336, 0.411336) |
| w5 | 0101 | (0.429351, 0.270441, 0.879771, 0.304775) |
| w6 | 0110 | (0.752996, 0.432847, 0.287963, 0.28796) |
| w7 | 0111 | (0.376248, 0.491436, 0.538473, 0.221183) |
| w8 | 1000 | (0.602165, 0.48021, 0.438083, 1.520119) |
| w9 | 1001 | (0.400875, 0.468866, 1.189484, 1.189495) |
| w10 | 1010 | (0.55219, 1.201411, 0.313874, 1.024294) |
| w11 | 1011 | (0.300813, 1.415048, 0.466125, 0.466122) |
| w12 | 1100 | (0.42935, 0.270442, 0.304772, 0.879768) |
| w13 | 1101 | (0.266249, 0.279379, 0.63154, 0.631546) |
| w14 | 1110 | (0.376246, 0.491438, 0.221183, 0.538465) |
| w15 | 1111 | (0.22888, 0.552601, 0.354481, 0.35448) |

| wk | LSB bit labels (b4 b5 b6 b7) | $R_c = \frac{2}{3}$, 8.8 dB, (x, y, z, w) |
|---|---|---|
| w0 | 0000 | (1.018943, 0.365858, 1.199467, 0.481008) |
| w1 | 0001 | (0.331868, 0.361354, 1.310964, 0.283197) |
| w2 | 0010 | (1.558783, 0.459499, 0.486589, 0.463096) |
| w3 | 0011 | (1.10882, 1.198092, 0.44343, 0.399275) |
| w4 | 0100 | (0.685157, 0.196292, 0.575696, 0.442069) |
| w5 | 0101 | (0.332449, 0.279754, 0.526833, 0.246807) |
| w6 | 0110 | (1.003474, 0.302379, 0.281231, 0.436793) |
| w7 | 0111 | (0.676872, 0.666776, 0.261086, 0.255449) |
| w8 | 1000 | (0.396496, 0.465471, 1.097731, 1.183561) |
| w9 | 1001 | (0.330053, 1.038928, 1.168812, 0.447361) |
| w10 | 1010 | (0.439683, 1.062086, 0.441272, 1.301175) |
| w11 | 1011 | (0.371102, 1.447116, 0.450695, 0.467416) |
| w12 | 1100 | (0.282082, 0.246055, 0.399926, 0.957503) |
| w13 | 1101 | (0.170056, 0.386611, 0.345374, 0.425569) |
| w14 | 1110 | (0.776315, 0.39265, 0.276701, 1.241973) |
| w15 | 1111 | (0.268557, 0.861542, 0.245954, 0.354217) |

| wk | LSB bit labels (b4 b5 b6 b7) | $R_c = \frac{3}{4}$, 4.7 dB, (x, y, z, w) |
|---|---|---|
| w0 | 0000 | (1.177296, 1.1958, 0.498387, 0.389436) |
| w1 | 0001 | (1.493578, 0.394827, 0.380252, 0.355904) |
| w2 | 0010 | (0.869675, 0.903371, 0.298536, 0.906957) |
| w3 | 0011 | (0.764504, 0.533695, 0.24056, 0.280397) |
| w4 | 0100 | (1.035942, 0.403318, 1.013009, 0.971103) |
| w5 | 0101 | (0.972427, 0.325647, 0.998656, 0.300178) |
| w6 | 0110 | (0.80859, 0.29903, 0.327672, 1.144447) |
| w7 | 0111 | (0.649232, 0.205051, 0.350469, 0.357187) |
| w8 | 1000 | (0.3932, 1.544683, 0.41033, 0.388835) |
| w9 | 1001 | (0.348383, 1.035569, 1.060365, 0.330446) |
| w10 | 1010 | (0.271132, 0.997977, 0.349517, 0.907452) |
| w11 | 1011 | (0.236576, 0.713614, 0.327883, 0.278331) |
| w12 | 1100 | (0.319746, 0.398194, 1.126819, 1.073599) |
| w13 | 1101 | (0.309596, 0.330431, 1.191466, 0.335021) |
| w14 | 1110 | (0.228413, 0.325633, 0.370927, 1.102348) |
| w15 | 1111 | (0.203443, 0.239249, 0.425946, 0.367032) |

| wk | LSB bit labels (b4 b5 b6 b7) | $R_c = \frac{5}{6}$, 11.35 dB, (x, y, z, w) |
|---|---|---|
| w0 | 0000 | (1.077284, 0.957874, 1.034832, 0.441819) |
| w1 | 0001 | (0.412758, 0.398613, 1.528827, 0.375586) |
| w2 | 0010 | (1.076567, 1.07177, 0.324415, 0.428991) |
| w3 | 0011 | (1.514688, 0.385762, 0.382328, 0.357945) |
| w4 | 0100 | (0.414877, 0.390574, 0.394515, 1.572725) |
| w5 | 0101 | (0.822358, 0.246758, 0.917809, 0.321732) |
| w6 | 0110 | (0.963923, 0.374594, 0.335966, 1.001772) |
| w7 | 0111 | (0.864815, 0.291169, 0.284467, 0.299176) |
| w8 | 1000 | (0.400077, 0.935313, 0.975085, 0.955456) |
| w9 | 1001 | (0.281655, 0.906792, 0.941819, 0.290489) |
| w10 | 1010 | (0.384193, 1.120022, 0.3108, 0.875174) |
| w11 | 1011 | (0.294389, 1.020099, 0.302111, 0.266808) |
| w12 | 1100 | (0.305856, 0.294713, 0.824631, 0.992838) |
| w13 | 1101 | (0.25481, 0.285898, 0.751643, 0.298045) |
| w14 | 1110 | (0.289067, 0.356851, 0.238692, 0.822132) |
| w15 | 1111 | (0.294154, 0.340578, 0.244513, 0.277487) | wherein a transformed version of the non-uniform constellation is obtained from anyone of said constellations through a transformation including a rotation by an angle around an origin, an inversion of bit labels for all constellation points, an interchanging of bit positions and/or a predistortion for the constellation points.

11. A coding and modulation method comprising encoding input data into cell words, and modulating said cell words into constellation values of a non-uniform constellation and to assign bit combinations to constellation values of the used non-uniform constellation, wherein said modulating uses, based on a total number M of constellation points of the constellation and a signal-to-noise ratio SNR, an n-dimensional non-uniform constellation from a group of constellations, wherein each constellation point of an n-dimensional constellation diagram is defined by an n-tupel of constellation values, said n-tupel of constellation values defining parameter settings of a transmission parameter used by a transmission apparatus for transmitting a transmission stream obtained by conversion of said constellation values, and wherein said modulating uses a constellation having the total number M of constellation points of the constellation and a number n of a dimension of the constellation which fulfill the condition that log 2(M)/n*2 is a non-integer number.

12. A transmission method comprising:

a coding and modulation method as claimed in claim 11 that encodes and modulates the input data into the constellation values, converting said constellation values into one or more transmission streams to be transmitted, and transmitting said one or more transmission streams.

13. A non-transitory computer-readable recording medium that stores therein a computer program product, which, when executed by a processor, causes the method according to claim 11 to be performed.

14. A coding and modulation method comprising encoding input data into cell words, and modulating said cell words into constellation values of a non-uniform constellation and to assign bit combinations to constellation values of the used non-uniform constellation, wherein said modulating uses, based on a total number M of constellation points of the constellation, a signal-to-noise ratio SNR and a number n of the dimension of the constellation, an n-dimensional non-uniform constellation from a group of constellations or a transformed version of an n-dimensional constellation from said group of constellations, wherein each constellation point of an n-dimensional constellation diagram is defined by an n-tupel of constellation values, said n-tupel of constellation values defining parameter settings of a transmission parameter used by a transmission apparatus for transmitting a transmission stream obtained by conversion of said constellation values, and wherein constellation position vectors of different constellations of the group of constellation are defined as follows:

for n=3 and M=64:

| wk | LSB bit labels (b3 b4 b5) | $R_c = \frac{1}{4}$, 2.1 dB, (x, y, z) | $R_c = \frac{1}{2}$, 6.2 dB (x, y, z) |
|---|---|---|---|
| w0 | 000 | (0.679463, 1.203006, 0.519483) | (0.596549, 1.352959, 0.388406) |
| w1 | 001 | (0.483813, 0.629873, 0.355243) | (0.397732, 0.604735, 0.238847) |
| w2 | 010 | (1.252423, 0.629854, 0.629855) | (1.423781, 0.547468, 0.547469) |
| w3 | 011 | (0.759524, 0.40977, 0.40977) | (0.784715, 0.306821, 0.306822) |
| w4 | 100 | (0.456715, 0.900064, 0.900059) | (0.379632, 1.038068, 1.038067) |
| w5 | 101 | (0.349874, 0.510669, 0.51067) | (0.248578, 0.424422, 0.424422) |
| w6 | 110 | (0.679462, 0.519486, 1.203008) | (0.596547, 0.388406, 1.352962) |
| w7 | 111 | (0.483813, 0.355244, 0.629877) | (0.397731, 0.238846, 0.604736) |

| wk | LSB bit labels (b3 b4 b5) | $R_c = \frac{2}{3}$, 8.8 dB, (x, y, z) | $R_c = \frac{3}{4}$, 10 dB (x, y, z) |
|---|---|---|---|
| w0 | 000 | (0.37522, 0.535637, 1.329562) | (0.403465, 1.429603, 0.403469) |
| w1 | 001 | (0.585588, 1.369204, 0.585594) | (0.93451, 0.917081, 0.311174) |
| w2 | 010 | (1.046301, 0.382275, 1.046309) | (1.060679, 0.381871, 1.060697) |
| w3 | 011 | (1.329562, 0.535639, 0.375227) | (1.081152, 0.290324, 0.334489) |
| w4 | 100 | (0.214422, 0.399424, 0.691315) | (0.31117, 0.917076, 0.934521) |
| w5 | 101 | (0.309062, 0.906218, 0.30906) | (0.279161, 0.606528, 0.279155) |
| w6 | 110 | (0.363725, 0.212822, 0.363724) | (0.334483, 0.29031, 1.081104) |
| w7 | 111 | (0.691321, 0.399426, 0.214424) | (0.352778, 0.205563, 0.352752) |

| wk | LSB bit labels (b3 b4 b5) | $R_c = \frac{5}{6}$, 11.35 dB, (x, y, z) |
|---|---|---|
| w0 | 000 | (1.054178, 1.043246, 0.431268) |
| w1 | 001 | (0.373323, 1.37404, 0.341879) |
| w2 | 010 | (1.073002, 0.372189, 0.909371) |
| w3 | 011 | (0.952138, 0.27332, 0.278175) |
| w4 | 100 | (0.370565, 0.907662, 1.044718) |
| w5 | 101 | (0.277451, 0.740438, 0.314124) |
| w6 | 110 | (0.341752, 0.278121, 1.025684) |
| w7 | 111 | (0.308638, 0.239727, 0.33157) | for n=4 and M=4:

| wk | bit labels (b0 b1) | $R_c = \frac{1}{4}$, 4.25 dB, (x, y, z) | $R_c = \frac{1}{2}$, 0.85 dB, (x, y, z) |
|---|---|---|---|
| w0 | 00 | (0, 0.866025, 0.866025) | (0.341973, 0.732665, 0.91801) |
| w1 | 01 | (0, 0.866025, −0.86603) | (−0.04024, 0.896206, −0.83227) |
| w2 | 10 | (0, −0.86603, 0.866025) | (−0.63438, −0.76431, 0.713423) |
| w3 | 11 | (0, −0.86603, −0.86603) | (0.334075, −0.86322, −0.79958) |

| wk | bit labels (b0 b1) | $R_c = \frac{2}{3}$, 1.3 dB, (x, y, z) | $R_c = \frac{3}{4}$, 2.2 dB, (x, y, z) |
|---|---|---|---|
| w0 | 00 | (0.943009, 0.560703, 0.544745) | (0.349973, 0.944614, 0.675467) |
| w1 | 01 | (−0.54904, 0.974405, −0.49777) | (0.735879, 0.122954, −0.9589) |
| w2 | 10 | (−0.32303, −0.76353, 0.901148) | (−0.01644, −0.88366, 0.829) |
| w3 | 11 | (−0.06959, −0.77156, −0.94867) | (−1.06295, −0.18527, −0.55139) |

| wk | bit labels (b0 b1) | $R_c = \frac{5}{6}$, 3.35 dB, (x, y, z) |
|---|---|---|
| w0 | 00 | (−1.01648, 0.404423, 0.471229) |
| w1 | 01 | (0.725854, 0.939584, 0.117155) |
| w2 | 10 | (0.145172, −1.03649, 0.560528) |
| w3 | 11 | (0.140766, −0.29884, −1.13839) | for n=4 and M=64:

| wk | LSB bit labels (b4 b5) | $R_c = \frac{1}{4}$, 0.6 dB, (x, y, z, w) | $R_c = \frac{1}{2}$, 4.7 dB, (x, y, z, w) |
|---|---|---|---|
| w0 | 00 | (0.707102, 0.707102, 0.707101, 0.707101) | (0.594667, 1.342751, 0.5791, 0.579096) |
| w1 | 01 | (0.707102, 0.707102, 0.707101, 0.707102) | (0.594666, 0.522325, 1.200416, 0.386329) |
| w2 | 10 | (0.707101, 0.707102, 0.707102, 0.707101) | (0.594668, 0.522324, 0.386331, 1.200417) |
| w3 | 11 | (0.707102, 0.707101, 0.707102, 0.707102) | (0.5947, 0.260823, 0.394221, 0.394225) |

| wk | LSB bit labels (b4 b5) | $R_c = \frac{2}{3}$, 7.1 dB, (x, y, z, w) | $R_c = \frac{3}{4}$, 8.15 dB, (x, y, z, w) |
|---|---|---|---|
| w0 | 00 | (0.533719, 0.551776, 0.533618, 1.335255) | (0.415131, 0.47307, 0.473059, 1.174576) |
| w1 | 01 | (0.438941, 0.552091, 1.247518, 0.521329) | (0.473129, 0.415164, 1.174585, 0.473076) |
| w2 | 10 | (1.248209, 0.551665, 0.438372, 0.521793) | (0.473159, 1.174799, 0.415194, 0.473154) |
| w3 | 11 | (0.379345, 0.551627, 0.379809, 0.286494) | (1.174858, 0.473175, 0.473155, 0.415242) |

| wk | LSB bit labels (b4 b5) | $R_c = \frac{5}{6}$, 9.45 dB, (x, y, z, w) |
|---|---|---|
| w0 | 00 | (0.429225, 0.468636, 0.468558, 1.17263) |
| w1 | 01 | (0.468498, 0.429212, 1.172329, 0.468549) |
| w2 | 10 | (0.468597, 1.172764, 0.429245, 0.46863) |
| w3 | 11 | (1.172465, 0.468608, 0.468507, 0.429221) | for n=4 and =256:

| wk | LSB bit labels (b4 b5 b6 b7) | $R_c = \frac{1}{4}$, 2.1 dB, (x, y, z, w) |
|---|---|---|
| w0 | 0000 | (0.853533, 0.853537, 0.435223, 0.853537) |
| w1 | 0001 | (1.388052, 0.570334, 0.570341, 0.570343) |
| w2 | 0010 | (0.535491, 0.53549, 0.326029, 0.535488) |
| w3 | 0011 | (0.770557, 0.406253, 0.406253, 0.406253) |
| w4 | 0100 | (0.570336, 0.57034, 0.570337, 1.388053) |
| w5 | 0101 | (0.853532, 0.435221, 0.853528, 0.853543) |
| w6 | 0110 | (0.406254, 0.406255, 0.406251, 0.770546) |
| w7 | 0111 | (0.535493, 0.32603, 0.535484, 0.535491) |
| w8 | 1000 | (0.570338, 1.388054, 0.570346, 0.570339) |
| w9 | 1001 | (0.853534, 0.853532, 0.853551, 0.435225) |
| w10 | 1010 | (0.406255, 0.770554, 0.406256, 0.406249) |
| w11 | 1011 | (0.535492, 0.53549, 0.535495, 0.326031) |
| w12 | 1100 | (0.435219, 0.853539, 0.85354, 0.853534) |
| w13 | 1101 | (0.570339, 0.570338, 1.388047, 0.570341) |
| w14 | 1110 | (0.32603, 0.535493, 0.535491, 0.535485) |
| w15 | 1111 | (0.406255, 0.406253, 0.770551, 0.406251) |

| wk | LSB bit labels (b4 b5 b6 b7) | $R_c = \frac{1}{2}$, 4.7 dB, (x, y, z, w) |
|---|---|---|
| w0 | 0000 | (1.526509, 0.402616, 0.631195, 0.631197) |
| w1 | 0001 | (0.602165, 0.480207, 1.520122, 0.438092) |
| w2 | 0010 | (1.25358, 1.046597, 0.444948, 0.444947) |
| w3 | 0011 | (0.552189, 1.201405, 1.024307, 0.313877) |
| w4 | 0100 | (0.942978, 0.243165, 0.411336, 0.411336) |
| w5 | 0101 | (0.429351, 0.270441, 0.879771, 0.304775) |
| w6 | 0110 | (0.752996, 0.432847, 0.287963, 0.28796) |
| w7 | 0111 | (0.376248, 0.491436, 0.538473, 0.221183) |
| w8 | 1000 | (0.602165, 0.48021, 0.438083, 1.520119) |
| w9 | 1001 | (0.400875, 0.468866, 1.189484, 1.189495) |
| w10 | 1010 | (0.55219, 1.201411, 0.313874, 1.024294) |
| w11 | 1011 | (0.300813, 1.415048, 0.466125, 0.466122) |
| w12 | 1100 | (0.42935, 0.270442, 0.304772, 0.879768) |
| w13 | 1101 | (0.266249, 0.279379, 0.63154, 0.631546) |
| w14 | 1110 | (0.376246, 0.491438, 0.221183, 0.538465) |
| w15 | 1111 | (0.22888, 0.552601, 0.354481, 0.35448) |

| wk | LSB bit labels (b4 b5 b6 b7) | $R_c = \frac{2}{3}$, 8.8 dB, (x, y, z, w) |
|---|---|---|
| w0 | 0000 | (1.018943, 0.365858, 1.199467, 0.481008) |
| w1 | 0001 | (0.331868, 0.361354, 1.310964, 0.283197) |
| w2 | 0010 | (1.558783, 0.459499, 0.486589, 0.463096) |
| w3 | 0011 | (1.10882, 1.198092, 0.44343, 0.399275) |
| w4 | 0100 | (0.685157, 0.196292, 0.575696, 0.442069) |
| w5 | 0101 | (0.332449, 0.279754, 0.526833, 0.246807) |
| w6 | 0110 | (1.003474, 0.302379, 0.281231, 0.436793) |
| w7 | 0111 | (0.676872, 0.666776, 0.261086, 0.255449) |
| w8 | 1000 | (0.396496, 0.465471, 1.097731, 1.183561) |
| w9 | 1001 | (0.330053, 1.038928, 1.168812, 0.447361) |
| w10 | 1010 | (0.439683, 1.062086, 0.441272, 1.301175) |
| w11 | 1011 | (0.371102, 1.447116, 0.450695, 0.467416) |
| w12 | 1100 | (0.282082, 0.246055, 0.399926, 0.957503) |
| w13 | 1101 | (0.170056, 0.386611, 0.345374, 0.425569) |
| w14 | 1110 | (0.776315, 0.39265, 0.276701, 1.241973) |
| w15 | 1111 | (0.268557, 0.861542, 0.245954, 0.354217) |

| wk | LSB bit labels (b4 b5 b6 b7) | $R_c = \frac{3}{4}$, 4.7 dB, (x, y, z, w) |
|---|---|---|
| w0 | 0000 | (1.177296, 1.1958, 0.498387, 0.389436) |
| w1 | 0001 | (1.493578, 0.394827, 0.380252, 0.355904) |
| w2 | 0010 | (0.869675, 0.903371, 0.298536, 0.906957) |
| w3 | 0011 | (0.764504, 0.533695, 0.24056, 0.280397) |
| w4 | 0100 | (1.035942, 0.403318, 1.013009, 0.971103) |
| w5 | 0101 | (0.972427, 0.325647, 0.998656, 0.300178) |
| w6 | 0110 | (0.80859, 0.29903, 0.327672, 1.144447) |
| w7 | 0111 | (0.649232, 0.205051, 0.350469, 0.357187) |
| w8 | 1000 | (0.3932, 1.544683, 0.41033, 0.388835) |
| w9 | 1001 | (0.348383, 1.035569, 1.060365, 0.330446) |
| w10 | 1010 | (0.271132, 0.997977, 0.349517, 0.907452) |
| w11 | 1011 | (0.236576, 0.713614, 0.327883, 0.278331) |
| w12 | 1100 | (0.319746, 0.398194, 1.126819, 1.073599) |
| w13 | 1101 | (0.309596, 0.330431, 1.191466, 0.335021) |
| w14 | 1110 | (0.228413, 0.325633, 0.370927, 1.102348) |
| w15 | 1111 | (0.203443, 0.239249, 0.425946, 0.367032) |

| wk | LSB bit labels (b4 b5 b6 b7) | $R_c = \frac{5}{6}$, 1135 dB, (x, y, z, w) |
|---|---|---|
| w0 | 0000 | (1.077284, 0.957874, 1.034832, 0.441819) |
| w1 | 0001 | (0.412758, 0.398613, 1.528827, 0.375586) |
| w2 | 0010 | (1.076567, 1.07177, 0.324415, 0.428991) |
| w3 | 0011 | (1.514688, 0.385762, 0.382328, 0.357945) |
| w4 | 0100 | (0.414877, 0.390574, 0.394515, 1.572725) |
| w5 | 0101 | (0.822358, 0.246758, 0.917809, 0.321732) |
| w6 | 0110 | (0.963923, 0.374594, 0.335966, 1.001772) |
| w7 | 0111 | (0.864815, 0.291169, 0.284467, 0.299176) |
| w8 | 1000 | (0.400077, 0.935313, 0.975085, 0.955456) |
| w9 | 1001 | (0.281655, 0.906792, 0.941819, 0.290489) |
| w10 | 1010 | (0.384193, 1.120022, 0.3108, 0.875174) |
| w11 | 1011 | (0.294389, 1.020099, 0.302111, 0.266808) |
| w12 | 1100 | (0.305856, 0.294713, 0.824631, 0.992838) |
| w13 | 1101 | (0.25481, 0.285898, 0.751643, 0.298045) |
| w14 | 1110 | (0.289067, 0.356851, 0.238692, 0.822132) |
| w15 | 1111 | (0.294154, 0.340578, 0.244513, 0.277487) | wherein a transformed version of the non-uniform constellation is obtained from anyone of said constellations through a transformation including a rotation by an angle around an origin, an inversion of bit labels for all constellation points, an interchanging of bit positions and/or a predistortion for the constellation points.

15. A demodulation and decoding apparatus comprising:
a demodulator configured to demodulate constellation values of a non-uniform constellation into cell words and to assign bit combinations to constellation values of the used non-uniform constellation, and
a decoder configured to decode cell words into output data,
wherein said demodulator is configured to use, based on signalling information indicating a total number M of constellation points of the constellation, a signal-to-noise ratio SNR and a number n of the dimension of the constellation, an n-dimensional non-uniform constellation from a group of constellations, wherein each constellation point of art n-dimensional constellation diagram is defined by an n-tupel of constellation values, said n-tupel of constellation values defining parameter settings of a transmission parameter used by a transmission apparatus for transmitting a transmission stream obtained by conversion of said constellation values, and
wherein said demodulator is configured to use a constellation having the total number M of constellation points of the constellation and the number n of the dimension of the constellation which fulfill the condition that log 2(M)/n*2 is a non-integer number.

16. Receiving apparatus comprising:
a receiver configured to receive the one or more transmission streams,
a deconverter configured to deconvert one or more transmission streams into said constellation values, and
a demodulation and decoding apparatus as claimed in claim 14 configured to demodulate and decode said constellation values into the output data.

17. A demodulation and decoding apparatus comprising:
a demodulator configured to demodulate constellation values of a non-uniform constellation into cell words and to assign bit combinations to constellation values of the used non-uniform constellation, and
a decoder configured to decode cell words into output data,
wherein said demodulator is configured to use, based on signalling information indicating a total number M of constellation points of the constellation, a signal-to-noise ratio SNR and a number n of the dimension of the constellation, an n-dimensional non-uniform constellation from a group of constellations or a transformed version of an n-dimensional constellation from said group of constellations, wherein each constellation point of an n-dimensional constellation diagram is defined by an n-tupel of constellation values, said n-tupel of constellation values defining parameter settings of a transmission parameter used by a transmission apparatus for transmitting a transmission stream obtained by conversion of said constellation values, and
wherein constellation position vectors of different constellations of the group of constellation are defined as follows: for n=3 and M=64:

| wk | LSB bit labels (b3 b4 b5) | $R_c = \frac{1}{4}$, 2.1 dB, (x, y, z) | $R_c = \frac{1}{2}$, 6.2 dB (x, y, z) |
|---|---|---|---|
| w0 | 000 | (0.679463, 1.203006, 0.519483) | (0.596549, 1.352959, 0.388406) |
| w1 | 001 | (0.483813, 0.629873, 0.355243) | (0.397732, 0.604735, 0.238847) |
| w2 | 010 | (1.252423, 0.629854, 0.629855) | (1.423781, 0.547468, 0.547469) |

| wk | LSB bit labels (b3 b4 b5) | $R_c = \frac{1}{4}$, 2.1 dB, (x, y, z) | $R_c = \frac{1}{2}$, 6.2 dB (x, y, z) |
|---|---|---|---|
| w3 | 011 | (0.759524, 0.40977, 0.40977) | (0.784715, 0.306821, 0.306822) |
| w4 | 100 | (0.456715, 0.900064, 0.900059) | (0.379632, 1.038068, 1.038067) |
| w5 | 101 | (0.349874, 0.510669, 0.51067) | (0.248578, 0.424422, 0.424422) |
| w6 | 110 | (0.679462, 0.519486, 1.203008) | (0.596547, 0.388406, 1.352962) |
| w7 | 111 | (0.483813, 0.355244, 0.629877) | (0.397731, 0.238846, 0.604736) |

| wk | LSB bit labels (b3 b4 b5) | $R_c = \frac{2}{3}$, 8.8 dB, (x, y, z) | $R_c = \frac{3}{4}$, 10 dB, (x, y, z) |
|---|---|---|---|
| w0 | 000 | (0.37522, 0.535637, 1.329562) | (0.403465, 1.429603, 0.403469) |
| w1 | 001 | (0.585588, 1.369204, 0.585594) | (0.93451, 0.917081, 0.311174) |
| w2 | 010 | (1.046301, 0.382275, 1.046309) | (1.060679, 0.381871, 1.060697) |
| w3 | 011 | (1.329562, 0.535639, 0.375227) | (1.081152, 0.290324, 0.334489) |
| w4 | 100 | (0.214422, 0.399424, 0.691315) | (0.31117, 0.917076, 0.934521) |
| w5 | 101 | (0.309062, 0.906218, 0.30906) | (0.279161, 0.606528, 0.279155) |
| w6 | 110 | (0.363725, 0.212822, 0.363724) | (0.334483, 0.29031, 1.081104) |
| w7 | 111 | (0.691321, 0.399426, 0.214424) | (0.352778, 0.205563, 0.352752) |

| wk | LSB bit labels (b3 b4 b5) | $R_c = \frac{5}{6}$, 11.35 dB, (x, y, z) |
|---|---|---|
| w0 | 000 | (1.054178, 1.043246, 0.431268) |
| w1 | 001 | (0.373323, 1.37404, 0.341879) |
| w2 | 010 | (1.073002, 0.372189, 0.909371) |
| w3 | 011 | (0.952138, 0.27332, 0.278175) |
| w4 | 100 | (0.370565, 0.907662, 1.044718) |
| w5 | 101 | (0.277451, 0.740438, 0.314124) |
| w6 | 110 | (0.341752, 0.278121, 1.025684) |
| w7 | 111 | (0.308638, 0.239727, 0.33157) | for n=4 and M=4:

| wk | bit labels (b0 b1) | $R_c = \frac{1}{4}$, 4.25 dB, (x, y, z) | $R_c = \frac{1}{2}$, −0.85 dB, (x, y, z) |
|---|---|---|---|
| w0 | 00 | (0, 0.866025, 0.866025) | (0.341973, 0.732665, 0.91801) |
| w1 | 01 | (0, 0.866025, −0.86603) | (−0.04024, 0.896206, −0.83227) |
| w2 | 10 | (0, −0.86603, 0.866025) | (−0.63438, −0.76431, 0.713423) |
| w3 | 11 | (0, −0.86603, −0.86603) | (0.334075, −0.86322, −0.79958) |

| wk | bit labels (b0 b1) | $R_c = \frac{2}{3}$, 1.3 dB, (x, y, z) | $R_c = \frac{3}{4}$, 2.2 dB, (x, y, z) |
|---|---|---|---|
| w0 | 00 | (0.943009, 0.560703, 0.544745) | (0.349973, 0.944614, 0.675467) |
| w1 | 01 | (−0.54904, 0.974405, −0.49777) | (0.735879, 0.122954, −0.9589) |
| w2 | 10 | (−0.32303, −0.76353, 0.901148) | (−0.01644, −0.88366, 0.829) |
| w3 | 11 | (−0.06959, −0.77156, −0.94867) | (−1.06295, −0.18527, −0.55139) |

| wk | bit labels (b0 b1) | $R_c = \frac{5}{6}$, 3.35 dB, (x, y, z) |
|---|---|---|
| w0 | 00 | (−1.01648, 0.404423, 0.471229) |
| w1 | 01 | (0.725854, 0.939584, 0.117155) |
| w2 | 10 | (0.145172, −1.03649, 0.560528) |
| w3 | 11 | (0.140766, −0.29884, −1.13839) | for n=4 and M=64:

| wk | LSB bit labels (b4 b5) | $R_c = \frac{1}{4}$, 0.6 dB, (x, y, z, w) | $R_c = \frac{1}{2}$, 4.7 dB, (x, y, z, w) |
|---|---|---|---|
| w0 | 00 | (0.707102, 0.707102, 0.707101, | (0.594667, 1.342751, 0.5791, 0.579096) |
| w1 | 01 | (0.707102, 0.707102, 0.707101, | (0.594666, 0.522325, 1.200416, |
| w2 | 10 | (0.707101, 0.707102, 0.707102, | (0.594668, 0.522324, 0.386331, |
| w3 | 11 | (0.707102, 0.707101, 0.707101, | (0.5947, 0.260823, 0.394221, 0.394225) |

| wk | LSB bit labels (b4 b5) | $R_c = \frac{2}{3}$, 7.1 dB, (x, y, z, w) | $R_c = \frac{3}{4}$, 8.15 dB, (x, y, z, w) |
|---|---|---|---|
| w0 | 00 | (0.533719, 0.551776, 0.533618, | (0.415131, 0.47307, 0.473059, 1.174576) |
| w1 | 01 | (0.438941, 0.552091, 1.247518, | (0.473129, 0.415164, 1.174585, |
| w2 | 10 | (1.248209, 0.551665, 0.438372, | (0.473159, 1.174799, 0.415194, |
| w3 | 11 | (0.379345, 0.551627, 0.379809, | (1.174858, 0.473175, 0.473155, |

| wk | LSB bit labels (b4 b5) | $R_c = \frac{5}{6}$, 9.45 dB, (x, y, z, w) |
|---|---|---|
| w0 | 00 | (0.429225, 0.468636, 0.468558, 1.17263) |
| w1 | 01 | (0.468498, 0.429212, 1.172329, 0.468549) |
| w2 | 10 | (0.468597, 1.172764, 0.429245, 0.46863) |
| w3 | 11 | (1.172465, 0.468608, 0.468507, 0.429221) | for n=4 and M=256:

| wk | LSB bit labels (b4 b5 b6 b7) | $R_c = \frac{1}{4}$, 2.1 dB, (x, y, z, w) |
|---|---|---|
| w0 | 0000 | (0.853533, 0.853537, 0.435223, 0.853537) |
| w1 | 0001 | (1.388052, 0.570334, 0.570341, 0.570343) |
| w2 | 0010 | (0.535491, 0.53549, 0.326029, 0.535488) |
| w3 | 0011 | (0.770557, 0.406253, 0.406253, 0.406253) |
| w4 | 0100 | (0.570336, 0.57034, 0.570337, 1.388053) |
| w5 | 0101 | (0.853532, 0.435221, 0.853528, 0.853543) |
| w6 | 0110 | (0.406254, 0.406255, 0.406251, 0.770546) |
| w7 | 0111 | (0.535493, 0.32603, 0.535484, 0.535491) |
| w8 | 1000 | (0.570338, 1.388054, 0.570346, 0.570339) |
| w9 | 1001 | (0.853534, 0.853532, 0.853551, 0.435225) |
| w10 | 1010 | (0.406255, 0.770554, 0.406256, 0.406249) |
| w11 | 1011 | (0.535492, 0.53549, 0.535495, 0.326031) |
| w12 | 1100 | (0.435219, 0.853539, 0.85354, 0.853534) |
| w13 | 1101 | (0.570339, 0.570338, 1.388047, 0.570341) |
| w14 | 1110 | (0.32603, 0.535493, 0.535491, 0.535485) |
| w15 | 1111 | (0.406255, 0.406253, 0.770551, 0.406251) |

| wk | LSB bit labels (b4 b5 b6 b7) | $R_c = \frac{1}{2}$, 4.7 dB, (x, y, z, w) |
|---|---|---|
| w0 | 0000 | (1.526509, 0.402616, 0.631195, 0.631197) |
| w1 | 0001 | (0.602165, 0.480207, 1.520122, 0.438092) |
| w2 | 0010 | (1.25358, 1.046597, 0.444948, 0.444947) |
| w3 | 0011 | (0.552189, 1.201405, 1.024307, 0.313877) |
| w4 | 0100 | (0.942978, 0.243165, 0.411336, 0.411336) |
| w5 | 0101 | (0.429351, 0.270441, 0.879771, 0.304775) |
| w6 | 0110 | (0.752996, 0.432847, 0.287963, 0.28796) |
| w7 | 0111 | (0.376248, 0.491436, 0.538473, 0.221183) |
| w8 | 1000 | (0.602165, 0.48021, 0.438083, 1.520119) |
| w9 | 1001 | (0.400875, 0.468866, 1.189484, 1.189495) |
| w10 | 1010 | (0.55219, 1.201411, 0.313874, 1.024294) |
| w11 | 1011 | (0.300813, 1.415048, 0.466125, 0.466122) |
| w12 | 1100 | (0.42935, 0.270442, 0.304772, 0.879768) |

-continued

| wk | LSB bit labels (b4 b5 b6 b7) | $R_c = \frac{1}{2}$, 4.7 dB, (x, y, z, w) |
|---|---|---|
| w13 | 1101 | (0.266249, 0.279379, 0.63154, 0.631546) |
| w14 | 1110 | (0.376246, 0.491438, 0.221183, 0.538465) |
| w15 | 1111 | (0.22888, 0.552601, 0.354481, 0.35448) |

| wk | LSB bit labels (b4 b5 b6 b7) | $R_c = \frac{2}{3}$, 8.8 dB, (x, y, z, w) |
|---|---|---|
| w0 | 0000 | (1.018943, 0.365858, 1.199467, 0.481008) |
| w1 | 0001 | (0.331868, 0.361354, 1.310964, 0.283197) |
| w2 | 0010 | (1.558783, 0.459499, 0.486589, 0.463096) |
| w3 | 0011 | (1.10882, 1.198092, 0.44343, 0.399275) |
| w4 | 0100 | (0.685157, 0.196292, 0.575696, 0.442069) |
| w5 | 0101 | (0.332449, 0.279754, 0.526833, 0.246807) |
| w6 | 0110 | (1.003474, 0.302379, 0.281231, 0.436793) |
| w7 | 0111 | (0.676872, 0.666776, 0.261086, 0.255449) |
| w8 | 1000 | (0.396496, 0.465471, 1.097731, 1.183561) |
| w9 | 1001 | (0.330053, 1.038928, 1.168812, 0.447361) |
| w10 | 1010 | (0.439683, 1.062086, 0.441272, 1.301175) |
| w11 | 1011 | (0.371102, 1.447116, 0.450695, 0.467416) |
| w12 | 1100 | (0.282082, 0.246055, 0.399926, 0.957503) |
| w13 | 1101 | (0.170056, 0.386611, 0.345374, 0.425569) |
| w14 | 1110 | (0.776315, 0.39265, 0.276701, 1.241973) |
| w15 | 1111 | (0.268557, 0.861542, 0.245954, 0.354217) |

| wk | LSB bit labels (b4 b5 b6 b7) | $R_c = \frac{3}{4}$, 4.7 dB, (x, y, z, w) |
|---|---|---|
| w0 | 0000 | (1.177296, 1.1958, 0.498387, 0.389436) |
| w1 | 0001 | (1.493578, 0.394827, 0.380252, 0.355904) |
| w2 | 0010 | (0.869675, 0.903371, 0.298536, 0.906957) |
| w3 | 0011 | (0.764504, 0.533695, 0.24056, 0.280397) |
| w4 | 0100 | (1.035942, 0.403318, 1.013009, 0.971103) |
| w5 | 0101 | (0.972427, 0.325647, 0.998656, 0.300178) |
| w6 | 0110 | (0.80859, 0.29903, 0.327672, 1.144447) |
| w7 | 0111 | (0.649232, 0.205051, 0.350469, 0.357187) |
| w8 | 1000 | (0.3932, 1.544683, 0.41033, 0.388835) |
| w9 | 1001 | (0.348383, 1.035569, 1.060365, 0.330446) |
| w10 | 1010 | (0.271132, 0.997977, 0.349517, 0.907452) |
| w11 | 1011 | (0.236576, 0.713614, 0.327883, 0.278331) |
| w12 | 1100 | (0.319746, 0.398194, 1.126819, 1.073599) |
| w13 | 1101 | (0.309596, 0.330431, 1.191466, 0.335021) |

-continued

| wk | LSB bit labels (b4 b5 b6 b7) | $R_c = \frac{3}{4}$, 4.7 dB, (x, y, z, w) |
|---|---|---|
| w14 | 1110 | (0.228413, 0.325633, 0.370927, 1.102348) |
| w15 | 1111 | (0.203443, 0.239249, 0.425946, 0.367032) |

| wk | LSB bit labels (b4 b5 b6 b7) | $R_c = \frac{5}{6}$, 11.35 dB, (x, y, z, w) |
|---|---|---|
| w0 | 0000 | (1.077284, 0.957874, 1.034832, 0.441819) |
| w1 | 0001 | (0.412758, 0.398613, 1.528827, 0.375586) |
| w2 | 0010 | (1.076567, 1.07177, 0.324415, 0.428991) |
| w3 | 0011 | (1.514688, 0.385762, 0.382328, 0.357945) |
| w4 | 0100 | (0.414877, 0.390574, 0.394515, 1.572725) |
| w5 | 0101 | (0.822358, 0.246758, 0.917809, 0.321732) |
| w6 | 0110 | (0.963923, 0.374594, 0.335966, 1.001772) |
| w7 | 0111 | (0.864815, 0.291169, 0.284467, 0.299176) |
| w8 | 1000 | (0.400077, 0.935313, 0.975085, 0.955456) |
| w9 | 1001 | (0.281655, 0.906792, 0.941819, 0.290489) |
| w10 | 1010 | (0.384193, 1.120022, 0.3108, 0.875174) |
| w11 | 1011 | (0.294389, 1.020099, 0.302111, 0.266808) |
| w12 | 1100 | (0.305856, 0.294713, 0.824631, 0.992838) |
| w13 | 1101 | (0.25481, 0.285898, 0.751643, 0.298045) |
| w14 | 1110 | (0.289067, 0.356851, 0.238692, 0.822132) |
| w15 | 1111 | (0.294154, 0.340578, 0.244513, 0.277487) | wherein a transformed version of the non-uniform constellation is obtained from anyone of said constellations through a transformation including a rotation by an angle around an origin, an inversion of bit labels for all constellation points, an interchanging of bit positions and/or a predistortion for the constellation points.

18. A demodulation and decoding method comprising:
    demodulating constellation values of a non-uniform constellation into cell words and to assign bit combinations to constellation values of the used non-uniform constellation, and
    decoding cell words into output data,
wherein said demodulating uses, based on signalling information indicating a total number M of constellation points of the constellation, a signal-to-noise ratio SNR and a number n of the dimension of the constellation, an n-dimensional non-uniform constellation from a group of constellations, wherein each constellation point of an n-dimensional constellation diagram is defined by an n-tupel of constellation values, said n-tupel of constellation values defining parameter settings of a transmission parameter used by a transmission apparatus for transmitting a transmission stream obtained by conversion of said constellation values, and
wherein said demodulating uses a constellation having the total number M of constellation points of the constellation and the number n of the dimension of the constellation which fulfill the condition that log 2(M)/n*2 is a non-integer number.

19. Receiving method comprising:
    receiving the one or more transmission streams,
    deconverting one or more transmission streams into said constellation values, and
    a demodulation and decoding method as claimed in claim 18 for demodulating and decoding said constellation values into the output data.

20. A demodulation and decoding method comprising:
    demodulating constellation values of a non-uniform constellation into cell words and to assign bit combinations to constellation values of the used non-uniform constellation, and
    decoding cell words into output data,
wherein said demodulating uses, based on signalling information indicating a total number M of constellation points of the constellation, a signal-to-noise ratio SNR and a number n of the dimension of the constellation, an n-dimensional non-uniform constellation from a group of constellations or a transformed version of an n-dimensional constellation from said group of constellations, wherein each constellation point of an n-dimensional constellation diagram is defined by an n-tupel of constellation values, said n-tupel of constellation values defining parameter settings of a transmission parameter used by a transmission apparatus for transmitting a transmission stream obtained by conversion of said constellation values, and
wherein constellation position vectors of different constellations of the group of constellation are defined as follows: for n=3 and M=64:

| wk | LSB bit labels (b3 b4 b5) | $R_c = \frac{1}{4}$, 2.1 dB, (x, y, z) | $R_c = \frac{1}{2}$, 6.2 dB (x, y, z) |
|---|---|---|---|
| w0 | 000 | (0.679463, 1.203006, 0.519483) | (0.596549, 1.352959, 0.388406) |
| w1 | 001 | (0.483813, 0.629873, 0.355243) | (0.397732, 0.604735, 0.238847) |
| w2 | 010 | (1.252423, 0.629854, 0.629855) | (1.423781, 0.547468, 0.547469) |
| w3 | 011 | (0.759524, 0.40977, 0.40977) | (0.784715, 0.306821, 0.306822) |
| w4 | 100 | (0.456715, 0.900064, 0.900059) | (0.379632, 1.038068, 1.038067) |
| w5 | 101 | (0.349874, 0.510669, 0.51067) | (0.248578, 0.424422, 0.424422) |
| w6 | 110 | (0.679462, 0.519486, 1.203008) | (0.596547, 0.388406, 1.352962) |
| w7 | 111 | (0.483813, 0.355244, 0.629877) | (0.397731, 0.238846, 0.604736) |

| wk | LSB bit labels (b3 b4 b5) | $R_c = \frac{2}{3}$, 8.8 dB, (x, y, z) | $R_c = \frac{3}{4}$, 10 dB (x, y, z) |
|---|---|---|---|
| w0 | 000 | (0.37522, 0.535637, 1.329562) | (0.403465, 1.429603, 0.403469) |
| w1 | 001 | (0.585588, 1.369204, 0.585594) | (0.93451, 0.917081, 0.311174) |
| w2 | 010 | (1.046301, 0.382275, 1.046309) | (1.060679, 0.381871, 1.060697) |
| w3 | 011 | (1.329562, 0.535639, 0.375227) | (1.081152, 0.290324, 0.334489) |
| w4 | 100 | (0.214422, 0.399424, 0.691315) | (0.31117, 0.917076, 0.934521) |
| w5 | 101 | (0.309062, 0.906218, 0.30906) | (0.279161, 0.606528, 0.279155) |

-continued

| wk | LSB bit labels (b3 b4 b5) | $R_c = \frac{2}{3}$, 8.8 dB, (x, y, z) | $R_c = \frac{3}{4}$, 10 dB (x, y, z) |
|---|---|---|---|
| w6 | 110 | (0.363725, 0.212822, 0.363724) | (0.334483, 0.29031, 1.081104) |
| w7 | 111 | (0.691321, 0.399426, 0.214424) | (0.352778, 0.205563, 0.352752) |

| wk | LSB bit labels (b3 b4 b5) | $R_c = \frac{5}{6}$, 11.35 dB, (x, y, z) |
|---|---|---|
| w0 | 000 | (1.054178, 1.043246, 0.431268) |
| w1 | 001 | (0.373323, 1.37404, 0.341879) |
| w2 | 010 | (1.073002, 0.372189, 0.909371) |
| w3 | 011 | (0.952138, 0.27332, 0.278175) |
| w4 | 100 | (0.370565, 0.907662, 1.044718) |
| w5 | 101 | (0.277451, 0.740438, 0.314124) |
| w6 | 110 | (0.341752, 0.278121, 1.025684) |
| w7 | 111 | (0.308638, 0.239727, 0.33157) | for n=4 and M=4:

| wk | bit labels (b0 b1) | $R_c = \frac{1}{4}$, −4.25 dB, (x, y, z) | $R_c = \frac{1}{2}$, −0.85 dB, (x, y, z) |
|---|---|---|---|
| w0 | 00 | (0, 0.866025, 0.866025) | (0.341973, 0.732665, 0.91801) |
| w1 | 01 | (0, 0.866025, −0.86603) | (−0.04024, 0.896206, −0.83227) |
| w2 | 10 | (0, −0.86603, 0.866025) | (−0.63438, −0.76431, 0.713423) |
| w3 | 11 | (0, −0.86603, −0.86603) | (0.334075, −0.86322, −0.79958) |

| wk | bit labels (b0 b1) | $R_c = \frac{2}{3}$, 1.3 dB, (x, y, z) | $R_c = \frac{3}{4}$, 2.2 dB, (x, y, z) |
|---|---|---|---|
| w0 | 00 | (0.943009, 0.560703, 0.544745) | (0.349973, 0.944614, 0.675467) |
| w1 | 01 | (−0.54904, 0.974405, −0.49777) | (0.735879, 0.122954, −0.9589) |
| w2 | 10 | (−0.32303, −0.76353, 0.901148) | (−0.01644, −0.88366, 0.829) |
| w3 | 11 | (−0.06959, −0.77156, −0.94867) | (−1.06295, −0.18527, −0.55139) |

| wk | bit labels (b0 b1) | $R_c = \frac{5}{6}$, 3.35 dB, (x, y, z) |
|---|---|---|
| w0 | 00 | (−1.01648, 0.404423, 0.471229) |
| w1 | 01 | (0.725854, 0.939584, 0.117155) |
| w2 | 10 | (0.145172, −1.03649, 0.560528) |
| w3 | 11 | (0.140766, −0.29884, −1.13839) | for n=4 and M=64:

| wk | LSB bit labels (b4 b5) | $R_c = \frac{1}{4}$, 0.6 dB, (x, y, z, w) | $R_c = \frac{1}{2}$, 4.7 dB, (x, y, z, w) |
|---|---|---|---|
| w0 | 00 | (0.707102, 0.707102, 0.707101, 0.707101) | (0.594667, 1.342751, 0.5791, 0.579096) |
| w1 | 01 | (0.707102, 0.707102, 0.707101, 0.707102) | (0.594666, 0.522325, 1.200416, 0.386329) |
| w2 | 10 | (0.707101, 0.707102, 0.707102, 0.707101) | (0.594668, 0.522324, 0.386331, 1.200417) |
| w3 | 11 | (0.707102, 0.707101, 0.707102, 0.707102) | (0.5947, 0.260823, 0.394221, 0.394225) |

| wk | LSB bit labels (b4 b5) | $R_c = \frac{2}{3}$, 7.1 dB, (x, y, z, w) | $R_c = \frac{3}{4}$, 8.15 dB, (x, y, z, w) |
|---|---|---|---|
| w0 | 00 | (0.533719, 0.551776, 0.533618, 1.335255) | (0.415131, 0.47307, 0.473059, 1.174576) |
| w1 | 01 | (0.438941, 0.552091, 1.247518, 0.521329) | (0.473129, 0.415164, 1.174585, 0.473076) |

-continued

| wk | LSB bit labels (b4 b5) | $R_c = \frac{2}{3}$, 7.1 dB, (x, y, z, w) | $R_c = \frac{3}{4}$, 8.15 dB, (x, y, z, w) |
|---|---|---|---|
| w2 | 10 | (1.248209, 0.551665, 0.438372, 0.521793) | (0.473159, 1.174799, 0.415194, 0.473154) |
| w3 | 11 | (0.379345, 0.551627, 0.379809, 0.286494) | (1.174858, 0.473175, 0.473155, 0.415242) |

| wk | LSB bit labels (b4 b5) | $R_c = \frac{5}{6}$, 9.45 dB, (x, y, z, w) |
|---|---|---|
| w0 | 00 | (0.429225, 0.468636, 0.468558, 1.17263) |
| w1 | 01 | (0.468498, 0.429212, 1.172329, 0.468549) |
| w2 | 10 | (0.468597, 1.172764, 0.429245, 0.46863) |
| w3 | 11 | (1.172465, 0.468608, 0.468507, 0.429221) | for n=4 and M=256:

| wk | LSB bit labels (b4 b5 b6 b7) | $R_c = \frac{1}{4}$, 2.1 dB, (x, y, z, w) |
|---|---|---|
| w0 | 0000 | (0.853533, 0.853537, 0.435223, 0.853537) |
| w1 | 0001 | (1.388052, 0.570334, 0.570341, 0.570343) |
| w2 | 0010 | (0.535491, 0.53549, 0.326029, 0.535488) |
| w3 | 0011 | (0.770557, 0.406253, 0.406253, 0.406253) |
| w4 | 0100 | (0.570336, 0.57034, 0.570337, 1.388053) |
| w5 | 0101 | (0.853532, 0.435221, 0.853528, 0.853543) |
| w6 | 0110 | (0.406254, 0.406255, 0.406251, 0.770546) |
| w7 | 0111 | (0.535493, 0.32603, 0.535484, 0.535491) |
| w8 | 1000 | (0.570338, 1.388054, 0.570346, 0.570339) |
| w9 | 1001 | (0.853534, 0.853532, 0.853551, 0.435225) |
| w10 | 1010 | (0.406255, 0.770554, 0.406256, 0.406249) |
| w11 | 1011 | (0.535492, 0.53549, 0.535495, 0.326031) |
| w12 | 1100 | (0.435219, 0.853539, 0.85354, 0.853534) |
| w13 | 1101 | (0.570339, 0.570338, 1.388047, 0.570341) |
| w14 | 1110 | (0.32603, 0.535493, 0.535491, 0.535485) |
| w15 | 1111 | (0.406255, 0.406253, 0.770551, 0.406251) |

| wk | LSB bit labels (b4 b5 b6 b7) | $R_c = \frac{1}{2}$, 4.7 dB, (x, y, z, w) |
|---|---|---|
| w0 | 0000 | (1.526509, 0.402616, 0.631195, 0.631197) |
| w1 | 0001 | (0.602165, 0.480207, 1.520122, 0.438092) |
| w2 | 0010 | (1.25358, 1.046597, 0.444948, 0.444947) |
| w3 | 0011 | (0.552189, 1.201405, 1.024307, 0.313877) |
| w4 | 0100 | (0.942978, 0.243165, 0.411336, 0.411336) |
| w5 | 0101 | (0.429351, 0.270441, 0.879771, 0.304775) |
| w6 | 0110 | (0.752996, 0.432847, 0.287963, 0.28796) |
| w7 | 0111 | (0.376248, 0.491436, 0.538473, 0.221183) |
| w8 | 1000 | (0.602165, 0.48021, 0.438083, 1.520119) |
| w9 | 1001 | (0.400875, 0.468866, 1.189484, 1.189495) |
| w10 | 1010 | (0.55219, 1.201411, 0.313874, 1.024294) |
| w11 | 1011 | (0.300813, 1.415048, 0.466125, 0.466122) |
| w12 | 1100 | (0.42935, 0.270442, 0.304772, 0.879768) |
| w13 | 1101 | (0.266249, 0.279379, 0.63154, 0.631546) |
| w14 | 1110 | (0.376246, 0.491438, 0.221183, 0.538465) |
| w15 | 1111 | (0.22888, 0.552601, 0.354481, 0.35448) |

| wk | LSB bit labels (b4 b5 b6 b7) | $R_c = \frac{2}{3}$, 8.8 dB, (x, y, z, w) |
|---|---|---|
| w0 | 0000 | (1.018943, 0.365858, 1.199467, 0.481008) |
| w1 | 0001 | (0.331868, 0.361354, 1.310964, 0.283197) |
| w2 | 0010 | (1.558783, 0.459499, 0.486589, 0.463096) |
| w3 | 0011 | (1.10882, 1.198092, 0.44343, 0.399275) |
| w4 | 0100 | (0.685157, 0.196292, 0.575696, 0.442069) |
| w5 | 0101 | (0.332449, 0.279754, 0.526833, 0.246807) |
| w6 | 0110 | (1.003474, 0.302379, 0.281231, 0.436793) |
| w7 | 0111 | (0.676872, 0.666776, 0.261086, 0.255449) |
| w8 | 1000 | (0.396496, 0.465471, 1.097731, 1.183561) |
| w9 | 1001 | (0.330053, 1.038928, 1.168812, 0.447361) |
| w10 | 1010 | (0.439683, 1.062086, 0.441272, 1.301175) |
| w11 | 1011 | (0.371102, 1.447116, 0.450695, 0.467416) |
| w12 | 1100 | (0.282082, 0.246055, 0.399926, 0.957503) |
| w13 | 1101 | (0.170056, 0.386611, 0.345374, 0.425569) |
| w14 | 1110 | (0.776315, 0.39265, 0.276701, 1.241973) |
| w15 | 1111 | (0.268557, 0.861542, 0.245954, 0.354217) |

| wk | LSB bit labels (b4 b5 b6 b7) | $R_c = \frac{3}{4}$, 4.7 dB, (x, y, z, w) |
|---|---|---|
| w0 | 0000 | (1.177296, 1.1958, 0.498387, 0.389436) |
| w1 | 0001 | (1.493578, 0.394827, 0.380252, 0.355904) |
| w2 | 0010 | (0.869675, 0.903371, 0.298536, 0.906957) |
| w3 | 0011 | (0.764504, 0.533695, 0.24056, 0.280397) |
| w4 | 0100 | (1.035942, 0.403318, 1.013009, 0.971103) |
| w5 | 0101 | (0.972427, 0.325647, 0.998656, 0.300178) |
| w6 | 0110 | (0.80859, 0.29903, 0.327672, 1.144447) |
| w7 | 0111 | (0.649232, 0.205051, 0.350469, 0.357187) |
| w8 | 1000 | (0.3932, 1.544683, 0.41033, 0.388835) |
| w9 | 1001 | (0.348383, 1.035569, 1.060365, 0.330446) |
| w10 | 1010 | (0.271132, 0.997977, 0.349517, 0.907452) |
| w11 | 1011 | (0.236576, 0.713614, 0.327883, 0.278331) |
| w12 | 1100 | (0.319746, 0.398194, 1.126819, 1.073599) |
| w13 | 1101 | (0.309596, 0.330431, 1.191466, 0.335021) |
| w14 | 1110 | (0.228413, 0.325633, 0.370927, 1.102348) |
| w15 | 1111 | (0.203443, 0.239249, 0.425946, 0.367032) |

| wk | LSB bit labels (b4 b5 b6 b7) | $R_c = \frac{5}{6}$, 11.35 dB, (x, y, z, w) |
|---|---|---|
| w0 | 0000 | (1.077284, 0.957874, 1.034832, 0.441819) |
| w1 | 0001 | (0.412758, 0.398613, 1.528827, 0.375586) |
| w2 | 0010 | (1.076567, 1.07177, 0.324415, 0.428991) |
| w3 | 0011 | (1.514688, 0.385762, 0.382328, 0.357945) |
| w4 | 0100 | (0.414877, 0.390574, 0.394515, 1.572725) |
| w5 | 0101 | (0.822358, 0.246758, 0.917809, 0.321732) |
| w6 | 0110 | (0.963923, 0.374594, 0.335966, 1.001772) |
| w7 | 0111 | (0.864815, 0.291169, 0.284467, 0.299176) |
| w8 | 1000 | (0.400077, 0.935313, 0.975085, 0.955456) |
| w9 | 1001 | (0.281655, 0.906792, 0.941819, 0.290489) |
| w10 | 1010 | (0.384193, 1.120022, 0.3108, 0.875174) |
| w11 | 1011 | (0.294389, 1.020099, 0.302111, 0.266808) |
| w12 | 1100 | (0.305856, 0.294713, 0.824631, 0.992838) |
| w13 | 1101 | (0.25481, 0.285898, 0.751643, 0.298045) |
| w14 | 1110 | (0.289067, 0.356851, 0.238692, 0.822132) |
| w15 | 1111 | (0.294154, 0.340578, 0.244513, 0.277487) | wherein a transformed version of the non-uniform constellation is obtained from anyone of said constellations through a transformation including a rotation by an angle around an origin, an inversion of bit labels for all constellation points, an interchanging of hit positions and/or a predistortion for the constellation points.

* * * * *